United States Patent
Dang et al.

(10) Patent No.: US 9,769,935 B2
(45) Date of Patent: Sep. 19, 2017

(54) ELECTRONIC MODULES HAVING GROUNDED ELECTROMAGNETIC SHIELDS

(71) Applicant: RF Micro Devices, Inc., Greensboro, NC (US)

(72) Inventors: Thong Dang, Summerfield, NC (US); Mohsen Haji-Rahim, Chapel Hill, NC (US); Joseph Byron Bullis, Graham, NC (US)

(73) Assignee: Qorvo US, Inc., Greensboro, NC (US)

( * ) Notice: Subject to any disclaimer, the term of this patent is extended or adjusted under 35 U.S.C. 154(b) by 252 days.

(21) Appl. No.: 13/906,892

(22) Filed: May 31, 2013

(65) Prior Publication Data

US 2014/0355222 A1    Dec. 4, 2014

(51) Int. Cl.
*H05K 3/40* (2006.01)
*H05K 1/14* (2006.01)
(Continued)

(52) U.S. Cl.
CPC ....... *H05K 3/4007* (2013.01); *H01L 23/3135* (2013.01); *H01L 24/97* (2013.01);
(Continued)

(58) Field of Classification Search
CPC ....... H05K 3/4007; H05K 1/144; H05K 3/284
See application file for complete search history.

(56) References Cited

U.S. PATENT DOCUMENTS 3,566,190 A    2/1971    Huebner et al.
3,907,616 A    9/1975    Wiemer
(Continued)

FOREIGN PATENT DOCUMENTS

CN    1855451 A    11/2006
EP    1715520 A1    10/2006
(Continued)

OTHER PUBLICATIONS

Final Office Action for U.S. Appl. No. 13/189,838, mailed Feb. 20, 2015, 13 pages.
(Continued)

*Primary Examiner* — David M Sinclair
*Assistant Examiner* — Robert Brown
(74) *Attorney, Agent, or Firm* — Withrow & Terranova, P.L.L.C.

(57) ABSTRACT

The present disclosure is related to electronic modules for electronic components and methods for manufacturing the same. In one embodiment, an electronic module is formed using a first substrate having a first component area and a second substrate having a second component area. One or more electronic components may be attached to both the first component area and the second component area. The second substrate is mounted over the first substrate such that the second component area faces the first component area. An overmold covers the first component area and the second component area so as to cover the electronic components on both the first component area and the second component area. In this manner, the number of electronic components within the electronic module that can be mounted on an area of a printed circuit board (PCB) is increased.

25 Claims, 68 Drawing Sheets

(51) Int. Cl.
*H01L 23/31* (2006.01)
*H01L 23/00* (2006.01)
*H05K 3/28* (2006.01)
*H05K 1/02* (2006.01)

(52) U.S. Cl.
CPC .... *H05K 1/144* (2013.01); *H01L 2224/04042* (2013.01); *H01L 2224/16235* (2013.01); *H01L 2224/32225* (2013.01); *H01L 2224/48095* (2013.01); *H01L 2224/48229* (2013.01); *H01L 2224/48235* (2013.01); *H01L 2224/48465* (2013.01); *H01L 2224/92247* (2013.01); *H01L 2224/97* (2013.01); *H01L 2924/1421* (2013.01); *H01L 2924/1434* (2013.01); *H01L 2924/1532* (2013.01); *H01L 2924/1533* (2013.01); *H01L 2924/15159* (2013.01); *H01L 2924/15192* (2013.01); *H01L 2924/15313* (2013.01); *H01L 2924/181* (2013.01); *H01L 2924/19105* (2013.01); *H01L 2924/3025* (2013.01); *H05K 1/0218* (2013.01); *H05K 3/284* (2013.01); *H05K 2201/0367* (2013.01); *H05K 2201/042* (2013.01); *H05K 2201/10371* (2013.01); *Y10T 29/4902* (2015.01); *Y10T 29/49146* (2015.01)

(56) References Cited

U.S. PATENT DOCUMENTS

| | | | |
|---|---|---|---|
| 3,907,617 | A | 9/1975 | Zwernemann |
| 4,680,676 | A | 7/1987 | Petratos et al. |
| 5,329,695 | A * | 7/1994 | Traskos et al. ............... 29/830 |
| 5,389,738 | A | 2/1995 | Piosenka et al. |
| 5,406,630 | A | 4/1995 | Piosenka et al. |
| 5,436,203 | A | 7/1995 | Lin |
| 5,459,368 | A | 10/1995 | Onishi et al. |
| 5,473,512 | A | 12/1995 | Degani et al. |
| 5,592,391 | A * | 1/1997 | Muyshondt .......... H05K 1/0218 174/258 |
| 5,623,293 | A * | 4/1997 | Aoki ............................. 347/56 |
| 5,639,989 | A | 6/1997 | Higgins, III |
| 5,646,828 | A | 7/1997 | Degani et al. |
| 5,650,659 | A | 7/1997 | Mostafazadeh et al. |
| 5,870,289 | A * | 2/1999 | Tokuda et al. ............... 361/779 |
| 5,977,626 | A | 11/1999 | Wang et al. |
| 6,004,180 | A | 12/1999 | Knall et al. |
| 6,011,698 | A | 1/2000 | Buehler |
| 6,137,693 | A | 10/2000 | Schwiebert et al. |
| 6,150,193 | A | 11/2000 | Glenn |
| 6,163,454 | A | 12/2000 | Strickler |
| 6,297,957 | B1 | 10/2001 | Johnson et al. |
| 6,429,386 | B2 * | 8/2002 | DiBene, II .......... H01L 23/552 174/260 |
| 6,448,583 | B1 | 9/2002 | Yoneda et al. |
| 6,448,793 | B1 | 9/2002 | Barratt et al. |
| 6,466,416 | B1 | 10/2002 | Honjo et al. |
| 6,538,196 | B1 | 3/2003 | MacDonald et al. |
| 6,590,152 | B1 | 7/2003 | Horio et al. |
| 6,599,779 | B2 | 7/2003 | Shim et al. |
| 6,613,660 | B2 | 9/2003 | Kahlert et al. |
| 6,633,073 | B2 | 10/2003 | Rezvani et al. |
| 6,657,592 | B2 | 12/2003 | Dening et al. |
| 6,707,168 | B1 | 3/2004 | Hoffman et al. |
| 6,717,485 | B2 | 4/2004 | Kolb et al. |
| 6,791,795 | B2 | 9/2004 | Ohtomo et al. |
| 6,807,731 | B2 | 10/2004 | Brandenburg et al. |
| 6,825,560 | B1 | 11/2004 | Walker et al. |
| 6,838,750 | B2 | 1/2005 | Nuytkens et al. |
| 6,887,787 | B2 | 5/2005 | Farnworth |
| 6,894,229 | B1 * | 5/2005 | Cheah ................ H01L 23/16 174/255 |
| 6,946,324 | B1 | 9/2005 | McLellan et al. |
| 6,947,295 | B2 * | 9/2005 | Hsieh ............... H01L 23/3128 174/260 |
| 6,998,532 | B2 | 2/2006 | Kawamoto et al. |
| 7,030,469 | B2 | 4/2006 | Mahadevan et al. |
| 7,042,398 | B2 | 5/2006 | Tang et al. |
| 7,087,461 | B2 | 8/2006 | Park et al. |
| 7,087,462 | B1 | 8/2006 | Park et al. |
| 7,109,410 | B2 | 9/2006 | Arnold et al. |
| 7,109,817 | B2 | 9/2006 | Kolb et al. |
| 7,125,744 | B2 | 10/2006 | Takehara et al. |
| 7,148,574 | B2 | 12/2006 | Lee et al. |
| 7,187,060 | B2 | 3/2007 | Usui |
| 7,227,719 | B2 | 6/2007 | Sasaki et al. |
| 7,259,041 | B2 | 8/2007 | Stelzl et al. |
| 7,342,303 | B1 | 3/2008 | Berry et al. |
| 7,348,663 | B1 | 3/2008 | Kirloskar et al. |
| 7,433,203 | B1 | 10/2008 | Yi et al. |
| 7,443,693 | B2 | 10/2008 | Arnold et al. |
| 7,445,968 | B2 | 11/2008 | Harrison et al. |
| 7,451,539 | B2 | 11/2008 | Morris et al. |
| 7,478,474 | B2 | 1/2009 | Koga |
| 7,488,903 | B2 | 2/2009 | Kawagishi et al. |
| 7,514,772 | B2 | 4/2009 | Kobayashi et al. |
| 7,548,430 | B1 | 6/2009 | Huemoeller et al. |
| 7,598,606 | B2 | 10/2009 | Chow et al. |
| 7,633,170 | B2 | 12/2009 | Yang et al. |
| 7,633,765 | B1 | 12/2009 | Scanlan et al. |
| 7,635,918 | B2 | 12/2009 | Yoshida |
| 7,636,245 | B2 | 12/2009 | Clancy et al. |
| 7,643,311 | B2 | 1/2010 | Coffy |
| 7,651,889 | B2 | 1/2010 | Tang et al. |
| 7,665,201 | B2 | 2/2010 | Sjoedin |
| 7,671,451 | B2 | 3/2010 | Lee et al. |
| 7,700,411 | B2 | 4/2010 | Yang et al. |
| 7,772,046 | B2 | 8/2010 | Pagaila et al. |
| 7,829,981 | B2 | 11/2010 | Hsu |
| 7,902,643 | B2 | 3/2011 | Tuttle |
| 7,902,644 | B2 | 3/2011 | Huang et al. |
| 7,928,538 | B2 | 4/2011 | Salzman |
| 8,013,258 | B2 | 9/2011 | Wu |
| 8,053,872 | B1 | 11/2011 | Swan et al. |
| 8,061,012 | B2 | 11/2011 | Carey et al. |
| 8,062,930 | B1 | 11/2011 | Shah et al. |
| 8,084,300 | B1 | 12/2011 | San Antonio et al. |
| 8,093,690 | B2 | 1/2012 | Ko et al. |
| 8,110,441 | B2 * | 2/2012 | Chandra et al. ............... 438/113 |
| 8,186,048 | B2 * | 5/2012 | Leahy .................. H01L 23/552 29/825 |
| 8,220,145 | B2 | 7/2012 | Hiner et al. |
| 8,268,677 | B1 | 9/2012 | Pagaila |
| 8,296,938 | B2 | 10/2012 | Carey et al. |
| 8,296,941 | B2 | 10/2012 | Hiner et al. |
| 8,349,659 | B1 | 1/2013 | Swan et al. |
| 8,359,739 | B2 | 1/2013 | Carey et al. |
| 8,373,264 | B2 | 2/2013 | Welch et al. |
| 8,409,658 | B2 | 4/2013 | Hiner et al. |
| 8,434,220 | B2 | 5/2013 | Rao et al. |
| 8,507,319 | B2 | 8/2013 | Chow et al. |
| 8,720,051 | B2 | 5/2014 | Leahy et al. |
| 8,748,230 | B2 | 6/2014 | Welch et al. |
| 8,835,226 | B2 | 9/2014 | Morris et al. |
| 8,861,221 | B2 | 10/2014 | Pagaila |
| 8,959,762 | B2 | 2/2015 | Leahy et al. |
| 9,137,934 | B2 | 9/2015 | Morris et al. |
| 2002/0036345 | A1 | 3/2002 | Iseki et al. |
| 2002/0118529 | A1 | 8/2002 | Babin et al. |
| 2002/0142516 | A1 * | 10/2002 | Light ........................ 438/107 |
| 2003/0011049 | A1 | 1/2003 | Nuytkens et al. |
| 2003/0048581 | A1 | 3/2003 | Ohtomo et al. |
| 2003/0062541 | A1 | 4/2003 | Warner |
| 2003/0090883 | A1 * | 5/2003 | Asahi .................. H01L 21/6835 361/761 |
| 2003/0151122 | A1 | 8/2003 | Davies |
| 2004/0063246 | A1 * | 4/2004 | Karnezos ..................... 438/108 |
| 2004/0103509 | A1 | 6/2004 | Bidard et al. |
| 2004/0104473 | A1 | 6/2004 | Farnworth |
| 2004/0178500 | A1 | 9/2004 | Usui |
| 2004/0209434 | A1 | 10/2004 | Seaford et al. |
| 2004/0214023 | A1 | 10/2004 | Park et al. |
| 2004/0222511 | A1 | 11/2004 | Zhang |
| 2004/0232536 | A1 | 11/2004 | Fukuzumi |

(56) References Cited

U.S. PATENT DOCUMENTS

| | | |
|---|---|---|
| 2004/0238934 A1 | 12/2004 | Warner et al. |
| 2005/0046001 A1 | 3/2005 | Warner |
| 2005/0153061 A1 | 7/2005 | Nuytkens et al. |
| 2006/0033184 A1 | 2/2006 | Park et al. |
| 2006/0151203 A1 | 7/2006 | Krueger et al. |
| 2006/0223577 A1 | 10/2006 | Ouzillou |
| 2006/0244131 A1 | 11/2006 | Kobayashi et al. |
| 2006/0273813 A1 | 12/2006 | Coffy |
| 2006/0274517 A1* | 12/2006 | Coffy ............................ 361/816 |
| 2007/0030661 A1 | 2/2007 | Morris et al. |
| 2007/0042593 A1 | 2/2007 | Lee et al. |
| 2007/0045248 A1 | 3/2007 | Schein et al. |
| 2007/0058748 A1 | 3/2007 | Kim et al. |
| 2007/0062637 A1 | 3/2007 | Sjoedin |
| 2007/0155053 A1* | 7/2007 | Karnezos ...................... 438/109 |
| 2007/0163802 A1 | 7/2007 | Monthei |
| 2007/0200210 A1 | 8/2007 | Zhao et al. |
| 2007/0221399 A1* | 9/2007 | Nishizawa et al. ........... 174/250 |
| 2007/0222697 A1 | 9/2007 | Caimi et al. |
| 2007/0290322 A1* | 12/2007 | Zhao et al. ................... 257/690 |
| 2008/0019112 A1 | 1/2008 | Hatanaka et al. |
| 2008/0054421 A1 | 3/2008 | Dimaano et al. |
| 2008/0108179 A1 | 5/2008 | Mistry et al. |
| 2008/0112151 A1 | 5/2008 | Thompson et al. |
| 2008/0139013 A1* | 6/2008 | Tomura et al. .................. 439/65 |
| 2008/0142938 A1 | 6/2008 | Chow et al. |
| 2008/0157316 A1 | 7/2008 | Yang |
| 2008/0210462 A1 | 9/2008 | Kawagishi et al. |
| 2008/0224306 A1 | 9/2008 | Yang |
| 2008/0308912 A1 | 12/2008 | Cha et al. |
| 2008/0317188 A1 | 12/2008 | Staszewski et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0009979 A1* | 1/2009 | Mori et al. .................... 361/784 |
| 2009/0016039 A1 | 1/2009 | Imamura |
| 2009/0025211 A1 | 1/2009 | Hiner et al. |
| 2009/0051011 A1 | 2/2009 | Usami |
| 2009/0066588 A1 | 3/2009 | Cheng et al. |
| 2009/0072357 A1 | 3/2009 | Tang et al. |
| 2009/0072364 A1 | 3/2009 | Punzalan et al. |
| 2009/0079041 A1 | 3/2009 | Huang et al. |
| 2009/0140402 A1 | 6/2009 | Ohtani |
| 2009/0227273 A1 | 9/2009 | McCune, Jr. |
| 2009/0233562 A1 | 9/2009 | Kim et al. |
| 2009/0270054 A1 | 10/2009 | Ridgers et al. |
| 2009/0302438 A1 | 12/2009 | Chauhan et al. |
| 2009/0315156 A1 | 12/2009 | Harper |
| 2010/0032815 A1 | 2/2010 | An et al. |
| 2010/0051343 A1* | 3/2010 | Lam ...................... H01L 21/561 174/350 |
| 2010/0123233 A1* | 5/2010 | Yoon et al. .................... 257/686 |
| 2010/0199492 A1 | 8/2010 | Hiner et al. |
| 2010/0207258 A1 | 8/2010 | Eun et al. |
| 2010/0224992 A1* | 9/2010 | McConnelee et al. ....... 257/723 |
| 2010/0279730 A1 | 11/2010 | Ortiz |
| 2011/0014880 A1 | 1/2011 | Nicolson et al. |
| 2011/0017263 A1 | 1/2011 | Gibson et al. |
| 2011/0038136 A1 | 2/2011 | Carey et al. |
| 2011/0084378 A1 | 4/2011 | Welch et al. |
| 2011/0085314 A1* | 4/2011 | Franz ............................ 361/803 |
| 2011/0114369 A1* | 5/2011 | Lee et al. ...................... 174/252 |
| 2011/0182048 A1* | 7/2011 | Roethlingshoefer et al. ............................ 361/820 |
| 2011/0225803 A1 | 9/2011 | Hiner et al. |
| 2011/0235282 A1 | 9/2011 | Leahy et al. |
| 2011/0298109 A1 | 12/2011 | Pagaila et al. |
| 2011/0298670 A1 | 12/2011 | Jung et al. |
| 2012/0044653 A1* | 2/2012 | Morris et al. ................. 361/728 |
| 2012/0074538 A1 | 3/2012 | Tsai et al. |
| 2012/0075821 A1 | 3/2012 | Pagaila |
| 2012/0126378 A1 | 5/2012 | San Antonio et al. |
| 2012/0182706 A1* | 7/2012 | Siomkos et al. .............. 361/803 |
| 2012/0217624 A1* | 8/2012 | Morris et al. ................. 257/659 |
| 2012/0218729 A1* | 8/2012 | Carey et al. .................. 361/807 |
| 2012/0270371 A1 | 10/2012 | DeBar et al. |
| 2014/0097007 A1* | 4/2014 | Nagai et al. .................. 174/257 |
| 2014/0182920 A1* | 7/2014 | Yanagisawa et al. ........ 174/266 |
| 2014/0262442 A1* | 9/2014 | Nomura et al. .............. 174/250 |
| 2014/0268587 A1* | 9/2014 | Nomura et al. .............. 361/728 |
| 2014/0340859 A1 | 11/2014 | Morris et al. |
| 2015/0091157 A9 | 4/2015 | Chi et al. |
| 2015/0124421 A1 | 5/2015 | Leahy et al. |

FOREIGN PATENT DOCUMENTS

| | | |
|---|---|---|
| EP | 1717857 A2 | 11/2006 |
| EP | 1764834 B1 | 3/2009 |
| JP | 11163583 A | 6/1999 |
| JP | 2004207352 A | 7/2004 |
| JP | 2005039007 A | 2/2005 |
| JP | 2005109306 A | 4/2005 |
| JP | 2006332255 A | 12/2006 |
| JP | 2007311396 A | 11/2007 |
| KR | 20060113412 A | 11/2006 |
| WO | 0035085 A1 | 6/2000 |
| WO | 03058812 A1 | 7/2003 |
| WO | 2004019490 A1 | 3/2004 |
| WO | 2004060034 A1 | 7/2004 |
| WO | 2007060784 A1 | 5/2007 |
| WO | 2007132560 A1 | 11/2007 |
| WO | 2009144960 A1 | 12/2009 |
| WO | 2010014103 A1 | 2/2010 |
| WO | 2010021262 A1 | 2/2010 |

OTHER PUBLICATIONS

Advisory Action for U.S. Appl. No. 13/036,272, mailed Jan. 8, 2015, 3 pages.

Notice of Allowance for U.S. Appl. No. 13/034,787, mailed May 1, 2014, 9 pages.

Final Office Action for U.S. Appl. No. 13/189,838, mailed Jun. 19, 2014, 10 pages.

Notice of Allowance for U.S. Appl. No. 11/199,319, mailed Oct. 2, 2008, 6 pages.

Non-Final Office Action for U.S. Appl. No. 11/435,913, mailed May 21, 2010, 5 pages.

Final Office Action for U.S. Appl. No. 11/435,913, mailed Nov. 17, 2009, 8 pages.

Non-Final Office Action for U.S. Appl. No. 11/435,913, mailed Mar. 2, 2009, 8 pages.

Final Office Action for U.S. Appl. No. 11/435,913, mailed Aug. 15, 2008, 8 pages.

Non-Final Office Action for U.S. Appl. No. 11/435,913, mailed Jan. 7, 2008, 6 pages.

Restriction Requirement for U.S. Appl. No. 11/435,913, mailed Oct. 10, 2007, 4 pages.

Non-Final Office Action for U.S. Appl. No. 11/768,014, mailed Jan. 21, 2009, 9 pages.

Non-Final Office for U.S. Appl. No. 11/768,014, mailed Mar. 25, 2010, 9 pages.

Non-Final Office for U.S. Appl. No. 11/768,014, mailed Jul. 10, 2009, 6 pages.

Restriction Requirement for U.S. Appl. No. 11/768,014, mailed Sep. 29, 2008, 5 pages.

Non-Final Office Action for U.S. Appl. No. 11/952,484, mailed Jan. 8, 2010, 17 pages.

Final Office Action for U.S. Appl. No. 11/952,484, mailed Oct. 5, 2010, 19 pages.

Restriction Requirement for U.S. Appl. No. 11/952,484, mailed Sep. 11, 2009, 6 pages.

Non-Final Office Action for U.S. Appl. No. 11/952,484, mailed Oct. 27, 2011, 22 pages.

Non-Final Office Action for U.S. Appl. No. 13/415,643, mailed Jan. 3, 2013, 17 pages.

(56) References Cited

OTHER PUBLICATIONS

Quayle Action for U.S. Appl. No. 13/415,643, mailed Jul. 11, 2013, 6 pages.
Notice of Allowance for U.S. Appl. No. 13/415,643, mailed Aug. 15, 2013, 8 pages.
Non-Final Office Action for U.S. Appl. No. 11/952,513, mailed May 10, 2011, 19 pages.
Final Office Action for U.S. Appl. No. 11/952,513, mailed Oct. 26, 2011, 16 pages.
Notice of Allowance for U.S. Appl. No. 11/952,513, mailed Mar. 6, 2012, 16 pages.
Non-Final Office Action for U.S. Appl. No. 13/117,284, mailed Nov. 9, 2011, 12 pages.
Final Office Action for U.S. Appl. No. 13/117,284, mailed Feb. 29, 2012, 8 pages.
Notice of Allowance for U.S. Appl. No. 13/117,284, mailed May 1, 2012, 15 pages.
Non-Final Office Action for U.S. Appl. No. 11/952,545, mailed Oct. 23, 2009, 12 pages.
Restriction Requirement for U.S. Appl. No. 11/952,545, mailed May 21, 2009, 6 pages.
Non-Final Office Action for U.S. Appl. No. 12/766,347, mailed Jun. 29, 2012, 11 pages.
Notice of Allowance for U.S. Appl. No. 11/952,592, mailed Aug. 6, 2012, 7 pages.
Non-Final Office Action for U.S. Appl. No. 11/952,592, mailed Sep. 19, 2011, 9 pages.
Final Office Action for U.S. Appl. No. 11/952,592, mailed Feb. 24, 2011, 9 pages.
Non-Final Office Action for U.S. Appl. No. 11/952,592, mailed Dec. 15, 2010, 9 pages.
Non-Final Office Action for U.S. Appl. No. 11/952,592, mailed Jul. 28, 2009, 7 pages.
Final Office Action for U.S. Appl. No. 11/952,592, mailed Apr. 16, 2010, 8 pages.
Restriction Requirement for U.S. Appl. No. 11/952,592, mailed Jan. 26, 2009, 6 pages.
Restriction Requirement for U.S. Appl. No. 11/952,592, mailed Apr. 14, 2009, 6 pages.
Final Office Action for U.S. Appl. No. 11/952,592, mailed Jan. 18, 2012, 10 pages.
Non-Final Office Action for U.S. Appl. No. 11/952,592, mailed Jun. 12, 2012, 28 pages.
Notice of Allowance for U.S. Appl. No. 11/952,617, mailed Jan. 8, 2013, 8 pages.
Notice of Allowance for U.S. Appl. No. 11/952,617, mailed Jun. 4, 2012, 24 pages.
Final Office Action for U.S. Appl. No. 11/952,617, mailed Feb. 16, 2012, 15 pages.
Non-Final Office Action for U.S. Appl. No. 11/952,617, mailed Jul. 28, 2011, 9 pages.
Non-Final Office Action for U.S. Appl. No. 11/952,617, mailed Sep. 26, 2008, 10 pages.
Final Office Action for U.S. Appl. No. 11/952,617, mailed Nov. 20, 2009, 16 pages.
Restriction Requirement for U.S. Appl. No. 11/952,617, mailed Apr. 27, 2009, 7 pages.
Non-Final Office Action for U.S. Appl. No. 11/952,634, mailed Jun. 13, 2011, 7 pages.
Notice of Allowance for U.S. Appl. No. 11/952,634, mailed Mar. 3, 2011, 7 pages.
Final Office Action for U.S. Appl. No. 11/952,634, mailed Feb. 1, 2011, 7 pages.
Final Office Action for U.S. Appl. No. 11/952,634, mailed Dec. 23, 2010, 8 pages.
Non-Final Office Action for U.S. Appl. No. 11/952,634, mailed Jul. 21, 2010, 7 pages.
Restriction Requirement for U.S. Appl. No. 11/952,634, mailed May 12, 2010, 5 pages.
Corrected Notice of Allowability for U.S. Appl. No. 13/034,787, mailed Jul. 29, 2014, 5 pages.
Notice of Allowance for U.S. Appl. No. 13/189,838, mailed May 4, 2015, 8 pages.
Non-Final Office Action for U.S. Appl. No. 13/036,272, mailed Apr. 14, 2015, 7 pages.
Non-Final Office Action for U.S. Appl. No. 14/447,847, mailed May 7, 2015, 7 pages.
Notice of Allowance for U.S. Appl. No. 13/034,755, mailed Oct. 17, 2014, 7 pages.
Advisory Action for U.S. Appl. No. 13/189,838, mailed Aug. 28, 2014, 2 pages.
Non-Final Office Action for U.S. Appl. No. 13/189,838, mailed Oct. 28, 2014, 11 pages.
Final Office Action for U.S. Appl. No. 13/036,272, mailed Oct. 20, 2014, 6 pages.
Office Action for Chinese Patent Application No. 200880104171.1 mailed Jun. 2, 2011, 20 pages.
Non-Final Office Action for U.S. Appl. No. 11/952,670, mailed Jun. 22, 2011, 4 pages.
Non-Final Office Action for U.S. Appl. No. 11/952,670, mailed May 27, 2010, 6 pages.
Notice of Allowance for U.S. Appl. No. 11/952,670, mailed Oct. 21, 2009, 6 pages.
Restriction Requirement for U.S. Appl. No. 11/952,670, mailed Jul. 22, 2009, 6 pages.
Notice of Allowance for U.S. Appl. No. 11/952,670, mailed Aug. 24, 2012, 7 pages.
Notice of Allowance for U.S. Appl. No. 11/952,690, mailed Oct. 12, 2010, 4 pages.
Supplemental Notice of Allowability for U.S. Appl. No. 11/952,690, mailed Sep. 27, 2010, 4 pages.
Notice of Allowance for U.S. Appl. No. 11/952,690, mailed Aug. 30, 2010, 7 pages.
Non-Final Office Action for U.S. Appl. No. 11/952,690, mailed Mar. 25, 2010, 9 pages.
Non-Final Rejection for U.S. Appl. No. 12/913,364, mailed Feb. 13, 2012, 32 pages.
Notice of Allowance for U.S. Appl. No. 12/913,364, mailed Jun. 8, 2012, 12 pages.
Notice of Allowance for U.S. Appl. No. 13/187,814, mailed Sep. 10, 2012, 8 pages.
Non-Final Office Action for U.S. Appl. No. 13/034,755, mailed Aug. 15, 2013, 6 pages.
Non-Final Office Action for U.S. Appl. No. 13/034,787, mailed Jan. 16, 2013, 9 pages.
Final Office Action for U.S. Appl. No. 13/034,787, mailed Mar. 19, 2013, 9 pages.
Advisory Action for U.S. Appl. No. 13/034,787, mailed May 17, 2013, 3 pages.
Non-Final Office Action for U.S. Appl. No. 13/034,787, mailed Aug. 9, 2013, 9 pages.
Non-Final Office Action for U.S. Appl. No. 12/797,381, mailed Jan. 8, 2013, 20 pages.
Final Office Action for U.S. Appl. No. 12/797,381, mailed May 16, 2013, 19 pages.
Advisory Action for U.S. Appl. No. 12/797,381, mailed Jul. 17, 2013, 3 pages.
Author Unknown, "Cho-Shield Conductive Coatings," Chomerics—EMI Products, Copyright: 2001, 1 page, Retrieved from http://www.chomerics.com/products/choshield_coatings.htm.
Author Unknown, "Cho-Shield Conductive Coatings," Chomerics: A Division of Parker Hannifin Corporation, Dec. 8, 2000, 3 pages, Retrieved from: http://www.chomerics.com/products/choshield_coatings.htm.
International Search Report for PCT/US2008/068153, mailed Dec. 9, 2008, 3 pages.
Author Unknown, "Fractional-N RF Synthesizer with Modulator and Digital IF Filter (RF6001)," RF Micro Devices: Part of the Polaris Total Radio Solution, 2005, 2 pages.
Second Office Action for Chinese Patent Application No. 200880104171.1, mailed Feb. 16, 2012, 8 pages.

(56) References Cited

OTHER PUBLICATIONS

Restriction Requirement for U.S. Appl. No. 11/199,319, mailed Mar. 26, 2008, 7 pages.
Advisory Action for U.S. Appl. No. 13/034,787, mailed Jan. 27, 2014, 4 pages.
Final Office Action for U.S. Appl. No. 13/034,755, mailed Jan. 31, 2014, 10 pages.
Advisory Action for U.S. Appl. No. 13/034,787, mailed Feb. 26, 2014, 4 pages.
Advisory Action for U.S. Appl. No. 13/034,755, mailed Mar. 4, 2014, 3 pages.
Non-Final Office Action for U.S. Appl. No. 13/189,838, mailed Mar. 14, 2014, 14 pages.
Non-Final Office Action for U.S. Appl. No. 14/595,401, mailed Mar. 28, 2016, 14 pages.
Decision on Appeal for U.S. Appl. No. 12/797,381, mailed Mar. 11, 2016, 6 pages.
Non-Final Office Action for U.S. Appl. No. 13/036,272, mailed Apr. 8, 2016, 7 pages.
Notice of Allowance for U.S. Appl. No. 14/447,847, mailed Feb. 29, 2016, 7 pages.
Notice of Allowance for U.S. Appl. No. 14/447,847, mailed Mar. 31, 2016, 7 pages.
Notice of Allowance for U.S. Appl. No. 13/189,838, mailed Jul. 30, 2015, 5 pages.
Final Office Action for U.S. Appl. No. 14/447,847, mailed Sep. 14, 2015, 8 pages.
Final Office Action for U.S. Appl. No. 13/036,272, mailed Nov. 19, 2015, 9 pages.
Final Office Action for U.S. Appl. No. 14/447,847, mailed Dec. 11, 2015, 8 pages.
Advisory Action for U.S. Appl. No. 13/036,272, mailed Feb. 5, 2016, 3 pages.
Corrected Notice of Allowability for U.S. Appl. No. 14/447,847, mailed Jul. 15, 2016, 4 pages.
Notice of Allowance for U.S. Appl. No. 14/595,401, mailed Jan. 6, 2017, 8 pages.
Final Office Action for U.S. Appl. No. 14/595, 401, mailed Oct. 6, 2016, 15 pages.
Notice of Allowance for U.S. Appl. No. 13/036,272, mailed Sep. 30, 2016, 5 pages.
Examination Report for Indian Patent Application No. 8469/DELNP/2009, dated Apr. 11, 2017, 7 pages.

* cited by examiner

ELECTRONIC MODULES HAVING GROUNDED ELECTROMAGNETIC SHIELDS

RELATED APPLICATIONS

This application is related to U.S. patent application Ser. No. 11/199,319, entitled "METHOD OF MAKING A CONFORMAL ELECTROMAGNETIC INTERFERENCE SHIELD," filed Aug. 8, 2005, now U.S. Pat. No. 7,451,539; U.S. patent application Ser. No. 11/435,913, entitled "SUBMODULE CONFORMAL ELECTROMAGNETIC INTERFERENCE SHIELD," filed May 17, 2006, now U.S. Pat. No. 8,062,930; U.S. patent application Ser. No. 11/768,014, entitled "INTEGRATED SHIELD FOR A NO-LEAD SEMICONDUCTOR DEVICE PACKAGE," filed Jun. 25, 2007, now U.S. Pat. No. 8,053,872; U.S. patent application Ser. No. 11/952,513, entitled "ISOLATED CONFORMAL SHIELDING," filed Dec. 7, 2007, now U.S. Pat. No. 8,220,145; U.S. patent application Ser. No. 11/952,592, entitled "CONFORMAL SHIELDING PROCESS USING FLUSH STRUCTURES," filed Dec. 7, 2007, now U.S. Pat. No. 8,409,658; U.S. patent application Ser. No. 11/952,617, entitled "HEAT SINK FORMED WITH CONFORMAL SHIELD," filed Dec. 7, 2007, now U.S. Pat. No. 8,434,220; U.S. patent application Ser. No. 11/952,634, entitled "CONFORMAL SHIELDING PROCESS USING PROCESS GASES," filed Dec. 7, 2007, now U.S. Pat. No. 8,186,048; U.S. patent application Ser. No. 11/952,670, entitled "PROCESS FOR MANUFACTURING A MODULE," filed Dec. 7, 2007, now U.S. Pat. No. 8,359,739; U.S. patent application Ser. No. 11/952,690, entitled "METHOD OF MANUFACTURING A MODULE," filed Dec. 7, 2007, now U.S. Pat. No. 8,061,012; U.S. patent application Ser. No. 12/797,381, entitled "TRANSCEIVER WITH SHIELD," filed Jun. 9, 2010; U.S. patent application Ser. No. 12/913,364, entitled "METHOD FOR FORMING AN ELECTRONIC MODULE HAVING BACKSIDE SEAL," filed Oct. 27, 2010, now U.S. Pat. No. 8,296,938; U.S. patent application Ser. No. 13/034,755, entitled "ELECTRONIC MODULES HAVING GROUNDED ELECTROMAGNETIC SHIELDS," filed Feb. 25, 2011, now U.S. Pat. No. 8,959,762; U.S. patent application Ser. No. 13/034,787, entitled "CONNECTION USING CONDUCTIVE VIAS," filed Feb. 25, 2011, now U.S. Pat. No. 8,835,226; U.S. patent application Ser. No. 13/036,272, entitled "MICROSHIELD ON STANDARD QFN PACKAGE," filed Feb. 28, 2011, now U.S. Pat. No. 9,627,230; U.S. patent application Ser. No. 13/117,284, entitled "CONFORMAL SHIELDING EMPLOYING SEGMENT BUILDUP," filed May 27, 2011, now U.S. Pat. No. 8,296,941; U.S. patent application Ser. No. 13/151,499, entitled "CONFORMAL SHIELDING PROCESS USING PROCESS GASES," filed Jun. 2, 2011, now U.S. Pat. No. 8,720,051; U.S. patent application Ser. No. 13/187,814, entitled "INTEGRATED SHIELD FOR A NO-LEAD SEMICONDUCTOR DEVICE PACKAGE," filed Jul. 21, 2011, now U.S. Pat. No. 8,349,659; U.S. patent application Ser. No. 13/189,838, entitled "COMPARTMENTALIZED SHIELDING OF SELECTED COMPONENTS," filed Jul. 25, 2011, now U.S. Pat. No. 9,137,934; and U.S. patent application Ser. No. 13/415,643, entitled "FIELD BARRIER STRUCTURES WITHIN A CONFORMAL SHIELD," filed Mar. 8, 2012, now U.S. Pat. No. 8,614,899; all of which are commonly owned and assigned, at the time of the invention, and are hereby incorporated herein by reference in their entireties. When interpreting the language of this disclosure, any inconsistencies between this disclosure and the above-identified related applications are to be resolved in favor of the interpretations demanded by this disclosure.

FIELD OF THE DISCLOSURE

The present disclosure relates to electronic modules having electromagnetic shields and methods of manufacturing the same.

BACKGROUND

Electronic components have become ubiquitous in modern society. The electronics industry routinely announces accelerated clocking speeds, higher transmission frequencies, and smaller integrated circuit modules. While the benefits of these devices are myriad, smaller electronic components that operate at higher frequencies also create problems. Higher operating frequencies mean shorter wavelengths, or shorter conductive elements within electronic circuitry may act as antennas to unintentionally broadcast electromagnetic emissions throughout the electromagnetic spectrum. If the signal strengths of the emissions are high enough, the emissions may interfere with the operation with an electronic component subjected to the emissions. Further, the Federal Communications Commission (FCC) and other regulatory agencies regulate these emissions, and as such, these emissions must be kept within regulatory requirements. One of the problems with electronic modules is that they are typically connected to printed circuit boards (PCBs) in order to become a part of a larger electronic circuit, such as a radio frequency (RF) front-end module. Each of the electronic components within the electronic module needs to be connected in order to receive reference voltages and/or input and output signals from the other circuitry mounted on the PCB. In order to increase the capability of the circuitry in the PCB, the number of electronic modules that can be connected within an area of the PCB needs to increase. However, the typical arrangement of electronic modules is currently limited in terms of the number of electronic components that can be fit within the electronic module.

As such, techniques and designs are needed for electronic modules that increase the number of electronic components within the electronic module.

SUMMARY

The present disclosure is related to electronic modules for electronic components and methods for manufacturing the same. In one embodiment, an electronic module is formed using a first substrate having a first component area and a second substrate having a second component area. One or more electronic components may be attached to both the first component area and the second component area. The second substrate is mounted over the first substrate such that the second component area faces the first component area. An overmold covers the first component area and the second component area so as to cover the electronic components on both the first component area and the second component area. In this manner, more electronic components can be mounted within the electronic module, and thus more electronic components can be connected in a given area of a printed circuit board (PCB) within the electronic module.

Those skilled in the art will appreciate the scope of the present disclosure and realize additional aspects thereof after

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure is related to electronic modules for electronic components and methods for manufacturing the same. Generally, an electronic module is a package for one or more integrated circuits. The electronic module encases the integrated circuits in order to protect the integrated circuit from electromagnetic interference and environmental conditions. The electronic modules may then be mounted on a printed circuit board (PCB) and interconnected with other electronics. For example, a radio frequency (RF) transceiver may be provided on a PCB. The various electronic components of the RF transceiver may be provided in different electronic modules. Each of the electronic modules may be mounted to the PCB, wherein the PCB interconnects the electronic components housed within the different electronic modules. Accordingly, the electronic components within the various electronic modules mounted on the PCB provide the circuitry of the RF transceiver. The electronic modules described herein utilize a technique that allows for more electronic components to be mounted within an electronic module, and thus more electronic components can be connected to a given area of the PCB. This thereby allows for a reduction in size and a more efficient use of the available area of the PCB.

Figure 1:
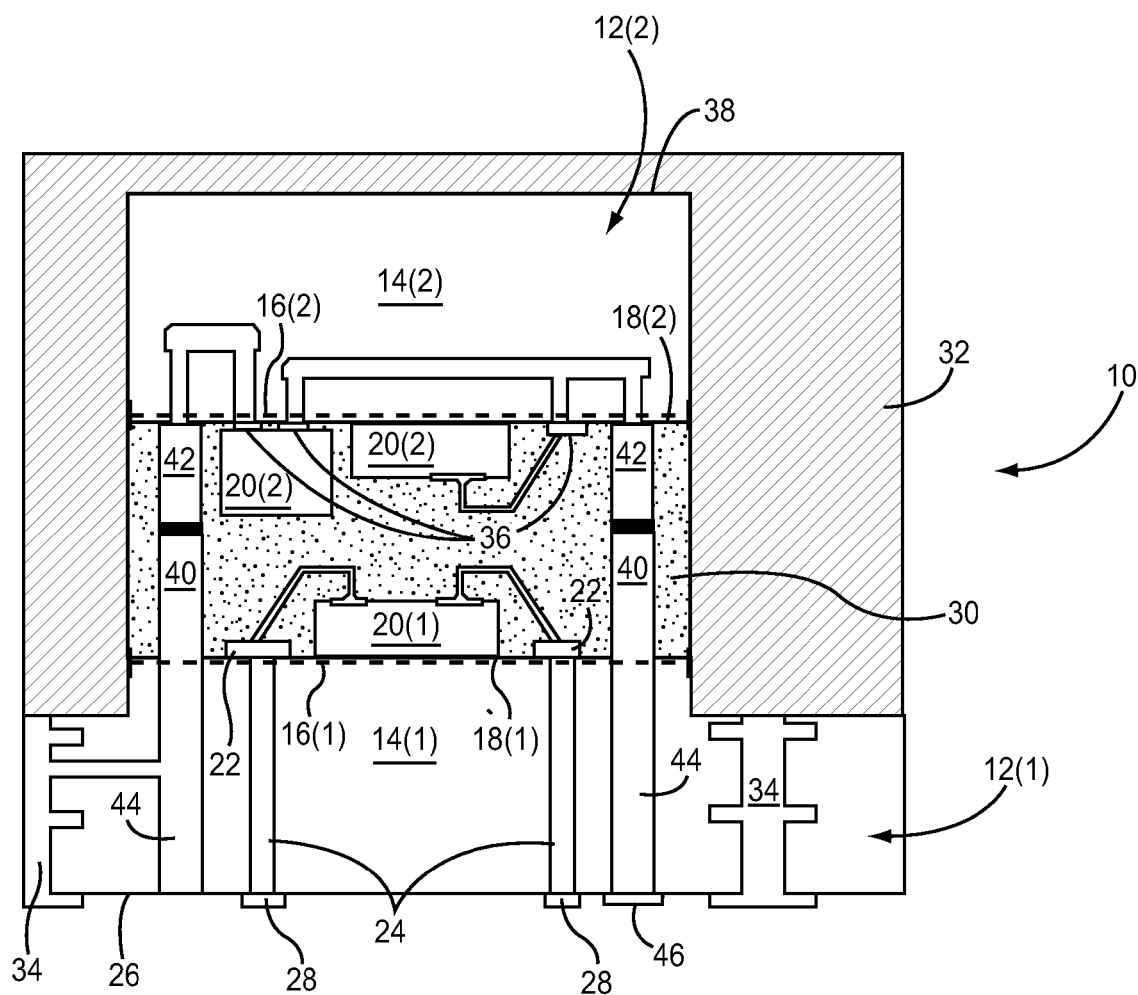
FIG. 1 is a cross-sectional view of a first embodiment of an electronic module in accordance with this disclosure.

FIG. 1 illustrates one embodiment of an electronic module 10 manufactured in accordance with this disclosure. The electronic module 10 is formed using a first substrate 12(1) and a second substrate 12(2). The first substrate 12(1) and the second substrate 12(2) may be made from any non-conductive material utilized to support electronic components. For example, the first substrate 12(1) and the second substrate 12(2) may be formed from laminates such as FR-1, FR-2, FR-3, FR-4, FR-5, FR-6, CEM-1, CEM-2, CEM-3, CEM-4, CEM-5, and/or the like. The first and second substrates 12(1) and 12(2) may be also formed from other non-conductive materials, such as ceramics, fibers, glass, and/or the like. Furthermore, the first substrate 12(1) and the second substrate 12(2) may be formed from the same non-conductive material or different non-conductive materials in accordance with the desired features for a packaging application.

As shown in FIG. 1, the first substrate 12(1) and the second substrate 12(2) each have a component portion 14(1), 14(2), respectively. In the illustrated embodiment, the component portion 14(1) is simply the portion of the first substrate 12(1) that supports the structures of the electronic module 10. Similarly, the component portion 14(2) is simply the portion of the second substrate 12(2) that supports the structures of the electronic module 10. Thus, each of the component portions 14(1), 14(2) may take up the entire first substrate 12(1) or second substrate 12(2), or may take up only a particular portion of the respective first or second substrate 12(1), 12(2), respectively. With regard to the first substrate 12(1), the component portion 14(1) includes a first component area 16(1) on a surface 18(1) of the first substrate 12(1). The first component area 16(1) is simply an area on the surface 18(1) of the component portion 14(1) for mounting one or more electronic components. In this embodiment, an electronic component 20(1) is mounted on the first component area 16(1) of the component portion 14(1). In alternative embodiments, various electronic components may be mounted on the first component area 16(1).

Next, the component portion 14(2) of the second substrate 12(2) also includes a second component area 16(2) on a surface 18(2) of the second substrate 12(2). The second component area 16(2) is simply an area on the surface 18(2) of the component portion 14(2) for mounting one or more electronic components. In this embodiment, a plurality of electronic components 20(2) is mounted on the second component area 16(2). As shown in FIG. 1, structures that form part of, or are coupled to, the electronic components 20(1), 20(2) may be formed within the respective component portions 14(1), 14(2) of the electronic module 10. The electronic components 20(1), 20(2) may be an electronic circuit built on its own semiconductor substrate, such as a processor, volatile memory, non-volatile memory, an RF circuit, or a micromechanical system (MEMS) device. The electronic components 20(1), 20(2) may also be electrical devices such as filters, capacitors, inductors, or resistors, or may be electronic circuits having any combination of these electronic devices.

With regard to the first substrate 12(1), the first substrate 12(1) has various conductive paths formed within the component portion 14(1). Furthermore, the first substrate 12(1) has various surface conductive elements that provide connections internally or externally to the electronic component 20(1). For example, the first substrate 12(1) includes surface conductive pads 22 formed on the first component area 16(1) of the first substrate 12(1). As shown in FIG. 1, the electronic component 20(1) is wire bonded to the surface conductive pads 22 in order to make internal and/or external connections. In this embodiment, vias 24 are connected to the surface conductive pads 22. The vias 24 are formed within the first substrate 12(1) and extend to a surface 26 of the first substrate 12(1). The surface 26 of the first substrate 12(1) is opposite the surface 18(1) of the first substrate 12(1). The vias 24 are connected to surface conductive pads 28 formed on the surface 26 of the substrate 12(1). The surface 26, and thus, the surface conductive pads 28, are exposed externally from the electronic module 10. As such, an external conductive component may be coupled to the surface conductive pads 28. In this manner, input/output connections can be made to the electronic component 20(1) attached to the first component area 16(1) on the surface 18(1), which is not exposed externally from the electronic module 10. For example, RF signals may be input and/or output from the surface conductive pads 28 to or from electronic components that are external to the electronic module 10.

As discussed above, the second substrate 12(2) is mounted over the first substrate 12(1) such that the second component area 16(2) on the surface 18(2) faces the first component area 16(1) on the surface 18(1). As such, the surface 18(2) of the second substrate 12(2) with the electronic components 20(2) faces the surface 18(1) of the first substrate 12(1) with the electronic component 20(1). To electromagnetically isolate the electronic components 20(1), 20(2) within the electronic module 10, an overmold 30 covers the first component area 16(1) and the second component area 16(2) so as to cover the electronic components 20(1), 20(2), on both the first component area 16(1) and the second component area 16(2). Since the second substrate 12(2) is mounted over the first substrate 12(1) such that the second component area 16(2) on the surface 18(2) faces the first component area 16(1), a gap is defined between the first component area 16(1) and the second component area 16(2).

The overmold 30 fills the gap between the first component area 16(1) and the second component area 16(2) so as to encapsulate the electronic components 20(1) and 20(2) on the surfaces 18(1), 18(2) of both the first and second substrates 12(1), 12(2). An electromagnetic shield 32 is also formed over the first substrate 12(1) and the second substrate 12(2) so as to enclose the first component area 16(1) and the second component area 16(2). The overmold 30 may be utilized to isolate the electronic components 20(1), 20(2), and may be formed from insulating material, such as a dielectric material. To connect the electromagnetic shield 32 to ground, a metallic structure 34 is provided that extends through the component portion 14(1) of the first substrate 12(1) and is attached to the electromagnetic shield 32. As shown in FIG. 1, the metallic structure 34 includes a plurality of metallic layers stacked over one another, and a plurality of vias that connect the metallic layers. The metallic layers extend along a periphery of the component portion 14(1). The periphery (or a perimeter) may be any boundary line, area, or volume that defines a boundary of the component portion 14(1). The metallic layers of the metallic structure 34 extend along or about the periphery of the component portion 14(1) by defining or by being within, adjacent to, or close to the periphery of the component portion 14(1) itself. The electromagnetic shield 32 is attached to the metallic layers and/or vias of the metallic structure 34 along the periphery of the component portion 14(1).

With regard to the second substrate 12(2), surface conductive elements 36 are formed on the surface 18(2) of the second substrate 12(2). One of the electronic components 20(2) is a surface-mount electronic component that is connected to a set of the surface conductive elements 36. The other electronic component 20(2) attached to the surface 18(2) is wire bonded to another set of the surface conductive elements 36. Conductive paths within the second substrate 12(2) connect these surface conductive elements 36 so that the electronic components 20(2) can make external connections. However, note that a surface 38 of the second substrate 12(2) opposite the surface 18(2) of the second substrate 12(2) is not exposed externally from the electronic module 10. The manner in which the electronic components 20(2) are attached to the surface 18(2) of the second substrate 12(2) is described in further detail below.

The second substrate 12(2) is mounted over the first substrate 12(1) such that the second component area 16(2) faces the first component area 16(1). To do this, the first substrate 12(1) has at least one support member 40 that structurally supports the mounting of the second substrate 12(2) over the first substrate 12(1). In this embodiment, the support members 40 are conductive pillars that extend from the first component area 16(1) on the surface 18(1) of the first substrate 12(1) towards the second component area 16(2) on the surface 18(2) of the second substrate 12(2). These support members 40 provide the structural support that mounts the second substrate 12(2) over the first substrate 12(1). In this particular embodiment, at least one support member 42 also extends out of the second component area 16(2) towards the first component area 16(1). The support members 42 of this embodiment are also conductive pillars. To structurally support the mounting of the second substrate 12(2) over the first substrate 12(1), the support members 40 that extend out of the first substrate 12(1) from the surface 18(1) to the second substrate 12(2) are attached to the support members 42 that extend out of the surface 18(2) of the second substrate 12(2). In this embodiment, the support members 40 are soldered to the support members 42. Since the support members 40 and the support members 42 are conductive pillars, the support members 40 and the support members 42 are electrically connected to one another by the soldering. The support members 40 and the support members 42 thus provide mechanical support for mounting the second substrate 12(2) over the first substrate 12(1) by providing a support mechanism that resists compression and shear forces on the electronic module 10 in order to maintain the integrity of the electronic module 10.

Additionally, as described above, the support members 40 and the support members 42 are also conductive pillars that can transmit RF signals or provide reference voltages. In other words, electromagnetic signals can be passed from the electronic components 20(2) through and/or into the surface conductive elements 36 to the support members 42. These RF signals or reference voltages can be passed into or from the support members 42 to or from the support members 40 and thereby pass to conductive components in the first substrate 12(1) so that the RF signals can be passed into or out of the electronic components 20(2) attached to the second component area 16(2) of the second substrate 12(2). In this embodiment, conductive vias 44 are provided within the first substrate 12(1) and connected to the support members 40 that extend from the surface 18(1) of the first substrate 12(1).

As shown in FIG. 1, one of the conductive vias 44 connects to the metallic structure 34 and thereby provides a connection to a reference voltage (in this example, ground). The other one of the conductive vias 44 connects to a conductive element 46 on the surface 26 of the first substrate 12(1). As such, input/output RF signals can be provided to or from the electronic components 20(1) attached to the surface 18(2) of the second substrate 12(2). Other conductive components (not shown) may also be utilized to provide internal or external connections to the electronic component 20(1) attached to the surface 18(1) of the first substrate 12(1). Thus, in this embodiment, the support members 40, 42 also provide electrical connections that allow for RF signals and/or reference voltages to be provided to the electronic components 20(2). As a result, the surface 26 of the first substrate 12(1) may also be utilized to form connections to the electronic components 20(2) on the surface 18(2) of the second substrate 12(2).

The area of attachment for electronic components (such as the electronic components 20(1), 20(2)) in the electronic module 10 is effectively increased because the electronic module 10 has the first component area 16(1) of the first substrate 12(1) and the second component area 16(2) of the second substrate 12(2) to provide areas for attachment. As such, the surface 26 of the first substrate 12(1) serves as the area to form connections to an external PCB for both the first substrate 12(1) and the second substrate 12(2). Therefore, more electronic components can be connected to the same connection area on the external PCB using the configuration of the electronic module 10 shown in FIG. 1.

Figure 2A:
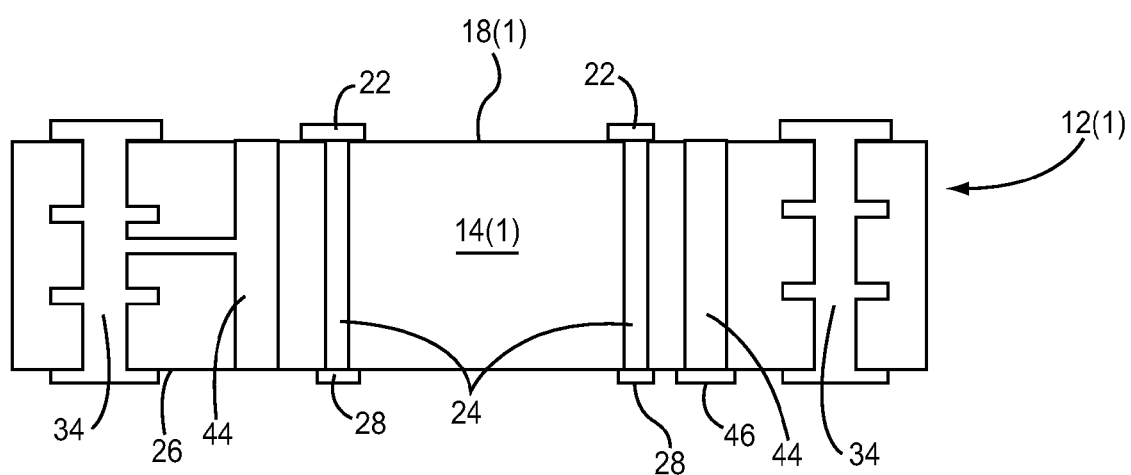
FIGS. 2A-2X illustrate exemplary procedures for forming the first embodiment of the electronic module shown in FIG. 1.
Figure 2B:
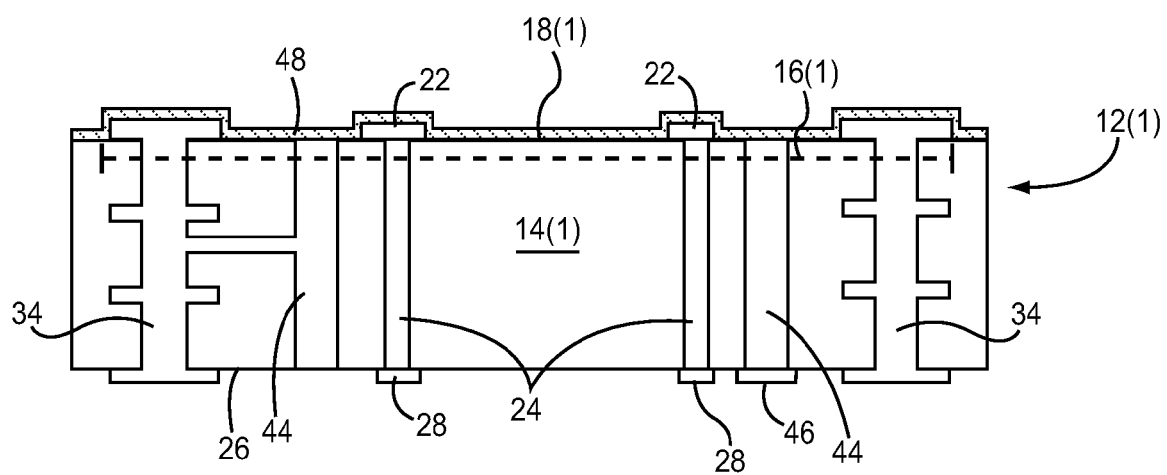
Figure 2C:
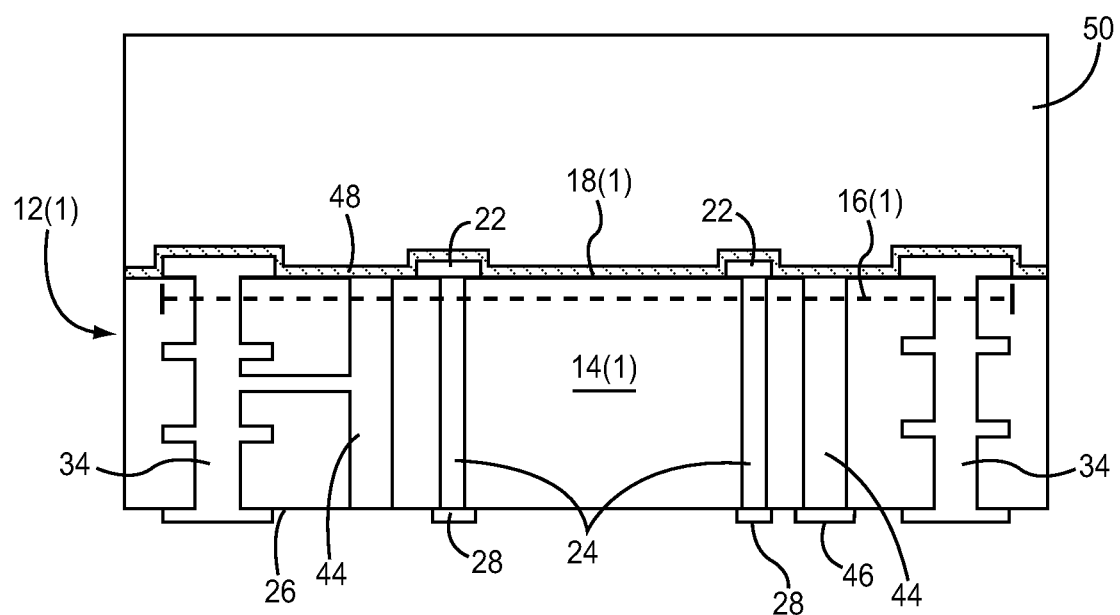
Figure 2D:
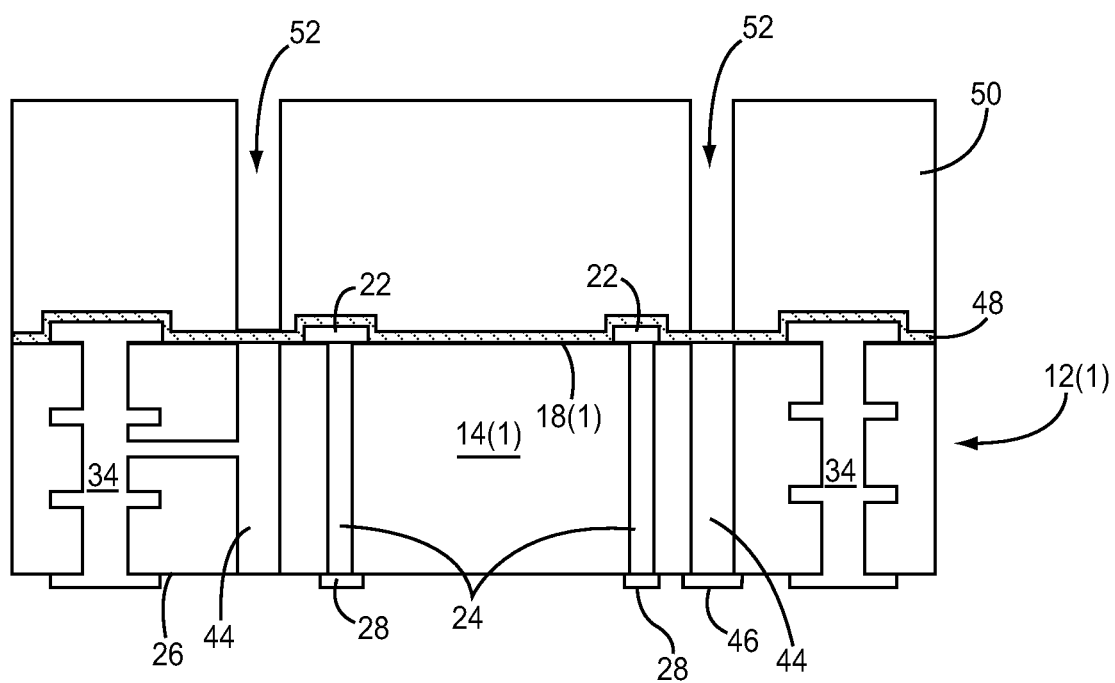
Figure 2E:
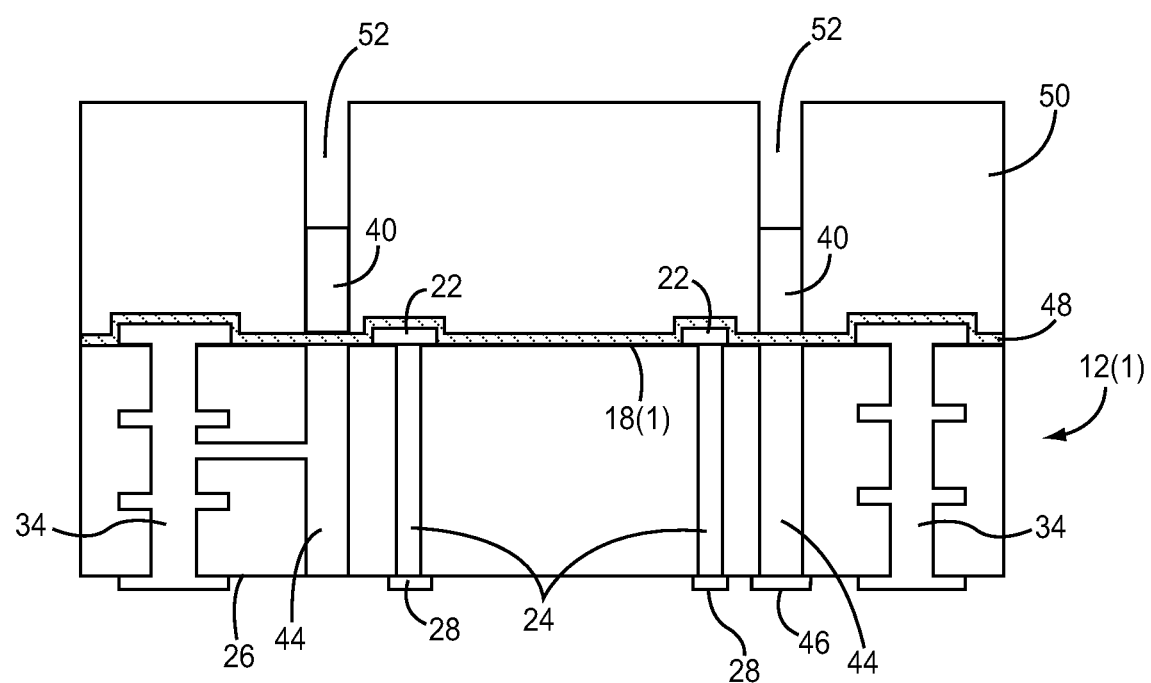
Figure 2F:
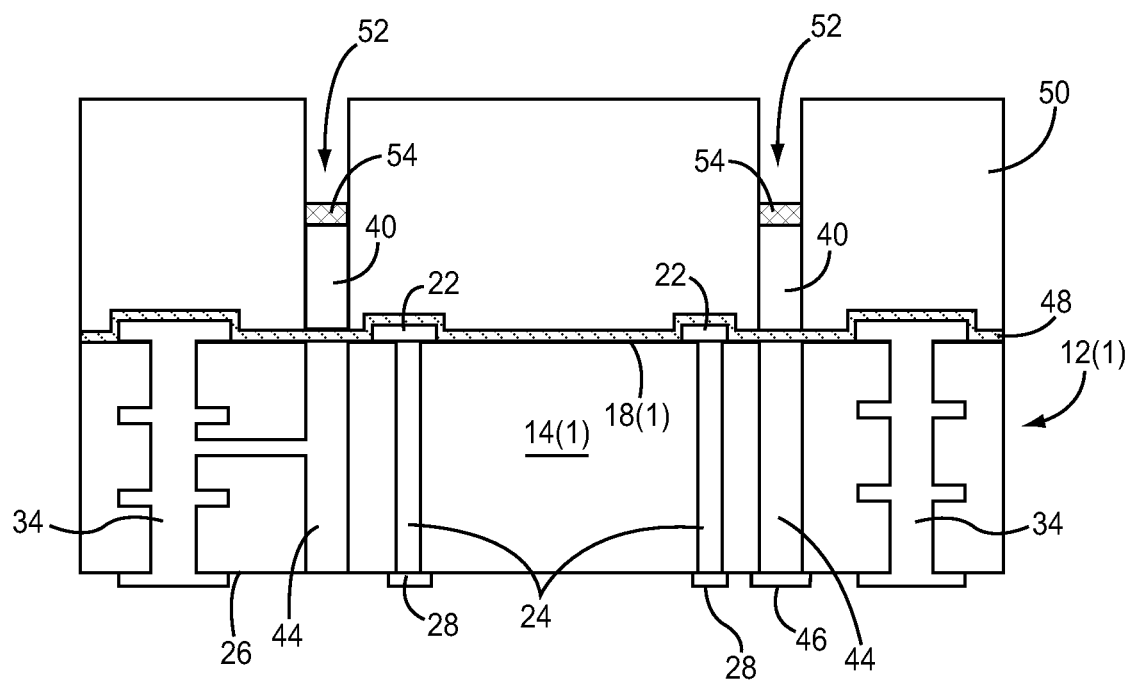
Figure 2G:
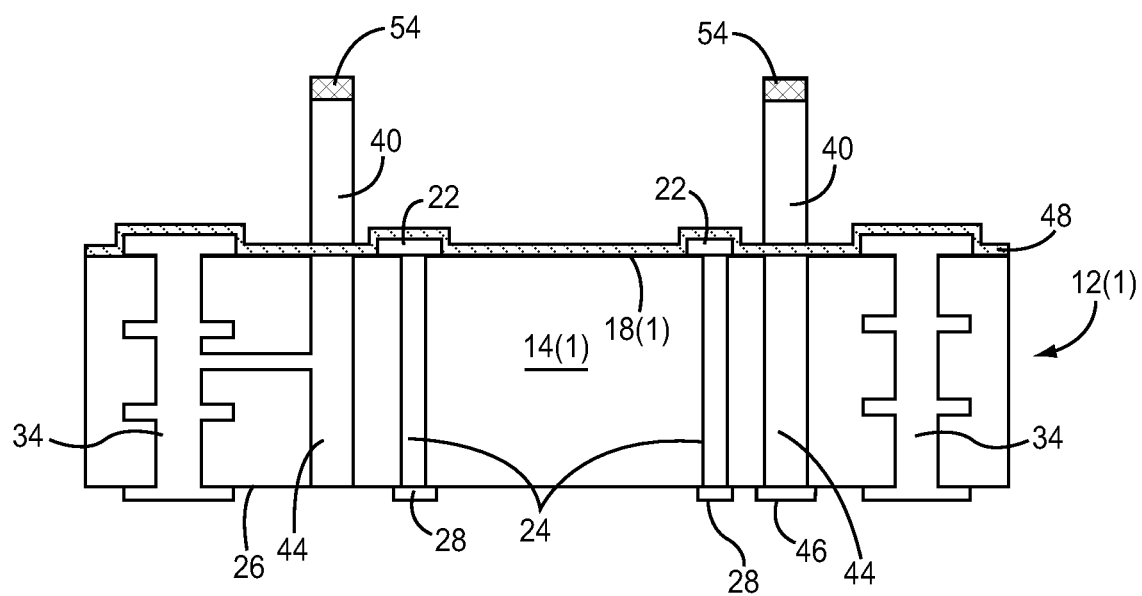
Figure 2H:
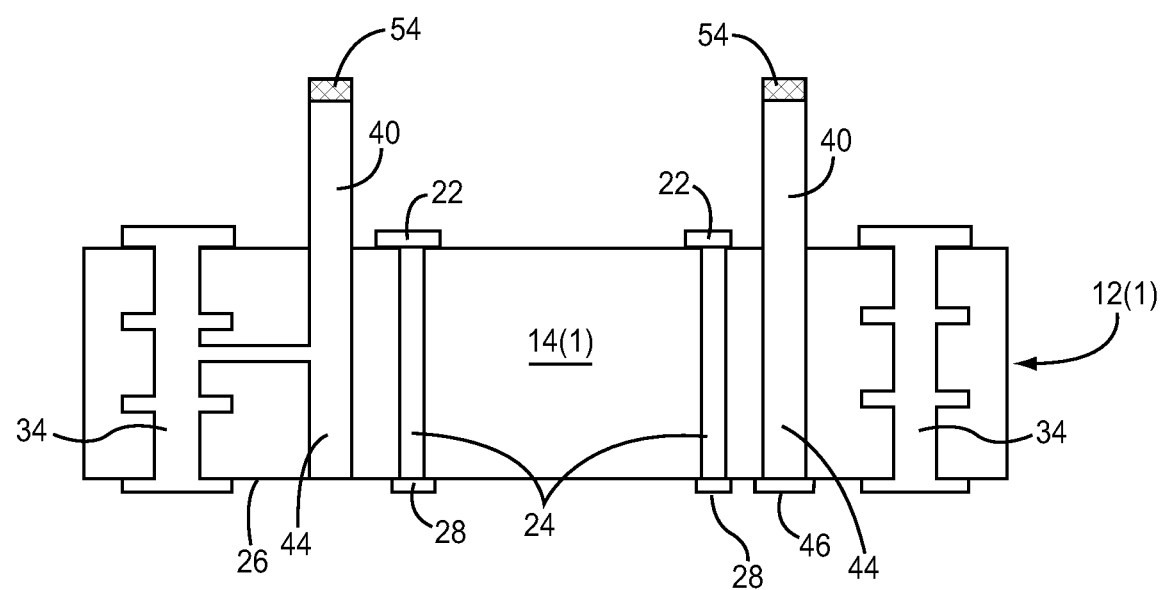
Figure 2I:
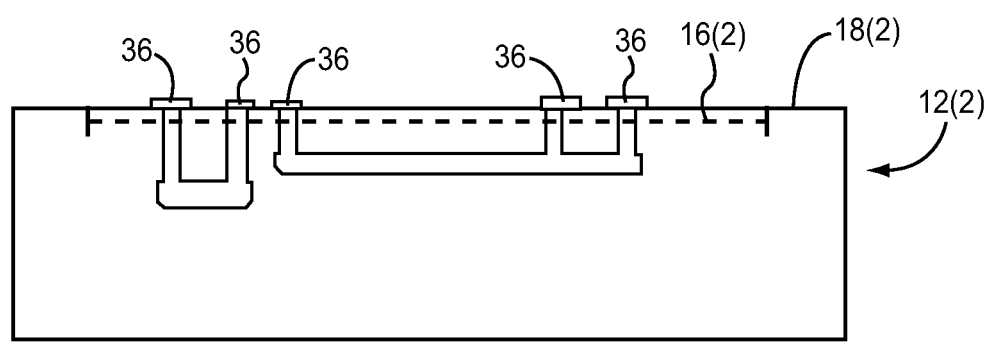
Figure 2J:
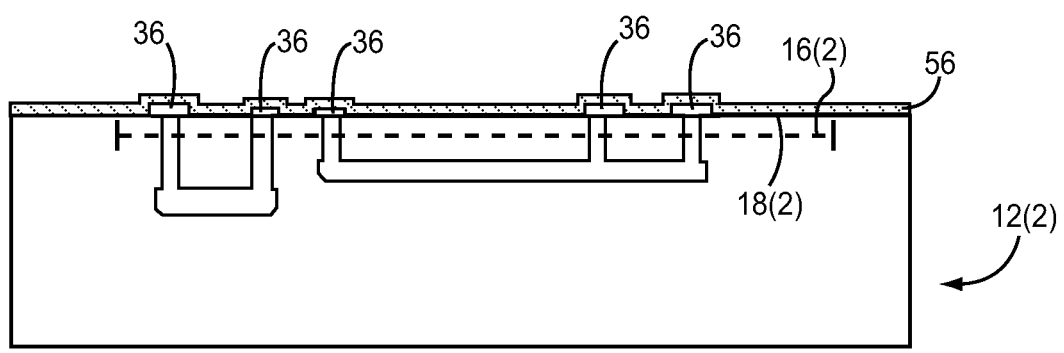
Figure 2K:
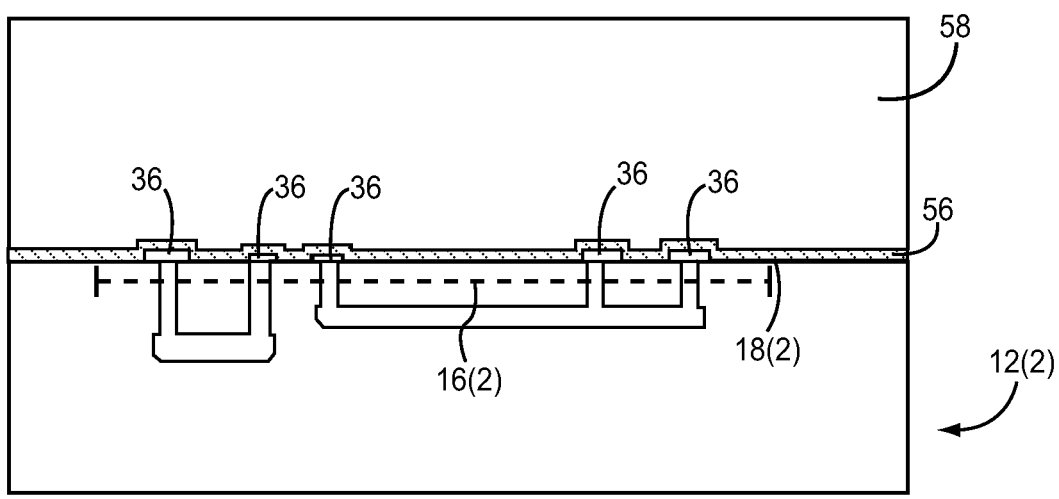
Figure 2L:
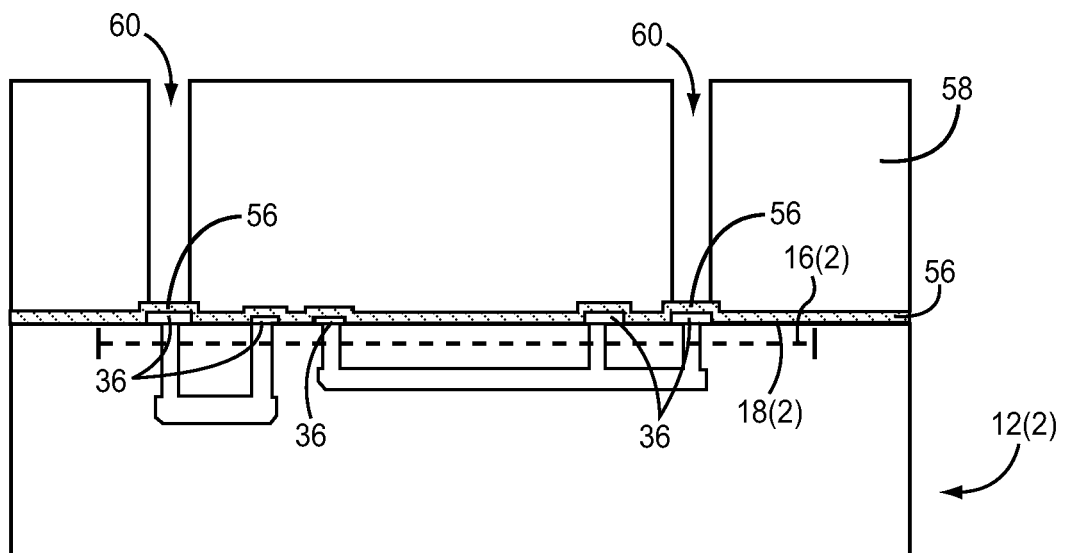
Figure 2M:
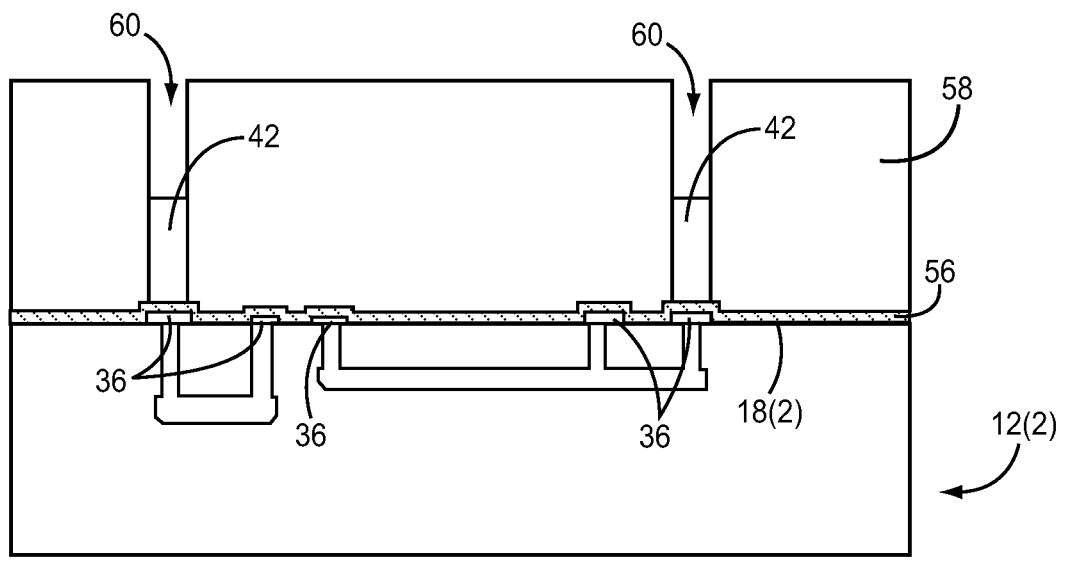
Figure 2N:
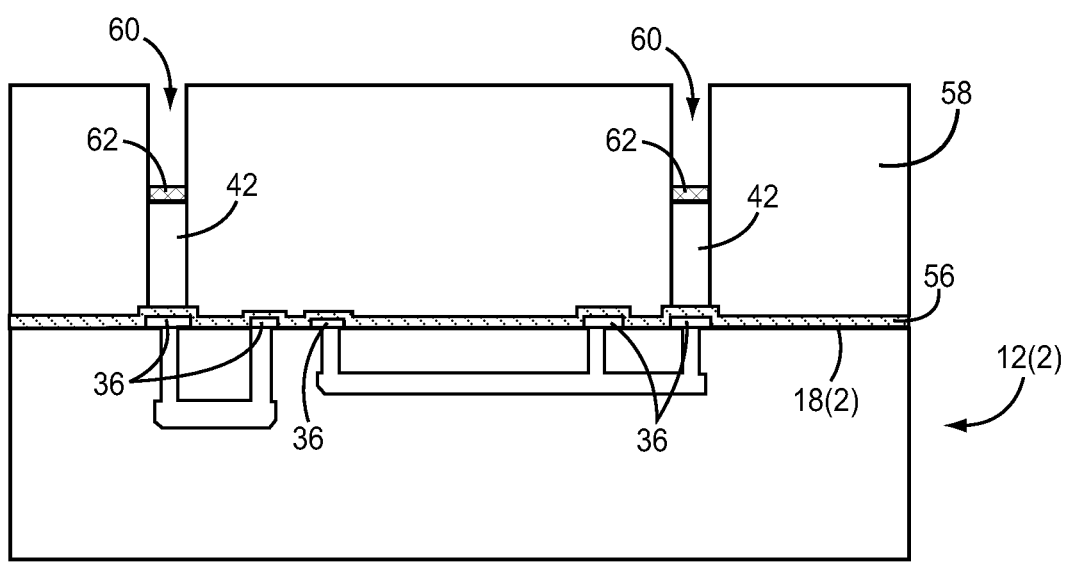
Figure 2O:
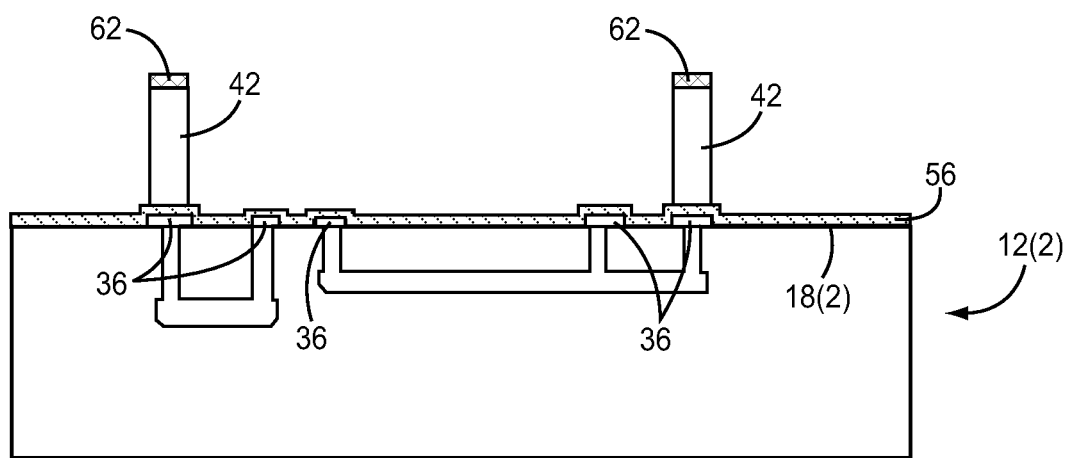
Figure 2P:
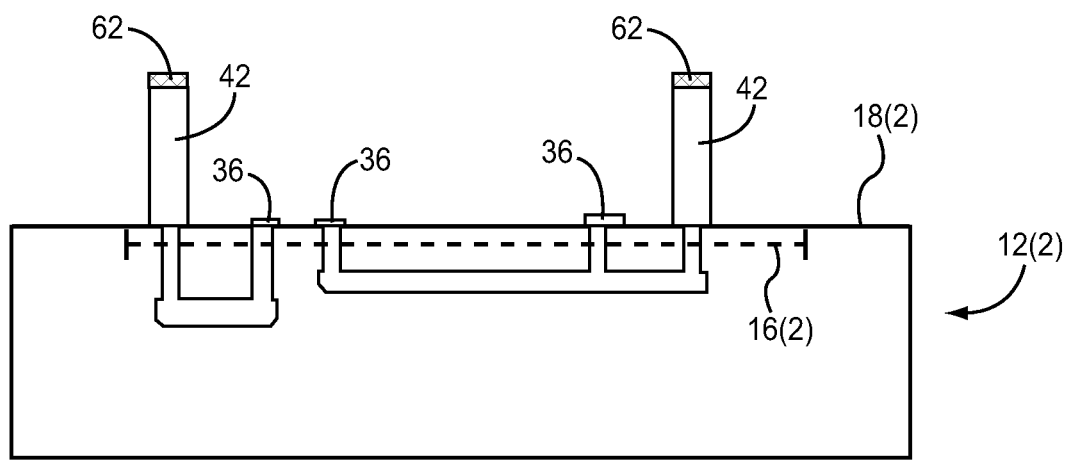
Figure 2Q:
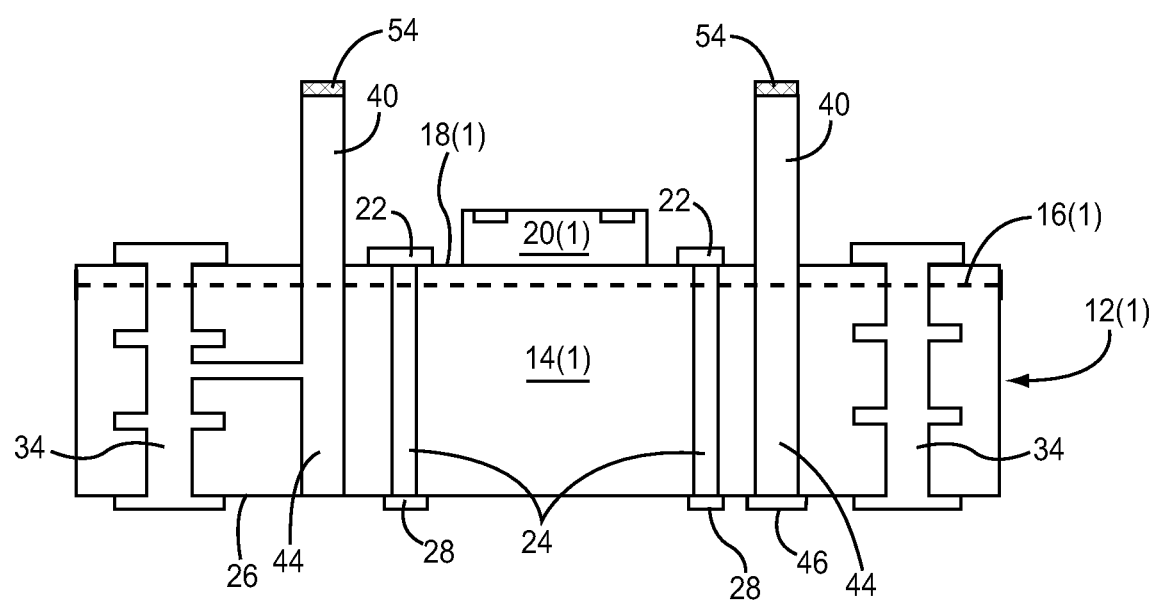
Figure 2R:
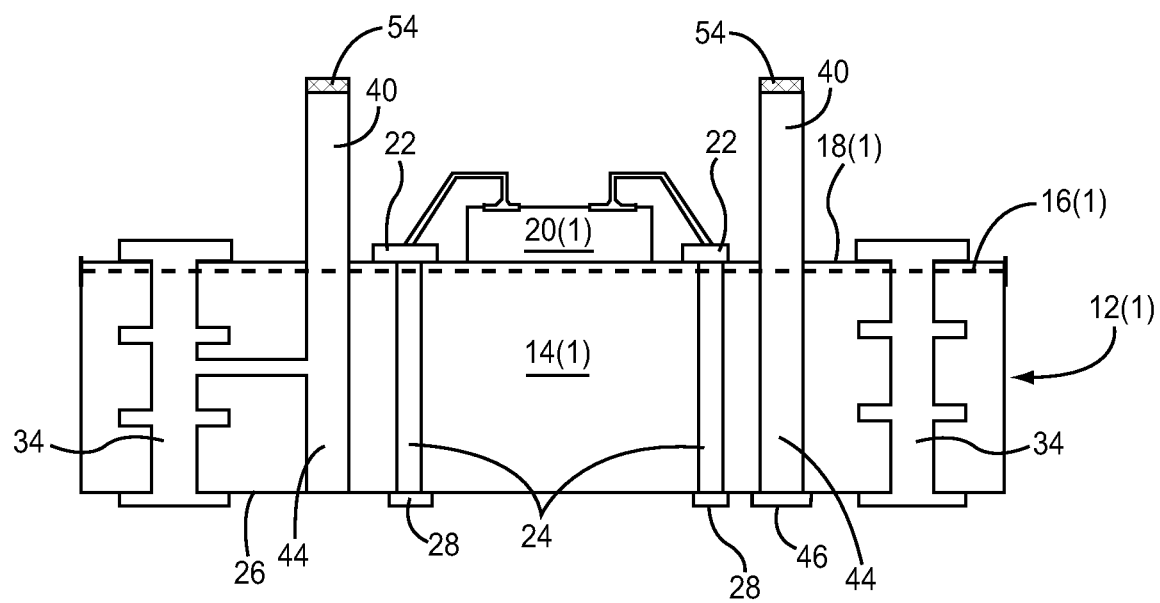
Figure 2S:
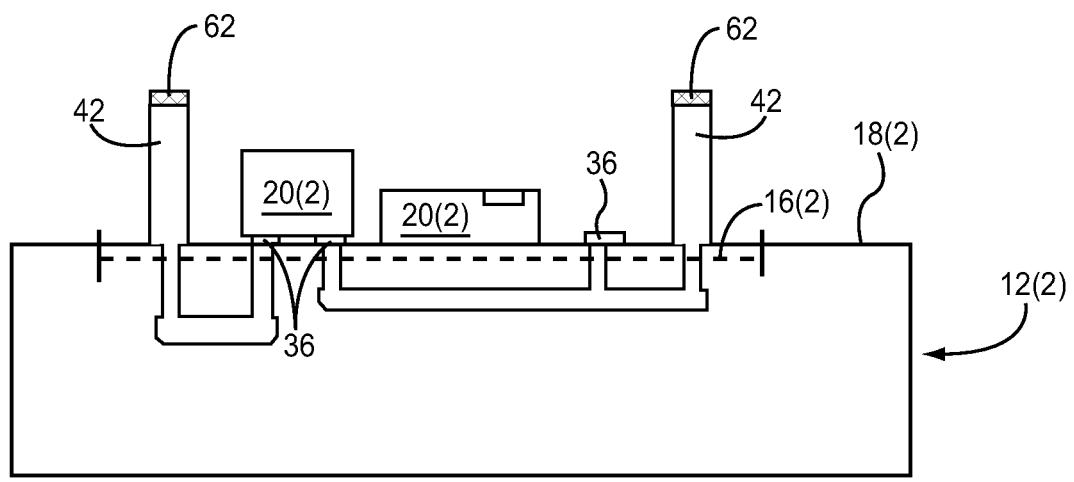
Figure 2T:
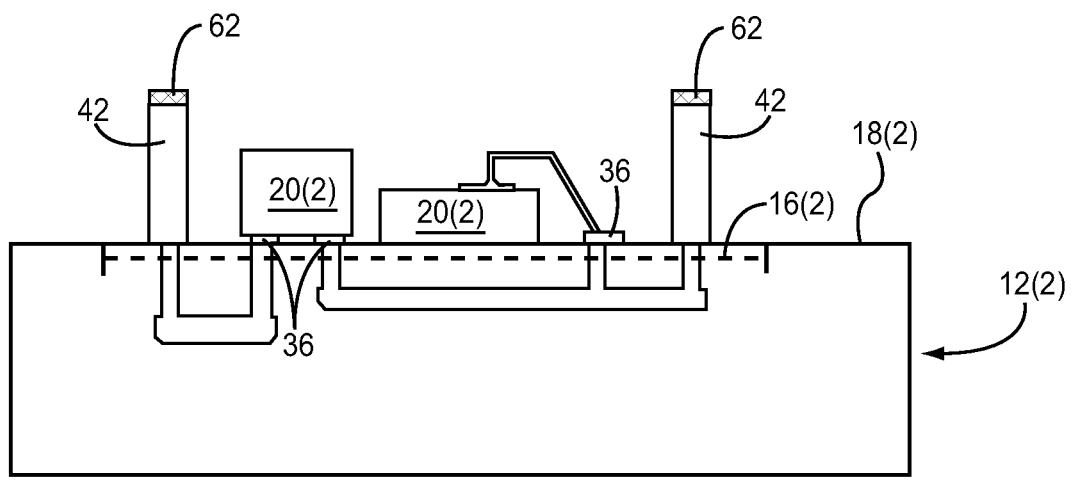
Figure 2U:
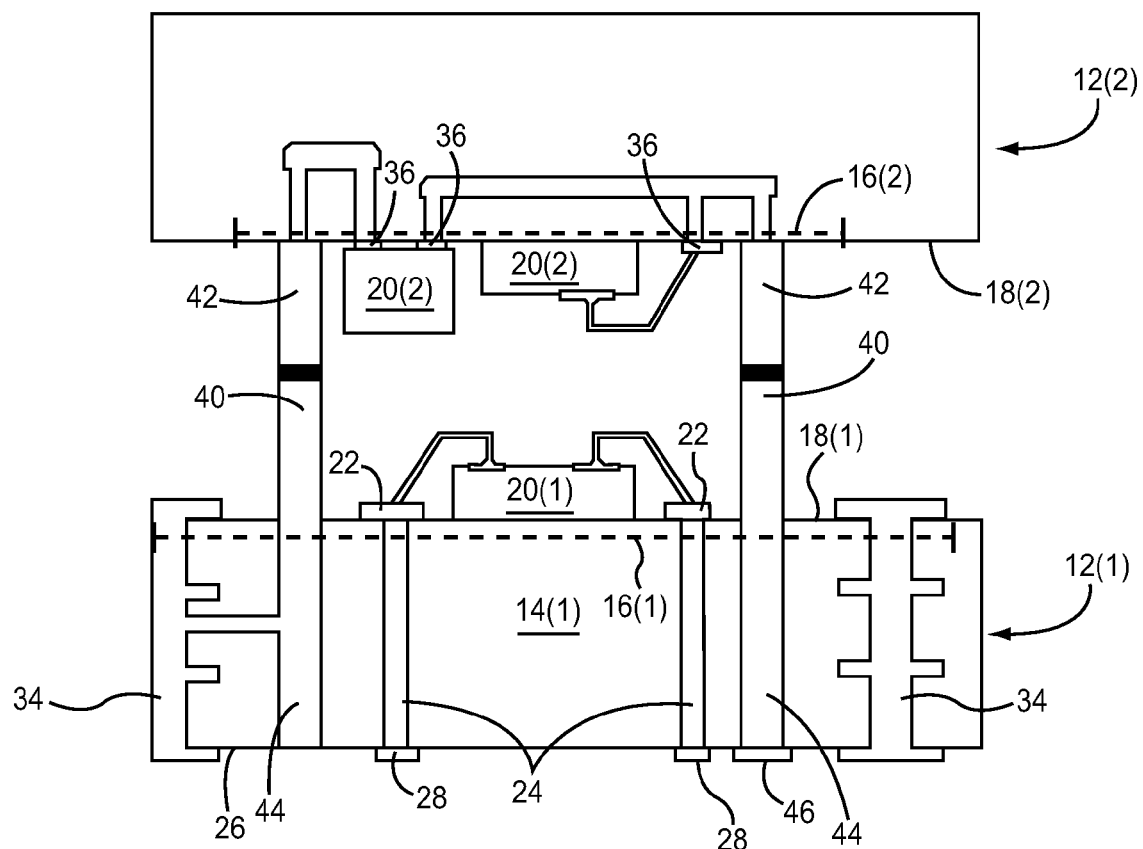
Figure 2V:
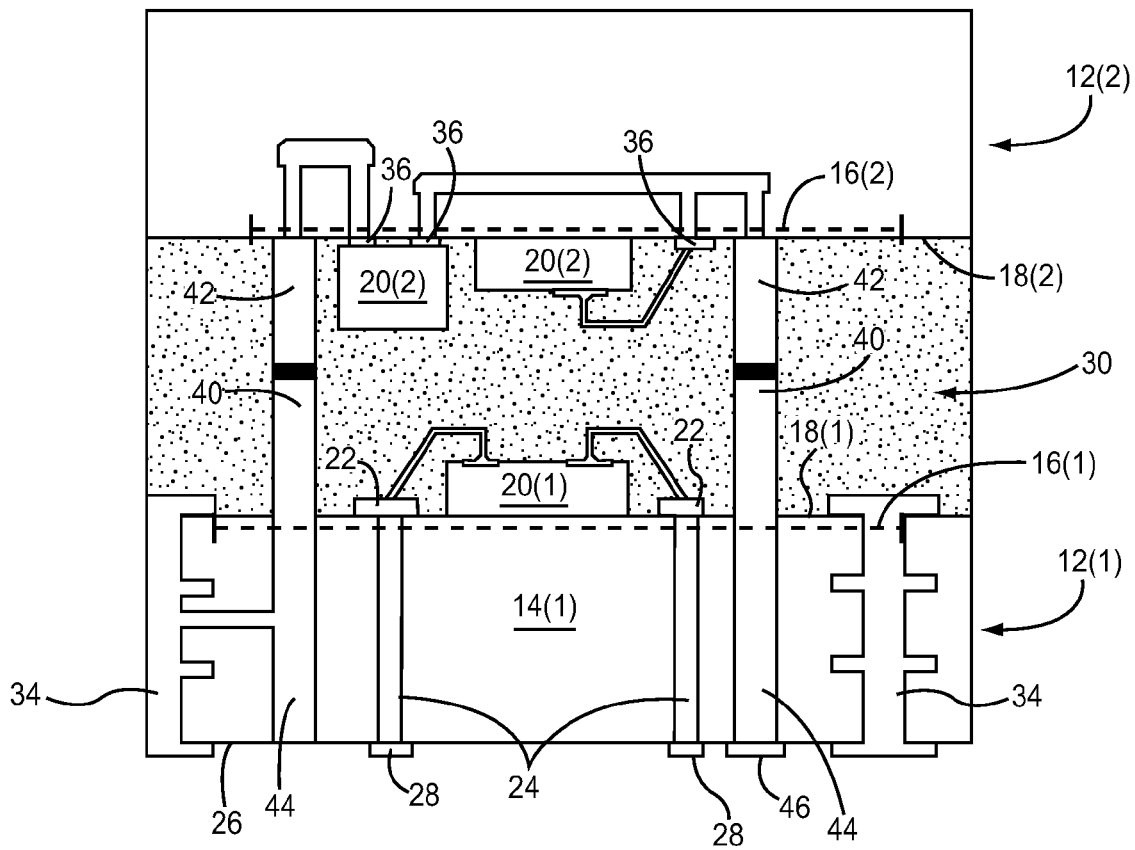
Figure 2W:
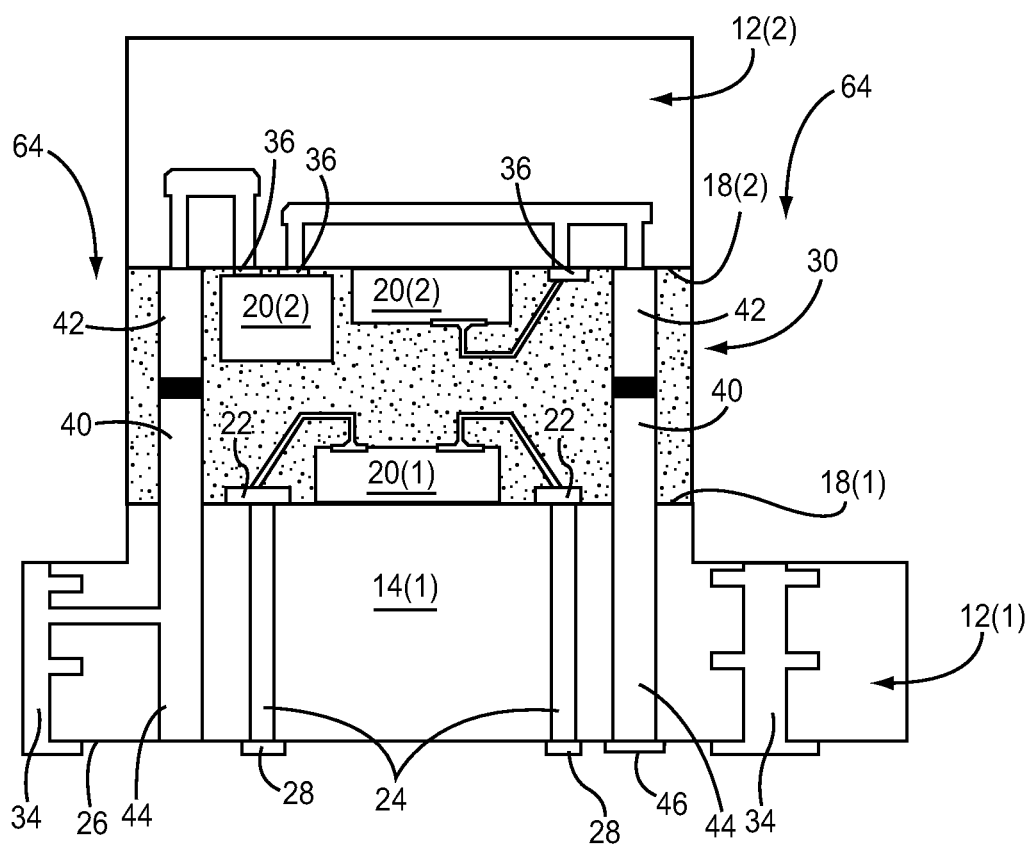
Figure 2X:
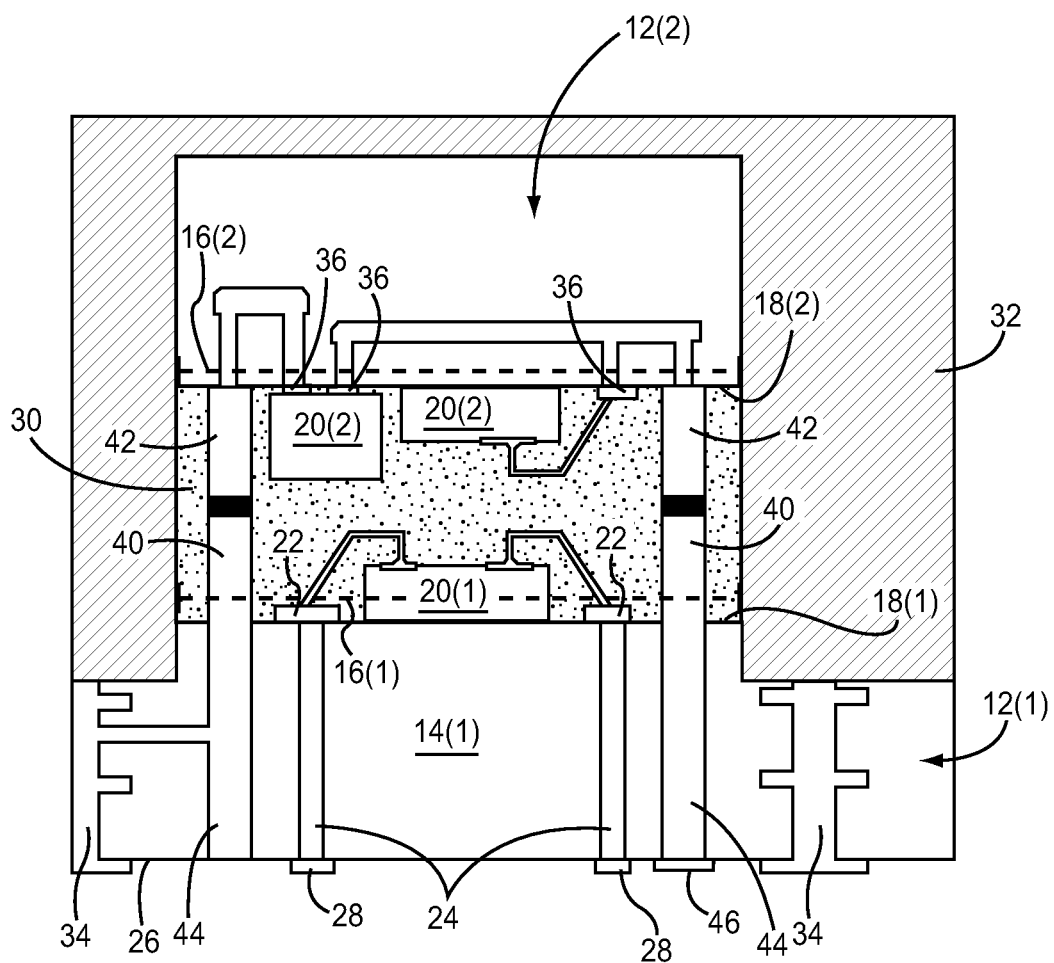

FIGS. 2A-2X illustrate a series of procedures for manufacturing the electronic module 10 illustrated in FIG. 1. It should be noted that the ordering of these procedures is illustrative and that the procedures may be performed in a different order. Furthermore, the procedures are not meant to be exhaustive, and other steps and/or different steps may be utilized to manufacture the electronic module 10, as shall be recognized by one of ordinary skill in the art in light of this disclosure. First, the first substrate 12(1) is provided (FIG. 2A). The first substrate 12(1) may be formed from vertically stacked insulation layers that make up the body of the component portion 14(1). Conductive features, such as the conductive pads 22, the surface conductive pads 28, the conductive vias 24, the conductive vias 44, and the metallic structure 34 may also be provided within the first substrate 12(1) or on the surfaces 18(1), 26. The first substrate 12(1) and related conductive features may have been built during earlier procedures in the manufacturing process, or may simply have been ordered from an external manufacturer and provided for further manufacturing in-house. The conductive features may be made from any type of conductive material, such as a metal like copper (Cu), gold (Au), silver (Ag), Aluminum (Al), nickel (Ni), and/or the like. The conductive material may also include metallic alloys and other metallic materials mixed with or forming ionic or covalent bonds with other non-metallic materials to provide a desired material property.

Prior to mounting the second substrate 12(2) (shown in FIG. 1) over the first substrate 12(1), the support members 40 (shown in FIG. 1) that extend from the first component area 16(1) are formed. To do this, a seed layer 48 may be provided over the surface 18(1) of the first substrate 12(1) (FIG. 2B). The seed layer 48 shown in FIG. 2B at least covers the first component area 16(1) of the component portion 14(1) provided by the first substrate 12(1). A mask 50 is then provided over the seed layer 48 on the first component area 16(1) (FIG. 2C). The mask 50 is then developed to expose portions of the seed layer 48 for building the support members 40 (shown in FIG. 1) (FIG. 2D). In this embodiment, the portions of the seed layer exposed are the portions that are over the conductive vias 44, which are exposed through the surface 18(1) of the first substrate 12(1). As such, openings 52 are formed in the mask 50 over the conductive vias 44 in the first substrate 12(1).

A conductive material is then applied onto the seed layer 48 within the openings 52 of the mask 50 to form the support members 40 (FIG. 2E). A solder bump 54 is then applied within the openings 52 on the support members 40 (FIG. 2F). Accordingly, the top of each of the support members 40 is provided by one of the solder bumps 54. The mask 50 (shown in FIG. 2F) is then removed (FIG. 2G). The seed layer 48 that was not utilized to form the support members 40 is then removed (FIG. 2H). It should be noted that the seed layer 48 is no longer explicitly illustrated in the drawings because the portions of the seed layer 48 that remain are now part of the support members 40.

Next, the second substrate 12(2) is provided (FIG. 2I). The second substrate 12(2) may be formed in previous procedures of the manufacturing process, or may have been formed by an external manufacturer and provided for additional manufacturing in-house. Prior to mounting the second substrate 12(2) (as shown in FIG. 1) over the first substrate 12(1), the support members 42 (shown in FIG. 1) that extend from the second component area 16(2) are formed. To do this, a seed layer 56 is applied over the surface 18(2) of the second substrate 12(2) (FIG. 2J). The seed layer 56 covers the second component area 16(2) and the surface conductive elements 36 formed on the surface 18(2) of the second substrate 12(2). A mask 58 is then applied over the surface 18(2) of the second substrate 12(2) (FIG. 2K). As such, the mask 58 covers the seed layer 56 and the surface conductive elements 36 on the second component area 16(2). The mask 58 is then developed to remove a section of the mask 58 and expose at least a portion of the seed layer 56 (FIG. 2L). In this embodiment, the mask 58 is developed to expose portions of the seed layer 56 that are on a selected set of the surface conductive elements 36. These portions of the seed layer 56 are exposed through openings 60 in the mask 58, which are the result of developing the mask 58. Next, a conductive material is applied on the exposed sections of the seed layer 56 to form the support members 42 (FIG. 2M). In this embodiment, the conductive material is applied by electroplating the conductive material over the exposed sections within the openings 60 of the mask 58. Subsequently, solder bumps 62 are applied to the support members 42 to form a top part of the support members 42 (FIG. 2N). In this manner, the support members 42 are formed within the openings 60 on the exposed sections of the seed layer 56. The mask 58 is then removed from the seed layer 56 (FIG. 2O). The portions of the seed layer 56 that were not used to form the support members 42 are then removed from the surface 18(2) and from any of the surface conductive elements 36 which were not used to form the support members 42 (FIG. 2P). For the sake of clarity, the seed layer 56 on the set of surface conductive elements 36, and the surface conductive elements 36 themselves, are no longer explicitly illustrated, since they now form and are part of the support members 42.

The electronic component 20(1) may then be attached to the first component area 16(1) on the surface 18(1) of the first substrate 12(1) (FIG. 2Q). The electronic component 20(1) is wire bonded to the surface conductive pads 22 in the first component area 16(1) on the surface 18(1) (FIG. 2R). The electronic components 20(2) are then attached to the second component area 16(2) on the surface 18(2) of the second substrate 12(2) (FIG. 2S). In this embodiment, one of the electronic components 20(2) is a surface-mount device, and thus is attached through soldering or the like to a set of the surface conductive elements 36, and is thereby simultaneously connected when attached to the second substrate 12(2). The other one of the electronic components 20(2) is then wire bonded to another set of the one or more surface conductive elements 36 on the surface 18(2) of the second substrate 12(2) (FIG. 2T).

The second substrate 12(2) is then mounted over the first substrate 12(1) such that the second component area 16(2) on the surface 18(2) of the second substrate 12(2) faces the first component area 16(1) on the surface 18(1) of the first substrate 12(1) (FIG. 2U). In this particular embodiment, the support members 42 extending from the surface 18(2) are mounted on the support members 40 extending from the surface 18(1), and soldered together using the solder bumps 54, 62 (see FIGS. 2F, 2N). As such, the support members 40 extend from the surface 18(1) toward the second component area 16(2) of the second substrate 12(2), and the support members 42 extend from the second surface 18(2) toward the first component area 16(1) of the first substrate 12(1). A gap is defined between the first component area 16(1) and the second component area 16(2) by the mounting of the second substrate 12(2) over the first substrate 12(1).

After the electronic components 20(1), 20(2) are connected and the second substrate 12(2) is mounted over the first substrate 12(1), the overmold 30 is provided to cover the first component area 16(1) on the surface 18(1) of the first substrate 12(1), and to cover the second component area 16(2) on the surface 18(2) of the second substrate 12(2) (FIG. 2V). The overmold 30 is injected to fill the gap between the first component area 16(1) and the second component area 16(2). As such, the overmold 30 covers the electronic component 20(1) attached to the first component area 16(1) and the electronic components 20(2) attached to the second component area 16(2).

Prior to forming the electromagnetic shield 32 (shown in FIG. 1), an opening 64 is then formed through the second substrate 12(2) and at least the overmold 30 to expose at least a section of the metallic structure 34 along the periphery of the component portion 14(1) (FIG. 2W). In this embodiment, forming the opening 64 includes removing a portion of the overmold 30 and a portion of the metallic structure 34 within the first substrate 12(1) to expose a section of the metallic structure 34. A seed layer (not shown) may be provided over the second substrate 12(2) and the sections of the metallic structure 34 exposed by the opening 64. An electromagnetic shield material may then be applied onto the seed layer. Accordingly, the electromagnetic shield material is applied within the opening 64 and on the second substrate 12(2) by, for example, an electrolytic or electroless plating process, so that the electromagnetic shield material builds on the sections exposed within the opening 64 and over the second substrate 12(2). This forms the electromagnetic shield 32 that covers the component areas 16(1) and 16(2) (FIG. 2X). In this manner, the electromagnetic shield 32 is connected to the sections exposed by the opening 64 (shown in FIG. 2W) of the metallic structure 34. This thereby allows the electromagnetic shield 32 to be grounded.

Figure 3:
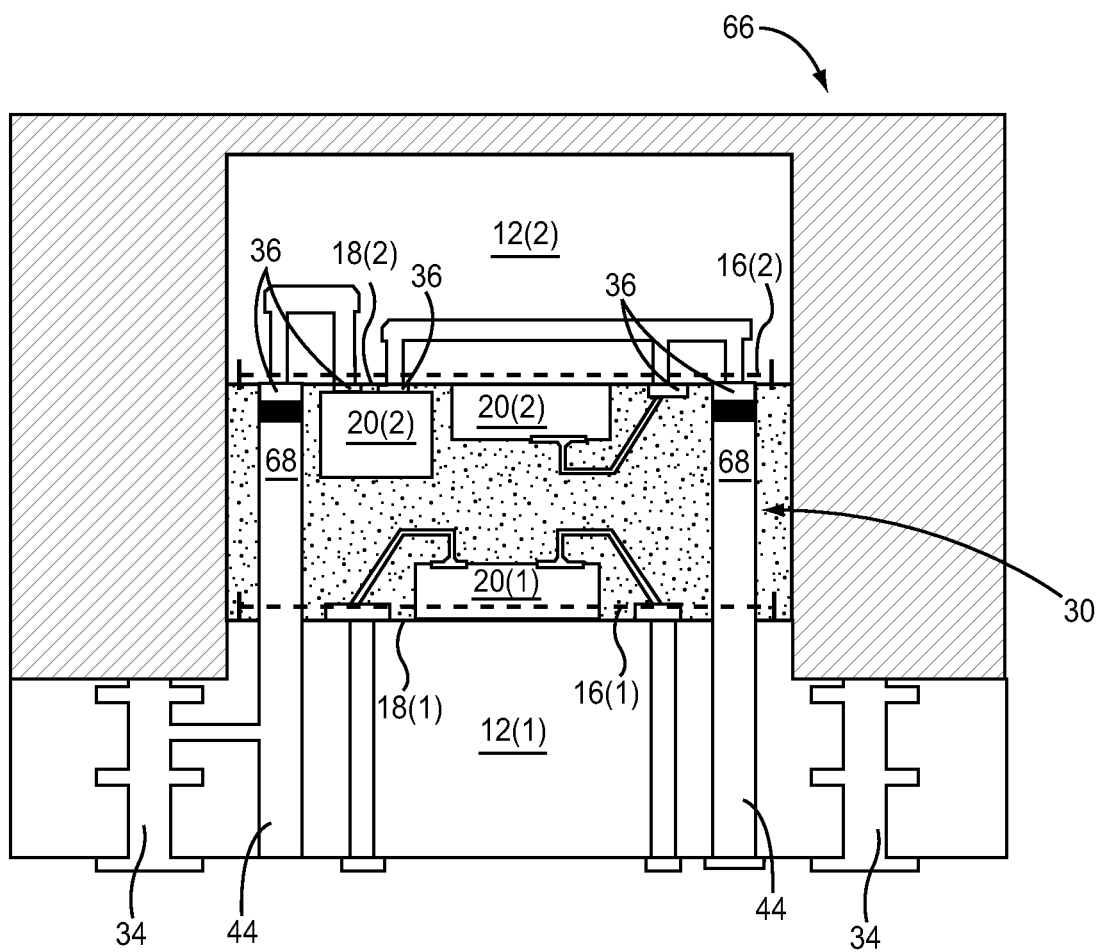
FIG. 3 illustrates another embodiment of an electronic module in accordance with this disclosure.

FIG. 3 illustrates another embodiment of an electronic module 66. Like the electronic module 10 shown in FIG. 1, the electronic module 66 shown in FIG. 3 has the first substrate 12(1) and the second substrate 12(2). Also, the electronic components 20(1) and 20(2) are attached to the first component area 16(1) and the second component area 16(2), respectively, as described above. The overmold 30 also covers the first component area 16(1) and the second component area 16(2) so as to cover the electronic components 20(1), 20(2) on both the first component area 16(1) and the second component area 16(2), as described above. Additionally, in order for more electronic components to be provided within the electronic module 66, the second substrate 12(2) is mounted over the first substrate 12(1) such that the second component area 16(2) on the surface 18(2) faces the first component area 16(1) on the first surface 18(1). However, in this embodiment, support members 68 used to mount the second substrate 12(2) over the first substrate 12(1) are different from the support members 40, 42 (FIG. 1). While the support members 68 are also formed from a conductive material in order to provide the same connections as described above with regard to the electronic module 10, the support members 68 are longer than the support members 40 and 42, such that only the support members 68 are used to mount the second substrate 12(2) over the first substrate 12(1) in the embodiment shown in FIG. 3.

The support members 68 extend from the first component area 16(1) on the first surface 18(1) of the first substrate 12(1) towards the second component area 16(2) on the second surface 18(2) of the second substrate 12(2). More specifically, the support members 68 extend from the first component area 16(1) onto a set of one or more surface features on the second component area 16(2), which in this example are conductive features on the second component area 16(2). In particular, the conductive features are the surface conductive elements 36 attached to the second component area 16(2) on the surface 18(2) of the substrate 12(2). The support members 68 are attached to the surface conductive elements 36 and thereby provide structural support that mounts the second substrate 12(2) over the first substrate 12(1). It should be noted that in alternative embodiments, one or more support members like the support members 68 may extend from the second component area 16(2) (and not the first component area 16(1)) and onto other types of conductive features exposed on the surface 18(2) (such as the conductive vias 44 or traces) of the first substrate 12(1). In this embodiment, the support members 68 are copper pillars, which are soldered to the surface conductive elements 36.

Figure 4A:
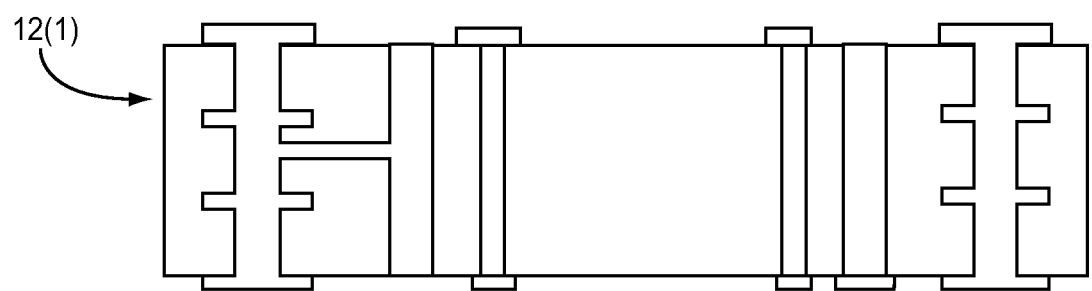
FIGS. 4A-4P illustrate exemplary procedures for forming the other embodiment of the electronic module shown in FIG. 3.

FIGS. 4A-4Q illustrate a series of exemplary procedures for manufacturing the electronic module 66 shown in FIG. 3. It should be noted that the ordering of these procedures is simply illustrative and the procedures may be performed in a different order. Furthermore, the procedures are not meant to be exhaustive, and other procedures and/or different procedures may be utilized to manufacture the electronic module 66, as shall be recognized by one of ordinary skill in the art in light of this disclosure.

Figure 4B:
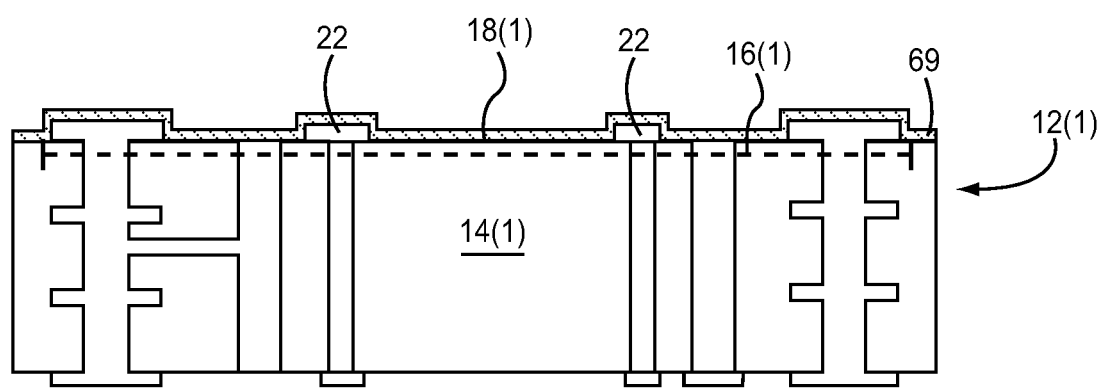
Figure 4C:
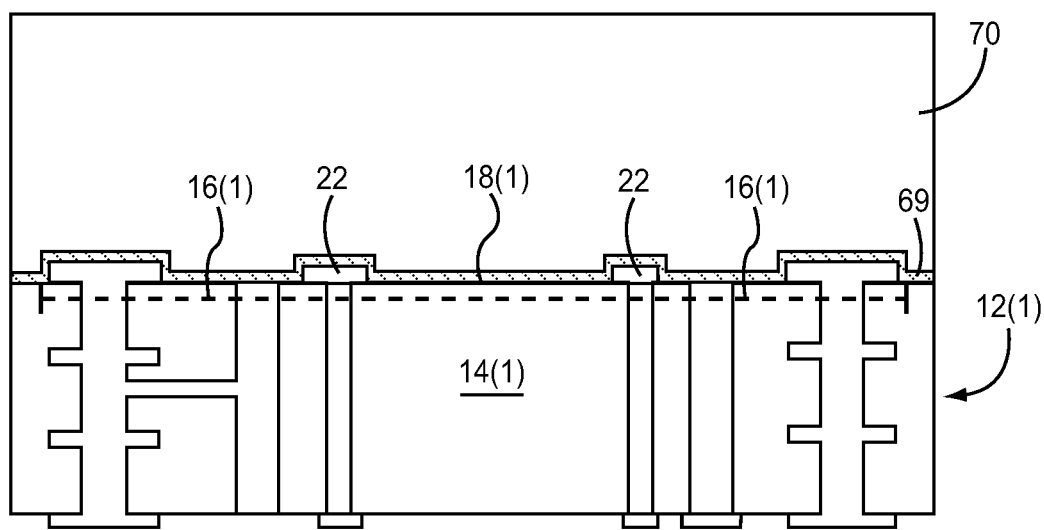
Figure 4D:
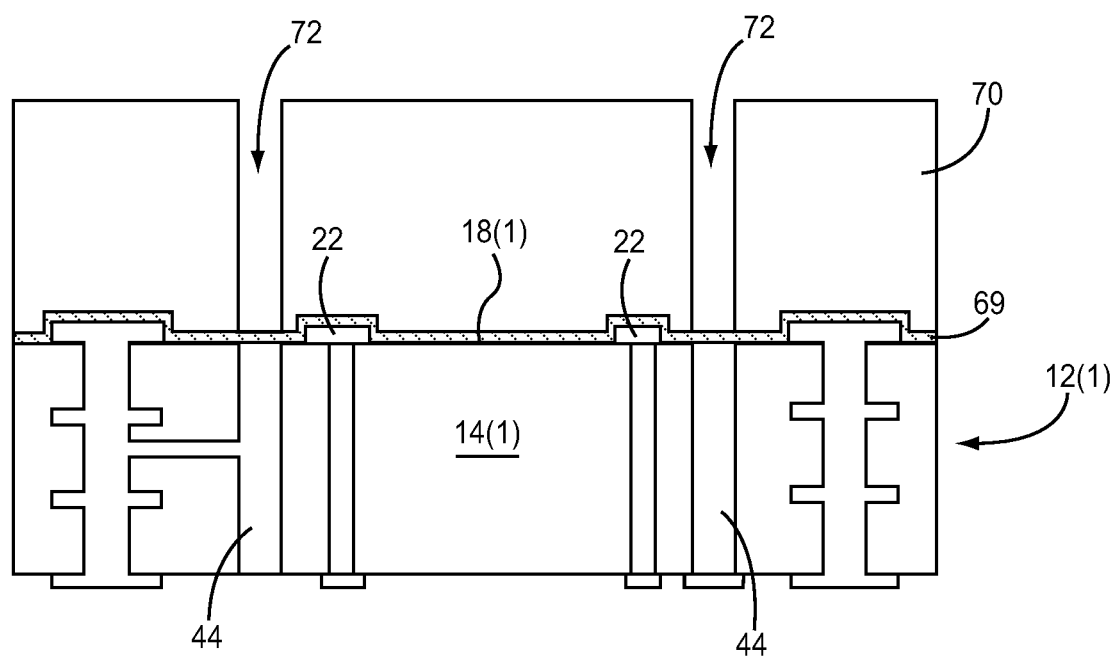
Figure 4E:
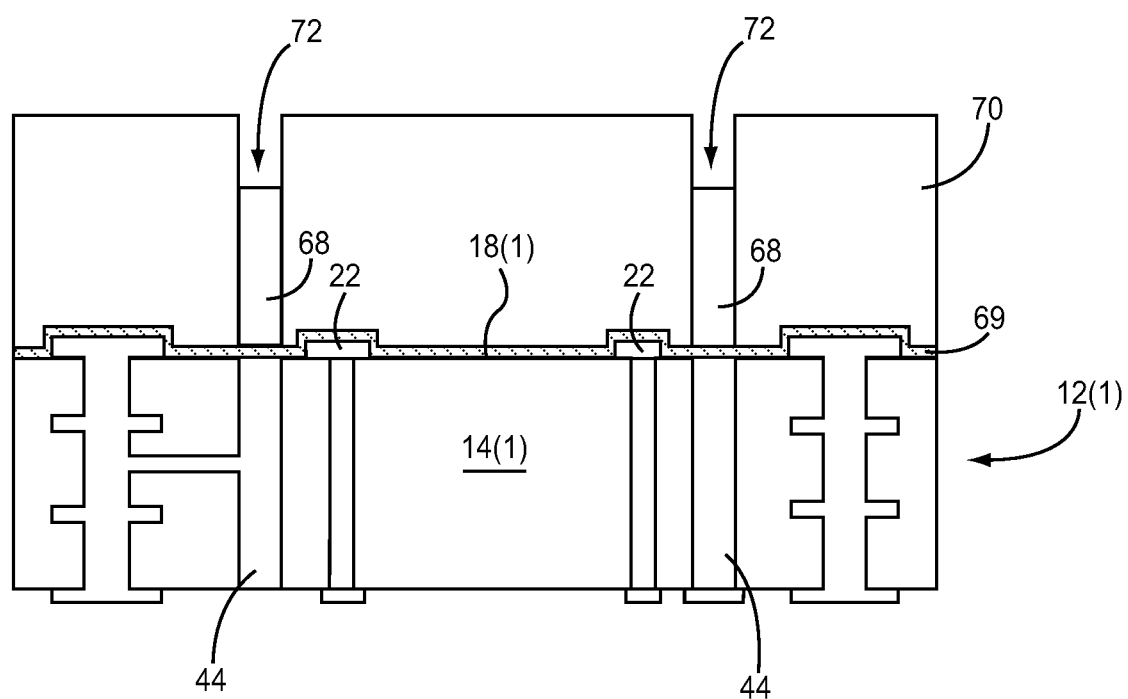
Figure 4F:
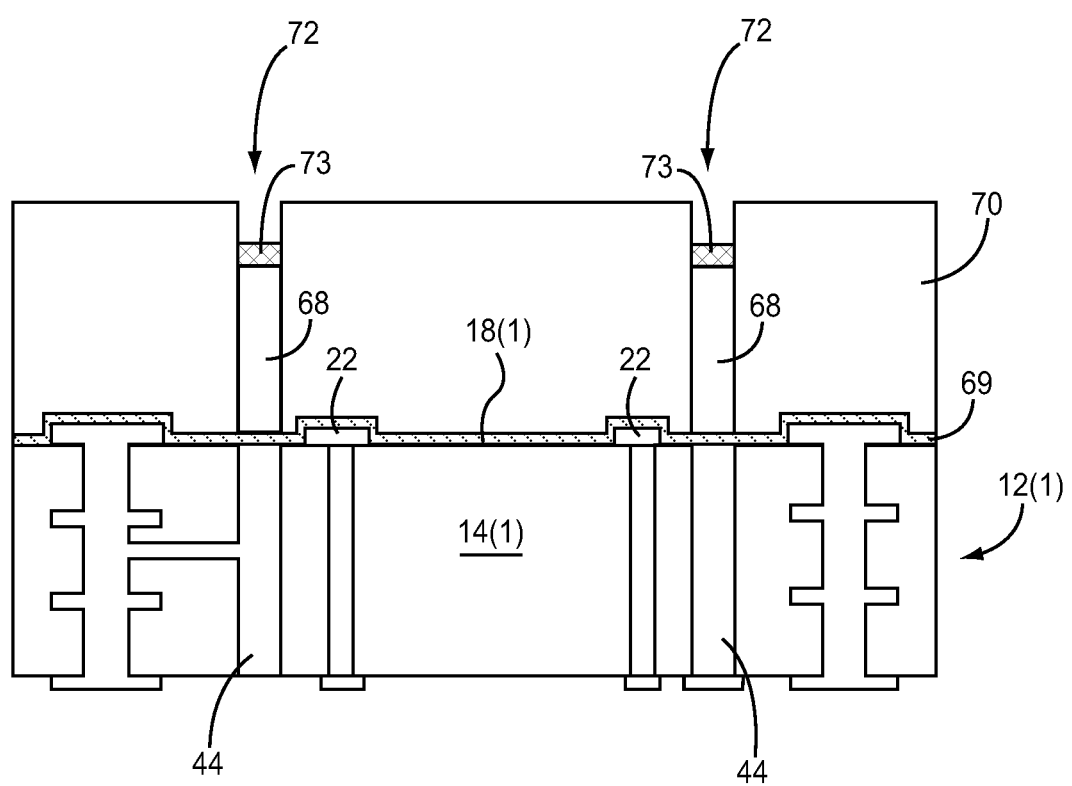
Figure 4G:
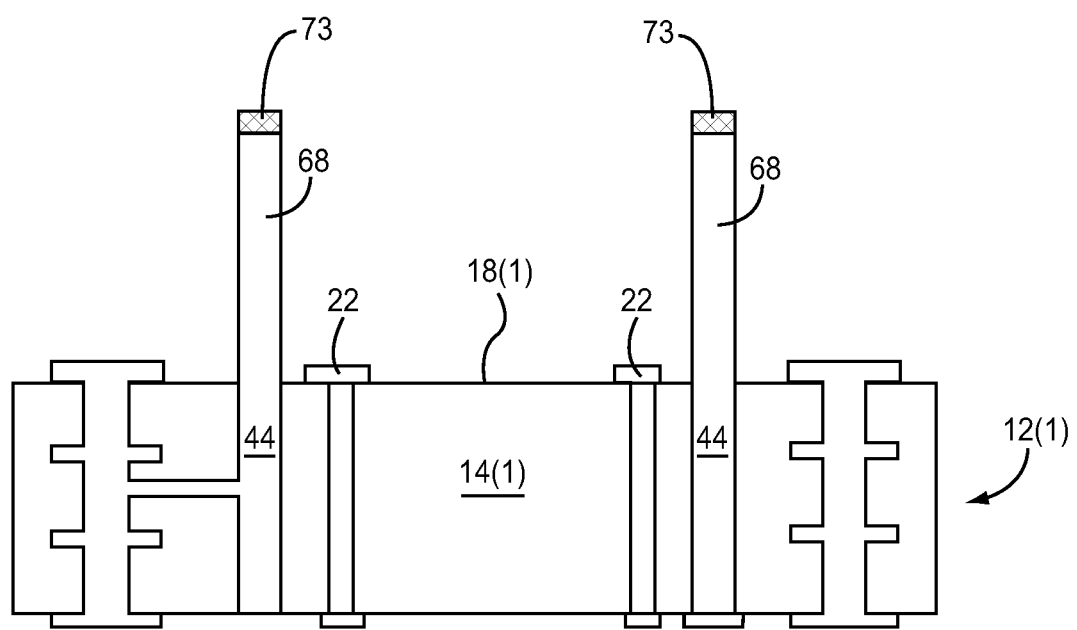

First, the first substrate 12(1) is provided (FIG. 4A). Prior to mounting the second substrate 12(2) (shown in FIG. 3) over the first substrate 12(1), the support members 68 (shown in FIG. 3) are formed. To do this, a seed layer 69 is applied over the first component area 16(1) on the surface 18(1) of the first substrate 12(1) (FIG. 4B). The seed layer 69 covers the surface 18(1) of the first substrate 12(1). A mask 70 is then applied over the first component area 16(1) on the surface 18(1) of the first substrate 12(1) (FIG. 4C). The mask 70 is then developed to expose sections of the seed layer 69. In this embodiment, openings 72 are formed in the mask 70 that expose sections of the seed layer 69 on the conductive vias 44 (FIG. 4D). The support members 68 are then formed over the sections of the seed layer 69 that have been exposed (FIG. 4E). In this particular embodiment, conductive material is electroplated into the openings 72 of the mask 70 to form the support members 68 on the sections of the seed layer 69 exposed by the openings 72. Solder bumps 73 are then applied to the support members 68 so as to form a top part of the support members 68 (FIG. 4F). The mask 70 (shown in FIG. 4F) is then removed (FIG. 4G). The portions of the seed layer 69 that are not on the conductive vias 44 are also removed.

Figure 4H:
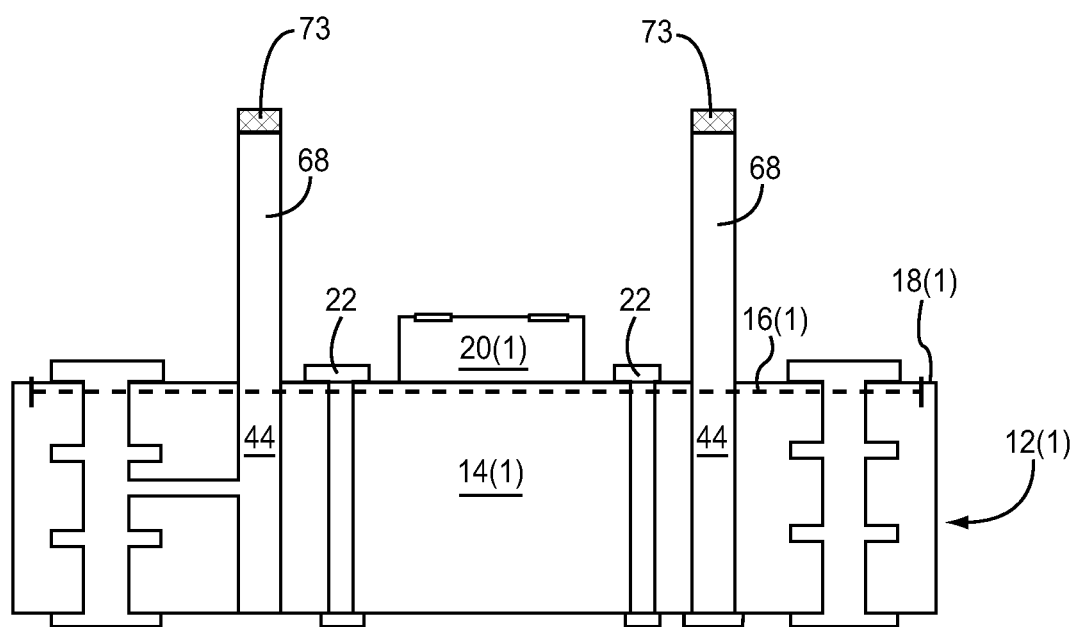
Figure 4I:
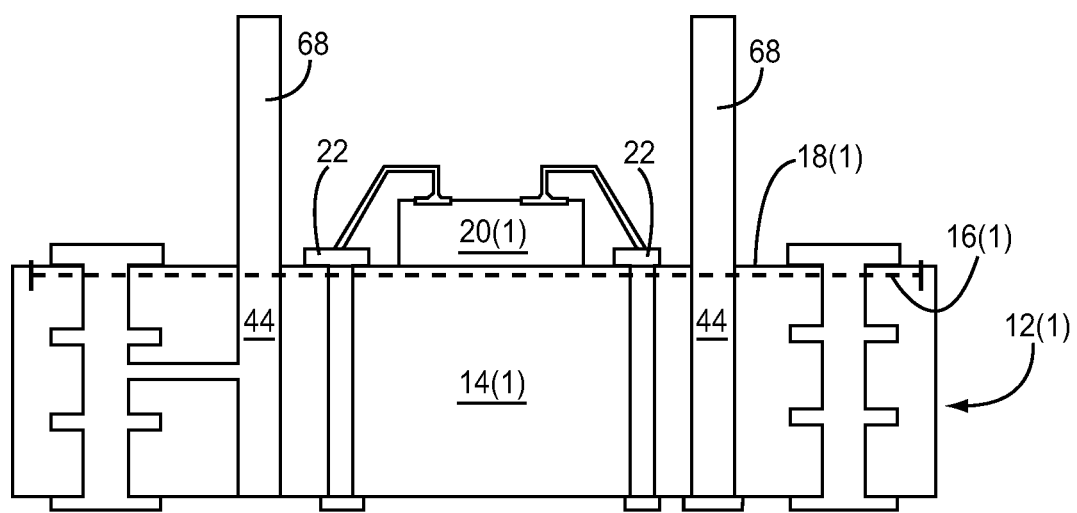
Figure 4J:
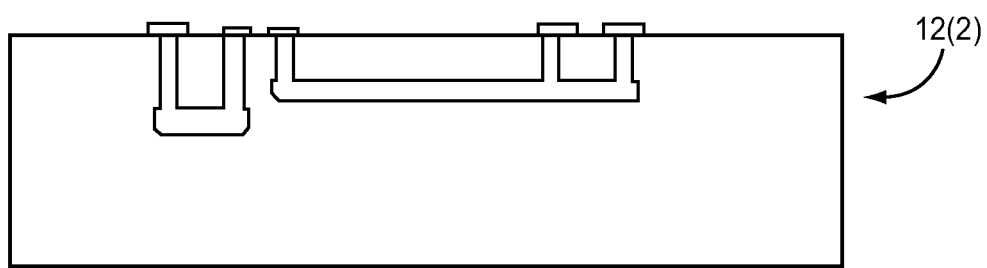
Figure 4K:
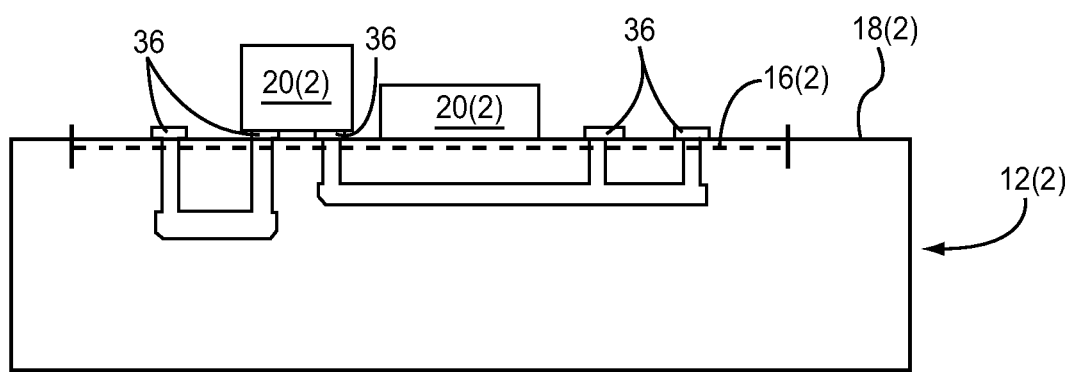
Figure 4L:
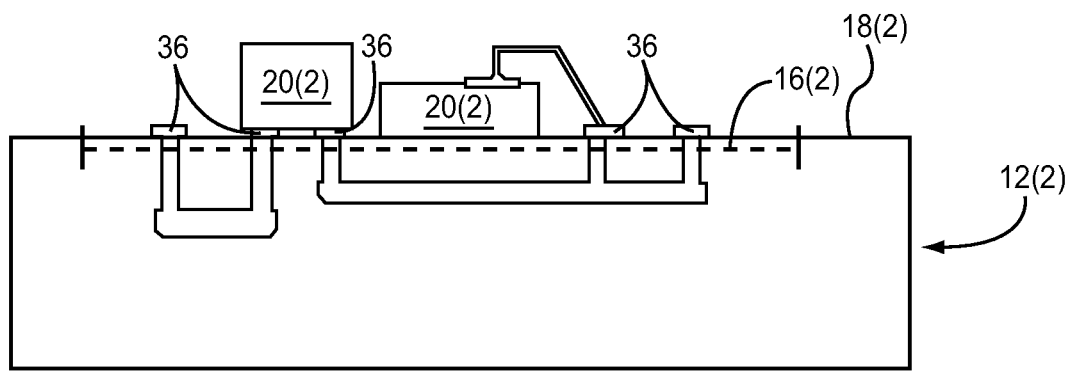

Next, the electronic component 20(1) is attached to the first component area 16(1) of the first substrate 12(1) (FIG. 4H). The electronic component 20(1) is then wire bonded to the surface conductive pads 22 on the surface 18(1) of the first substrate 12(1) (FIG. 4I). Subsequently, the second substrate 12(2) is provided (FIG. 4J). The electronic components 20(2) are then attached to the second component area 16(2) on the surface 18(2) of the second substrate 12(2) (FIG. 4K). As shown in FIG. 4K, one of the electronic components 20(2) is a surface-mount component and is connected at the same time it is attached to the second component area 16(2) on the surface 18(2). The other electronic component 20(2) is wire bonded to a set of one or more of the surface conductive elements 36 (FIG. 4L).

Figure 4M:
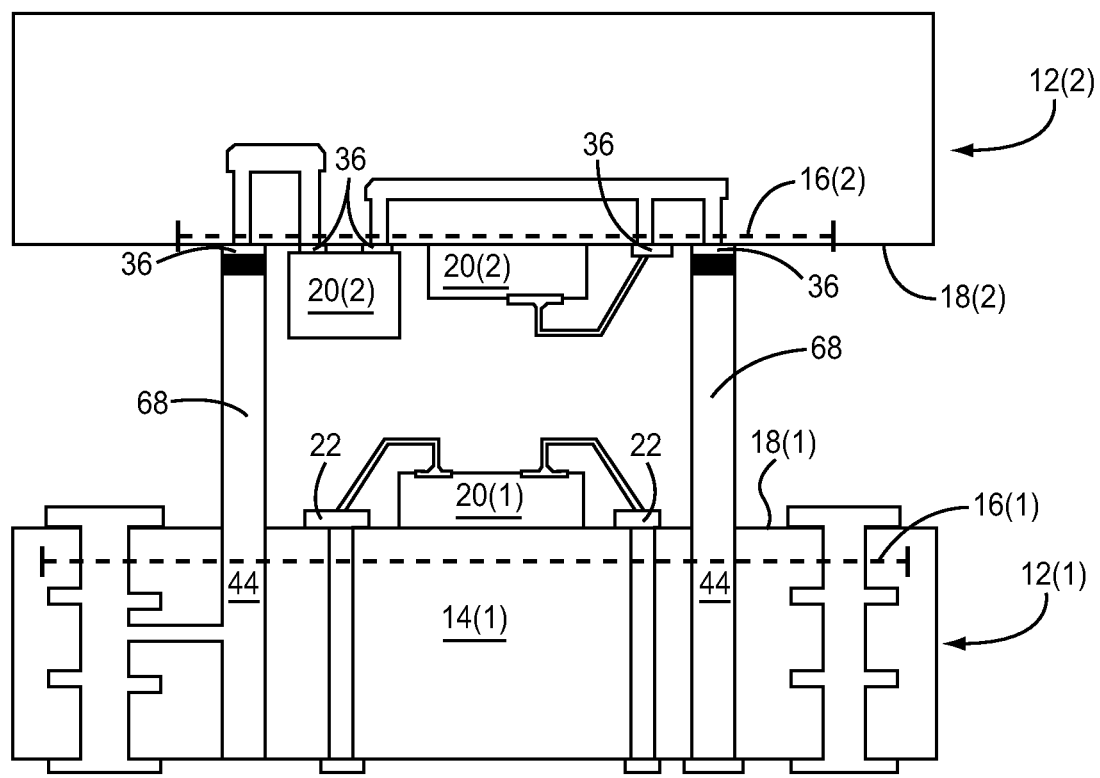
Figure 4N:
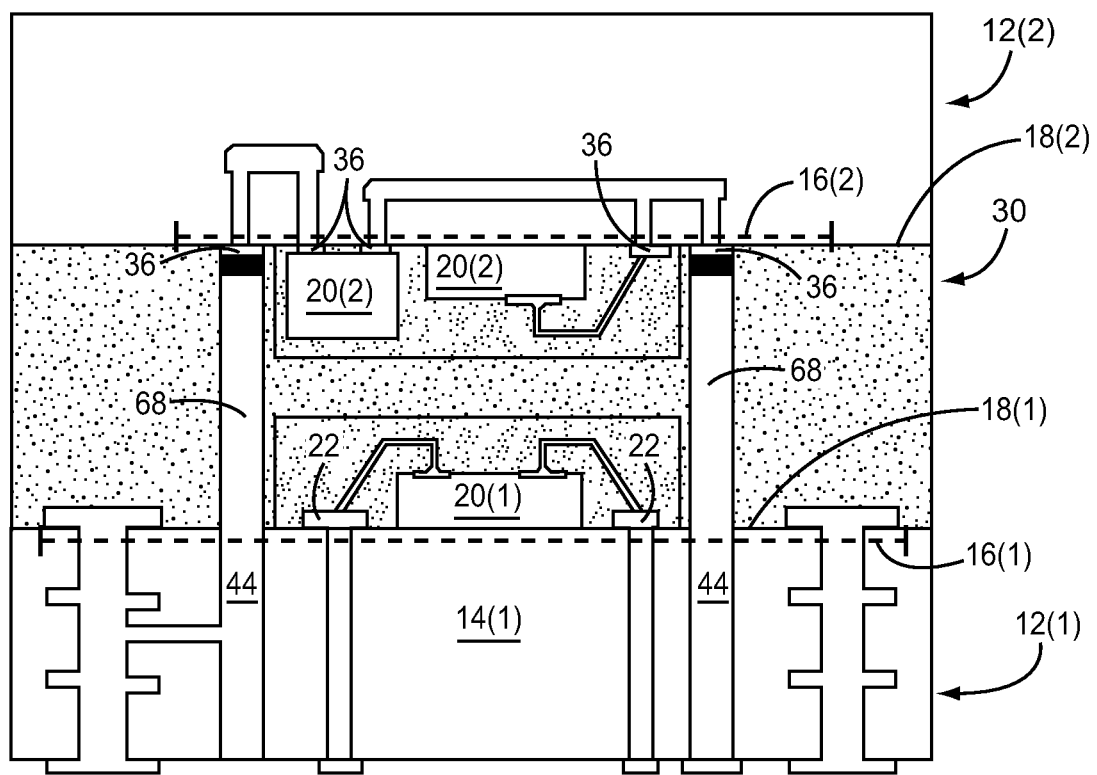

After the support members 68 have been formed and the electronic components 20(1), 20(2) have been attached to the surfaces 18(1) and 18(2), the second substrate 12(2) is mounted over the first substrate 12(1) such that the second component area 16(2) faces the first component area 16(1) (FIG. 4M). To do this, surface features on the first component area 16(1), which in this embodiment are a set of the surface conductive elements 36, are attached to the support members 68. In this embodiment, this set of the surface conductive elements 36 is attached to the support members 68 by soldering the set of the surface conductive elements 36 to the support members 68. After the second substrate 12(2) is mounted over the first substrate 12(1), the overmold 30 is provided to cover the first component area 16(1) and the second component area 16(2) (FIG. 4N). As shown in FIG. 4N, the electronic component 20(1) on the first component area 16(1) and the electronic components 20(2) on the second component area 16(2) are covered by the overmold 30. In this manner, the electronic component 20(1) and the electronic components 20(2) are encapsulated by the overmold 30.

Figure 4O:
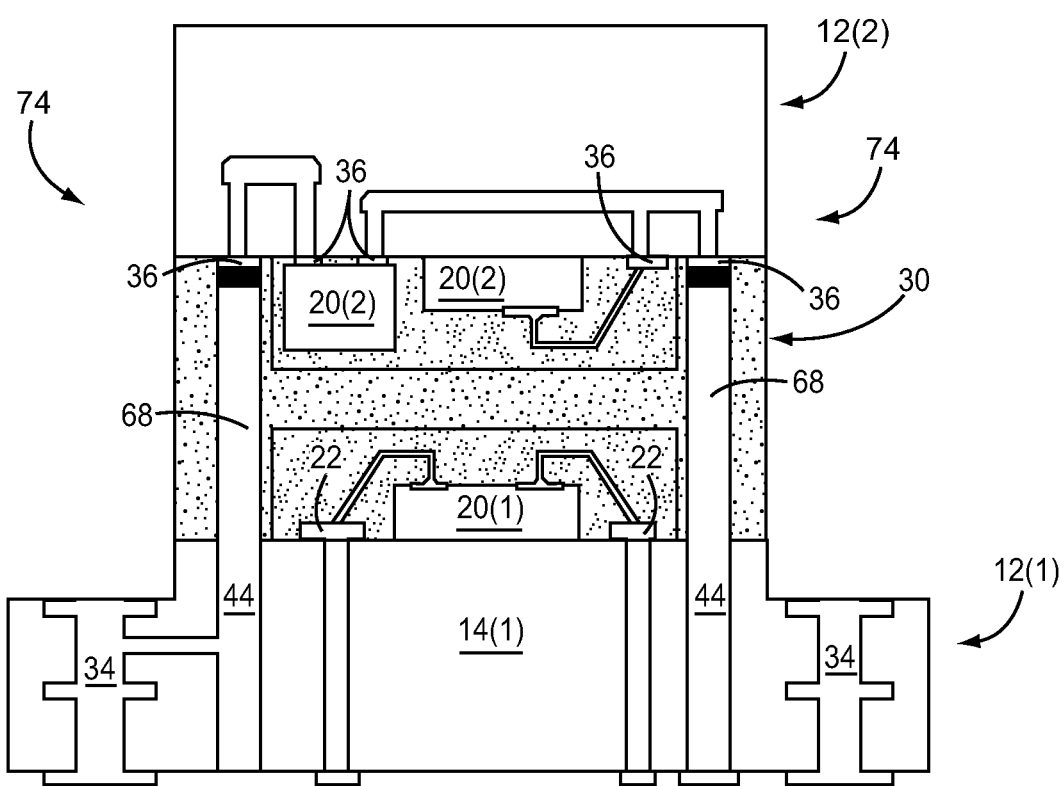
Figure 4P:
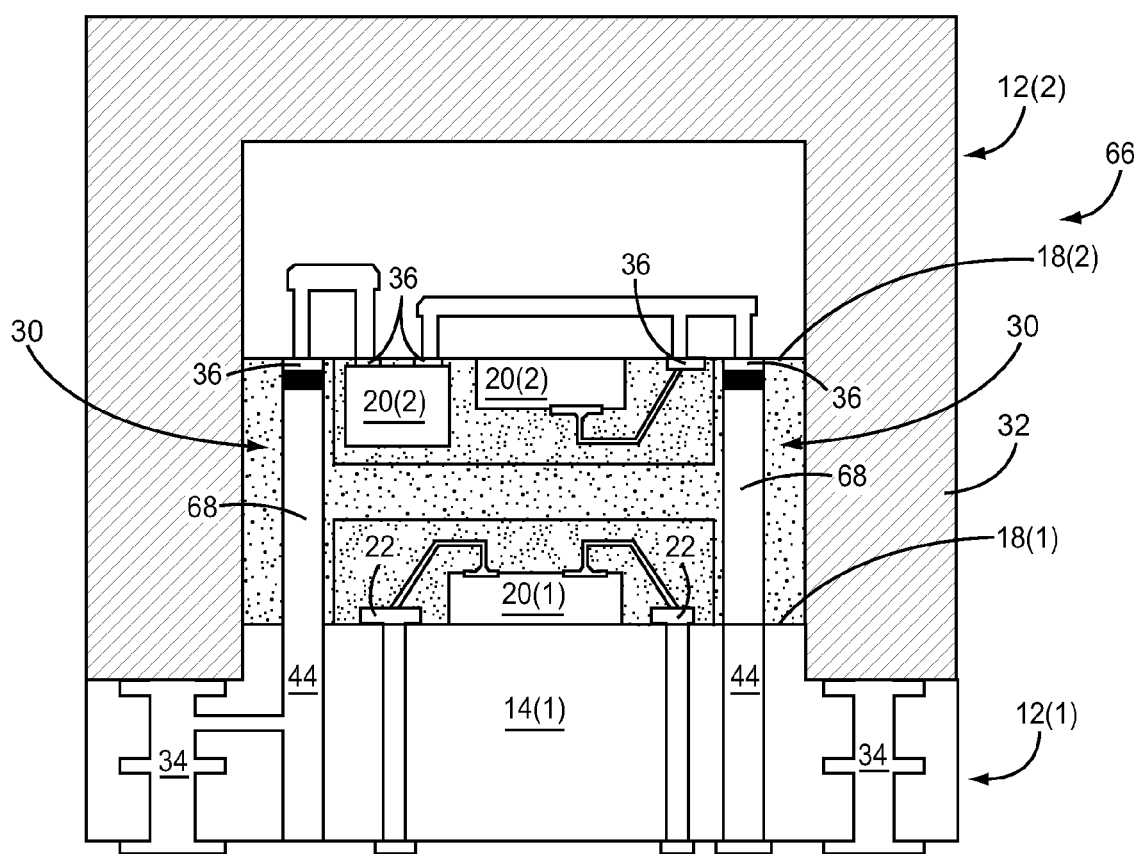

Openings 74 are then formed through at least the overmold 30 and the second substrate 12(2) that expose at least sections of the metallic structure 34 along the periphery of the component portion 14(1) (FIG. 4O). In this embodiment, the openings 74 cut into a portion of the first substrate 12(1) to expose sections of the metallic structure 34. An electromagnetic shield material is then applied over the overmold 30 and within the openings 74 (shown in FIG. 4O) to form the electromagnetic shield 32 of the electronic module 66 (FIG. 4P).

Figure 5A:
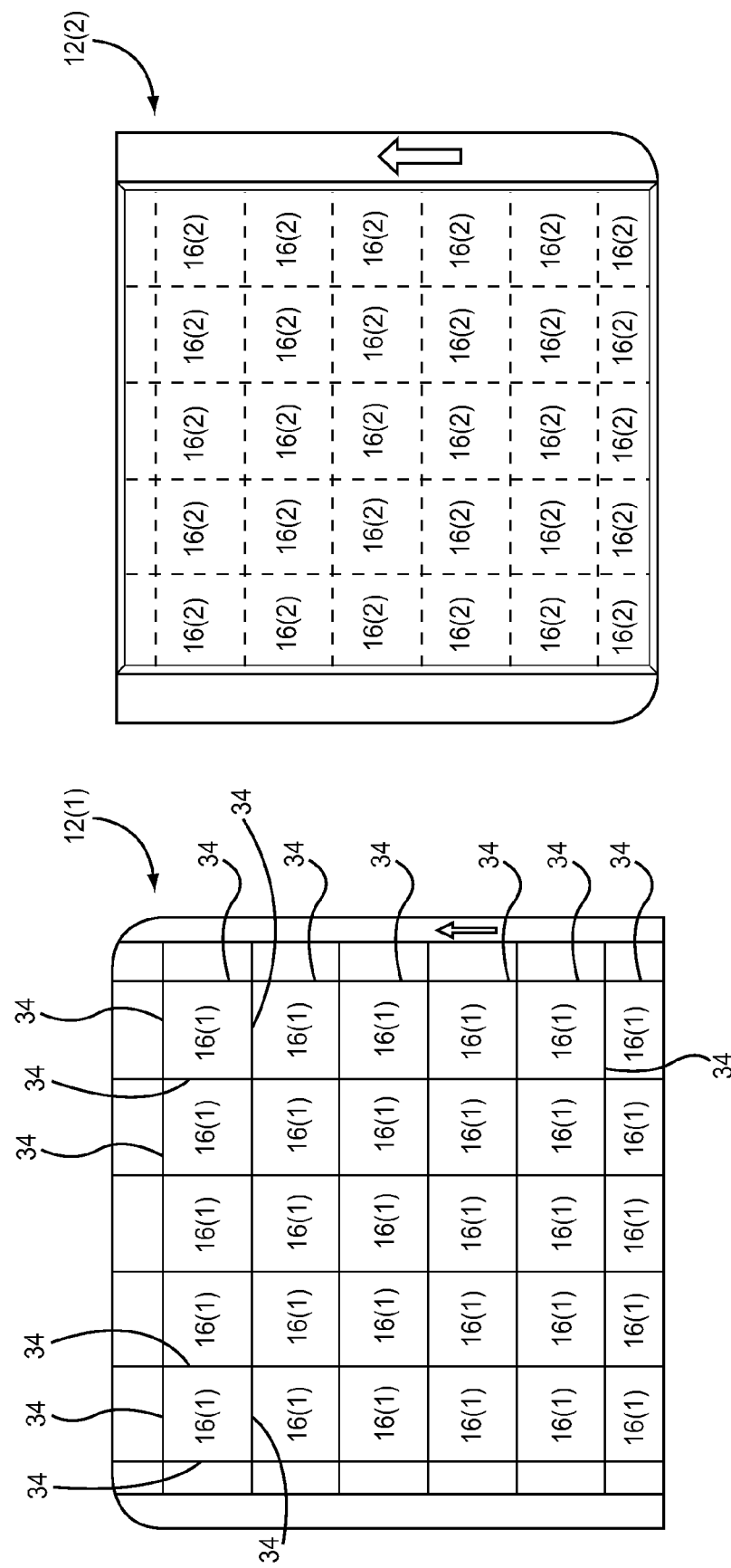
FIGS. 5A-5Z illustrate exemplary procedures for forming electronic modules, like the electronic module shown in FIG. 1, on a single substrate.

FIGS. 5A-5AB illustrate a series of procedures for manufacturing various electronic modules 10 like the electronic module 10 illustrated in FIG. 1. It should be noted that the ordering of these procedures is simply illustrative, and that the procedures may be performed in a different order. Furthermore, the procedures are not meant to be exhaustive, and other procedures and/or different procedures may be utilized to manufacture the electronic modules 10, as shall be recognized by one of ordinary skill in the art in light of this disclosure.

Figure 5B:
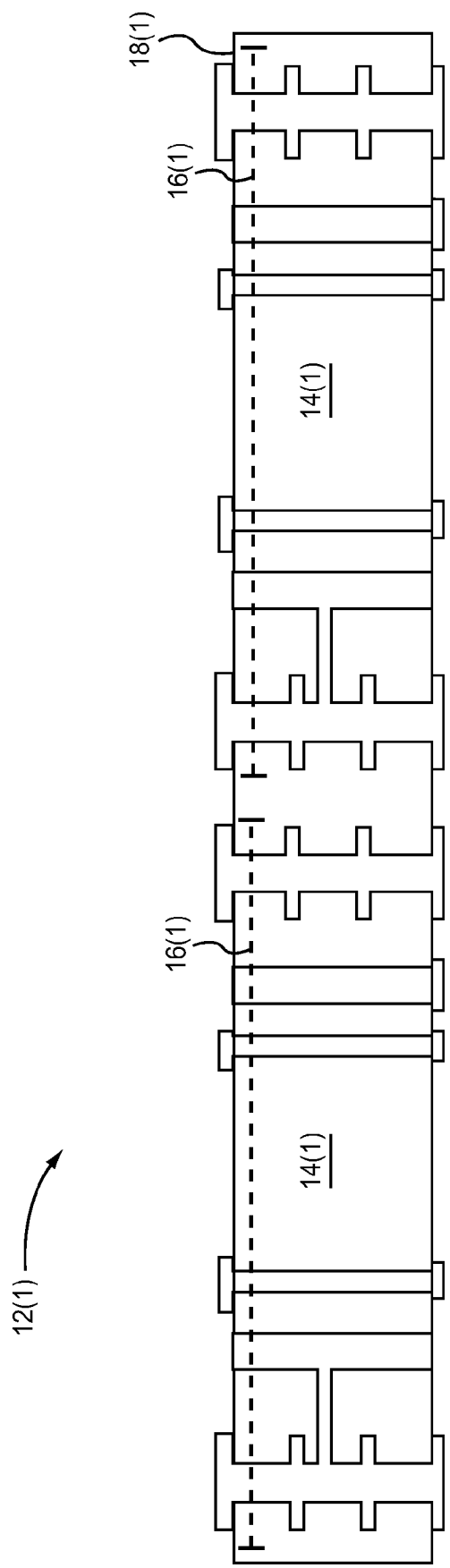

First, the first substrate 12(1) and the second substrate 12(2) are provided (FIG. 5A). As shown in FIG. 5A, the first substrate 12(1) has a plurality of component areas 16(1). For each of these component areas 16(1), the structure illustrated in FIG. 2A is provided for constructing one of the electronic modules 10 (shown in FIG. 1). As such, each of the component areas 16(1) has a metallic structure 34 (not all metallic structures have been labeled in FIG. 5A for the sake of clarity) along a periphery of the first component area 16(1). Additionally, FIG. 5A illustrates the second substrate 12(2) having a plurality of the component areas 16(2). For each of the component areas 16(2) shown in FIG. 5A, the second substrate 12(2) provides the structure shown in FIG. 2I. FIG. 5B is a cross-sectional view of the first substrate 12(1) shown in FIG. 5A. As illustrated in FIG. 5B, each of the component areas 16(1) on the surface 18(1) of the first substrate 12(1) is associated with a component portion 14(1). Each of the component portions 14(1) is the same as the component portion 14(1) shown in FIG. 2A.

Figure 5C:
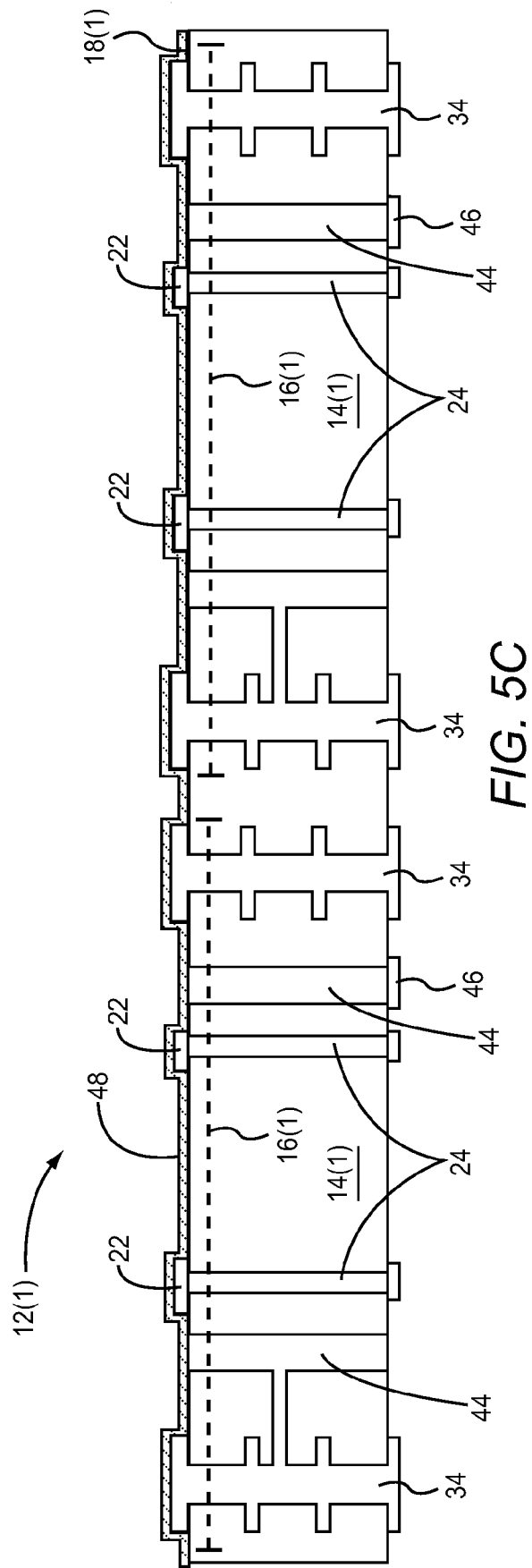
Figure 5D:
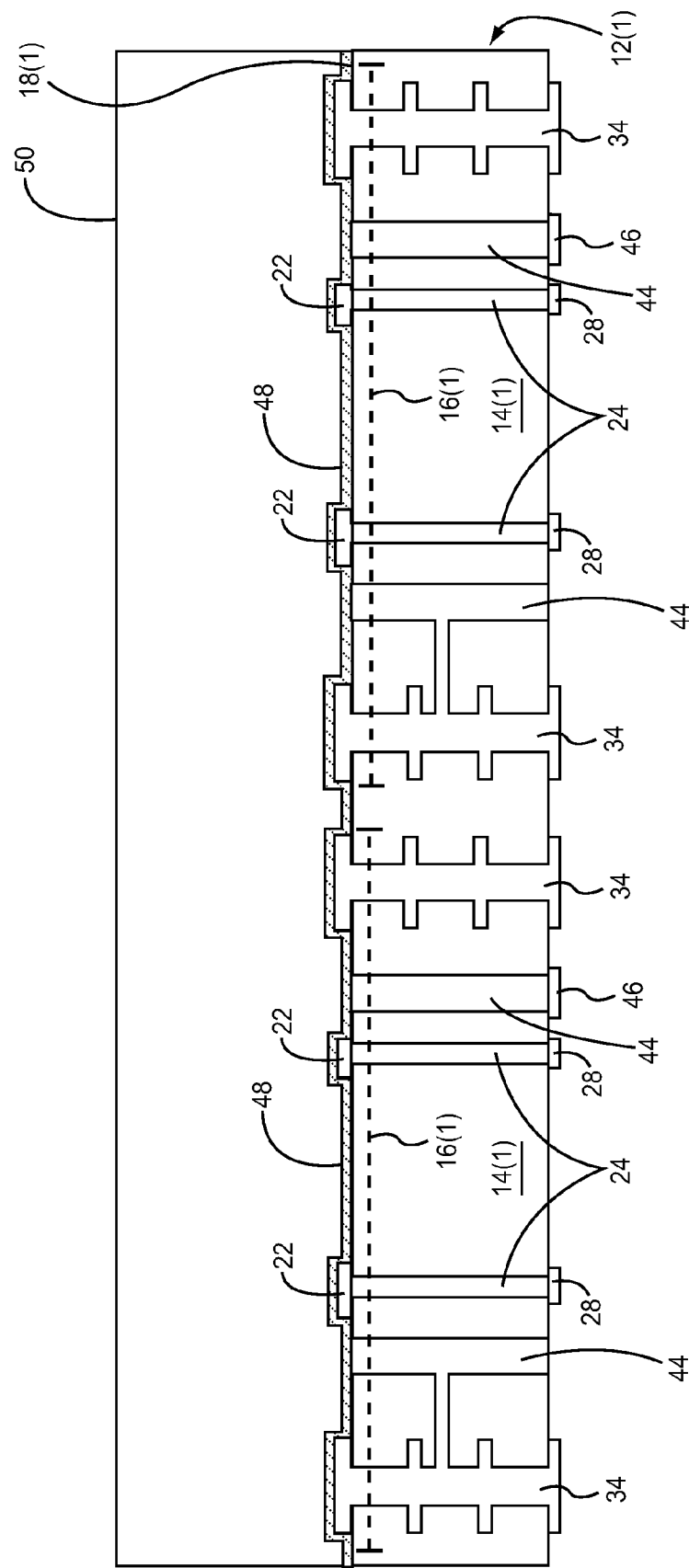
Figure 5E:
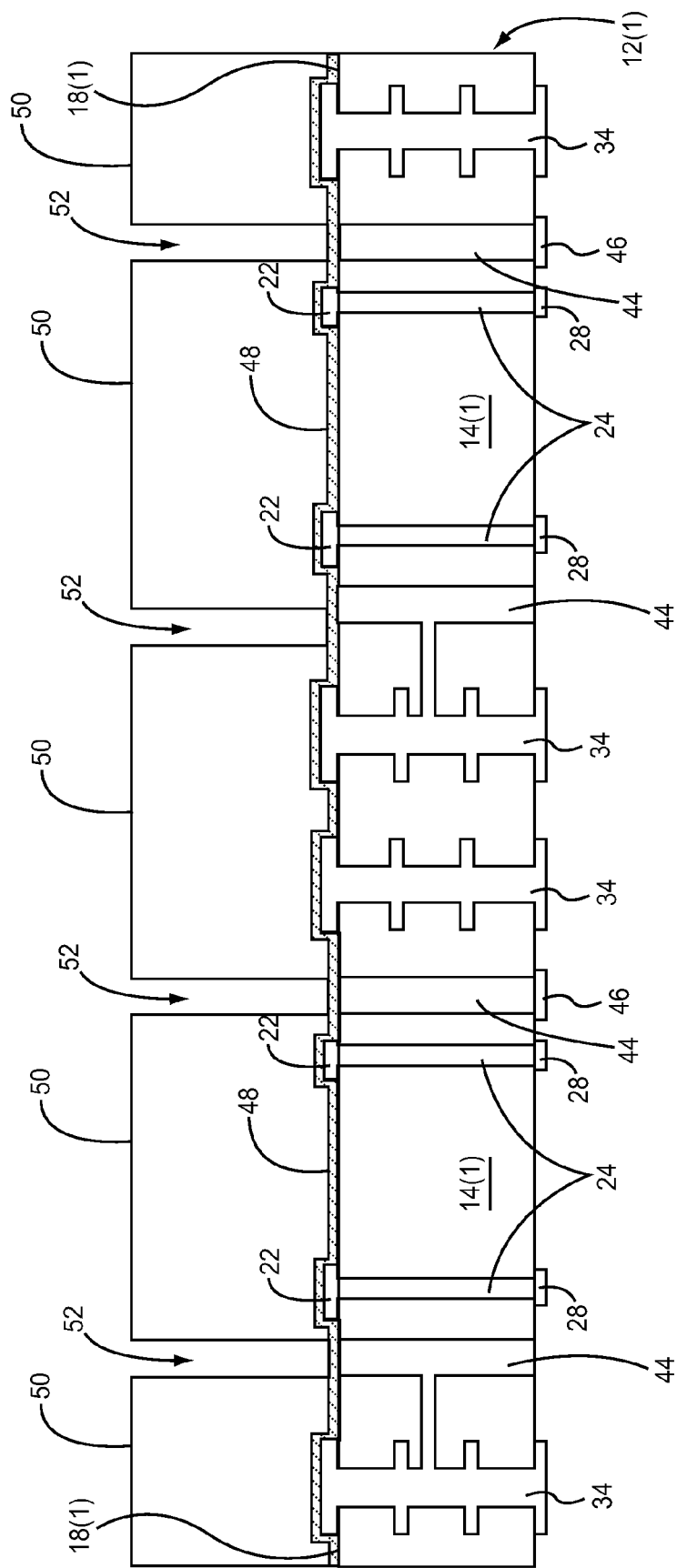
Figure 5F:
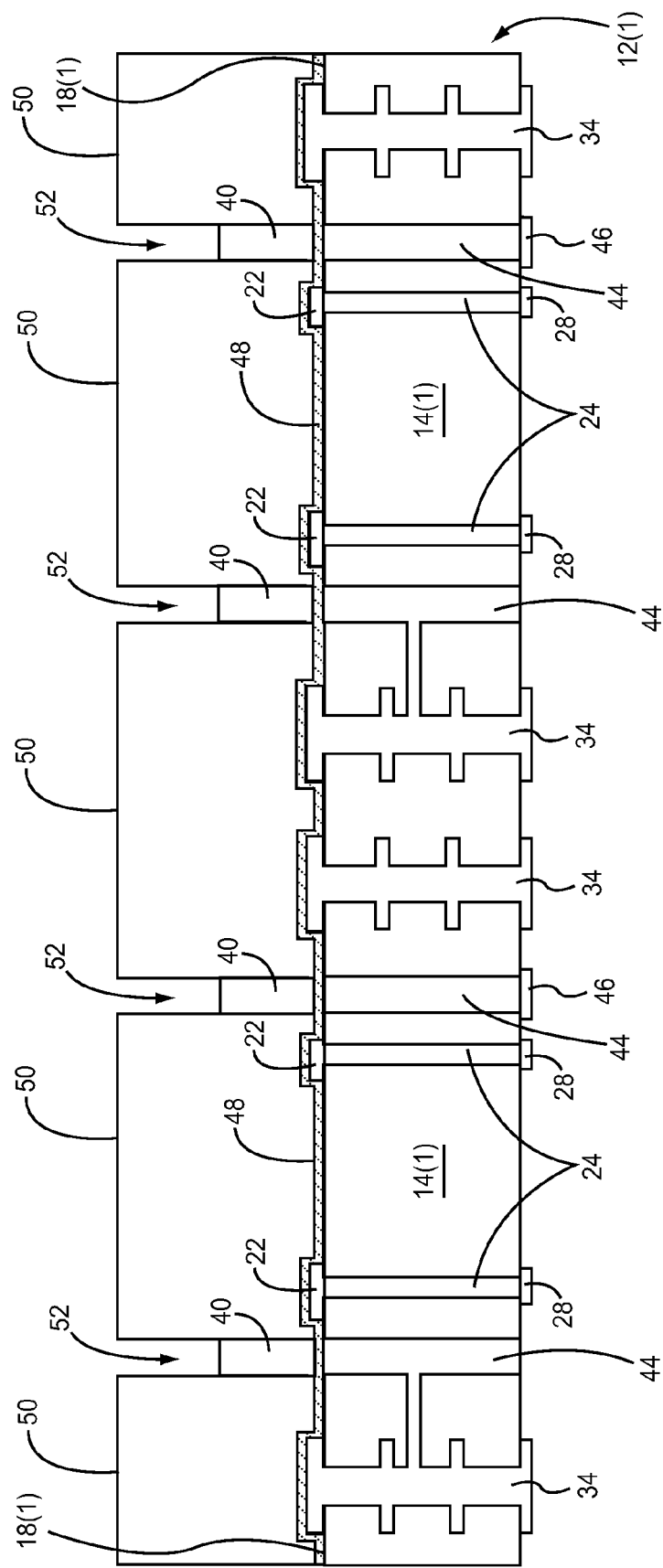
Figure 5G:
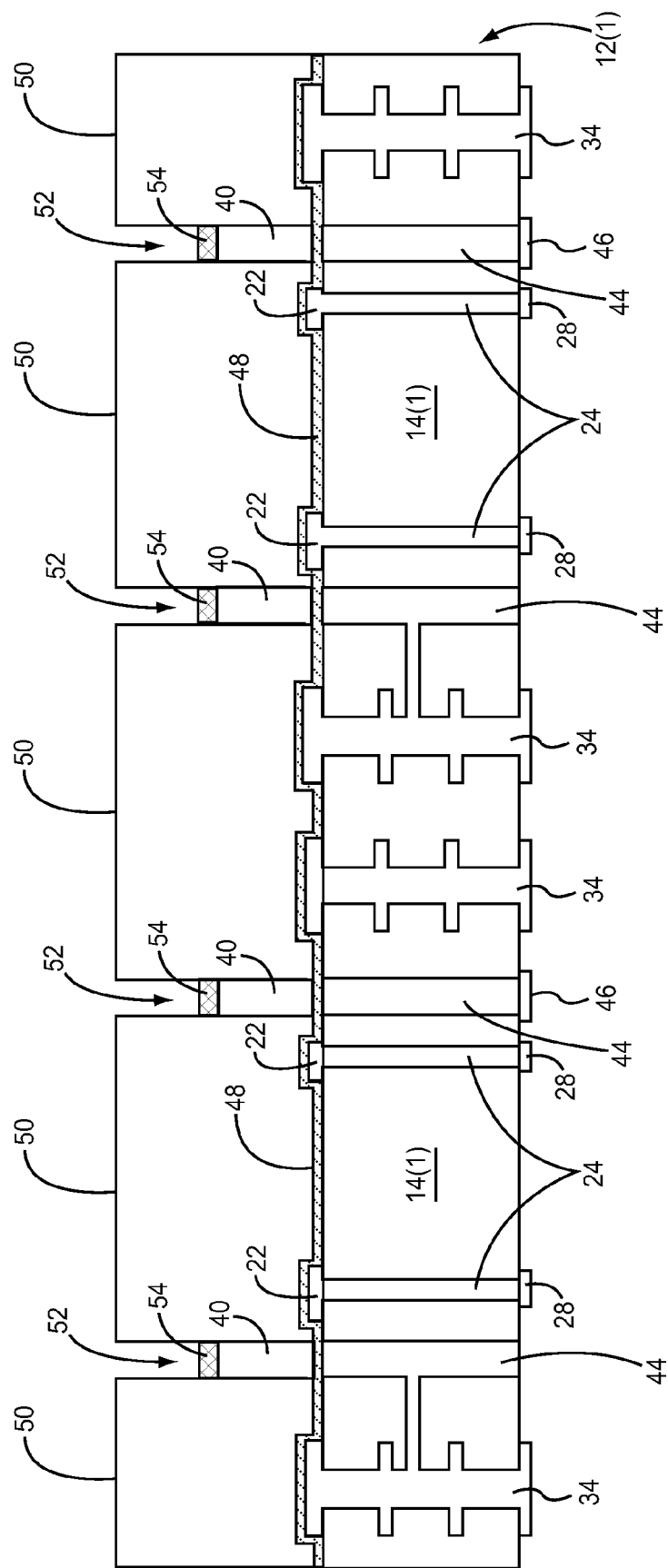
Figure 5H:
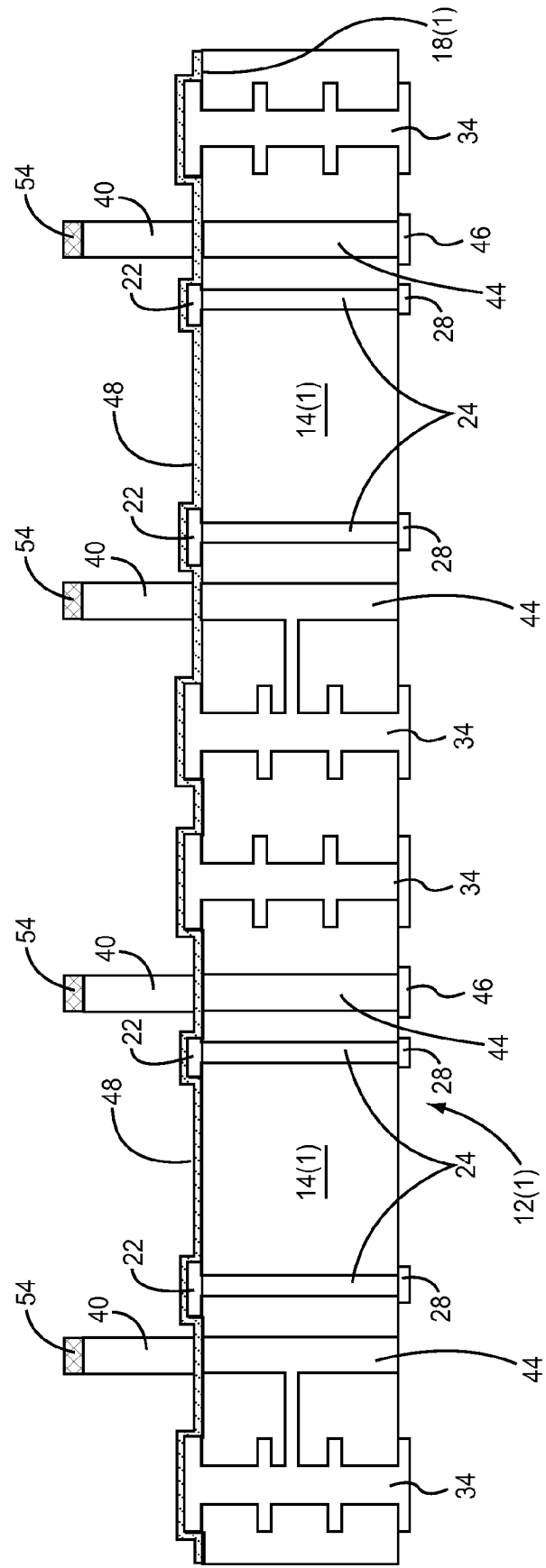
Figure 5I:
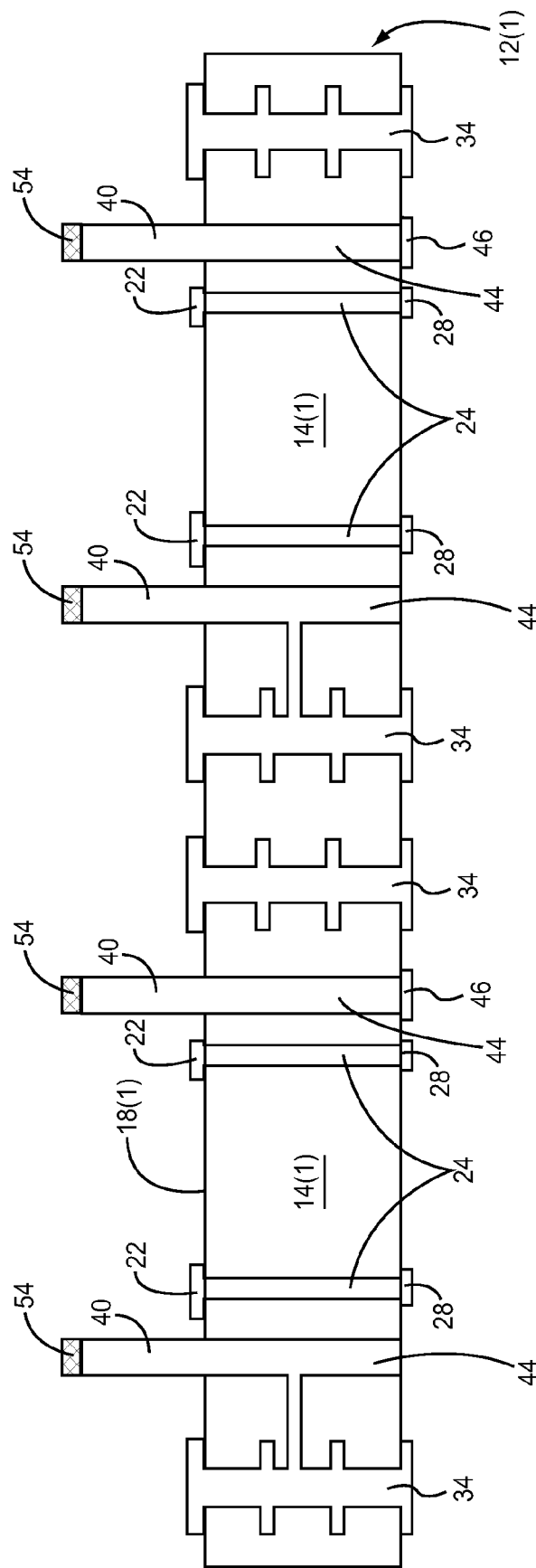

To form the electronic modules 10, the seed layer 48 is first provided over the component areas 16(1) on the surface 18(1) of the first substrate 12(1) (FIG. 5C). Next, the mask 50 is provided to cover the seed layer 48, and thus is provided over each of the component areas 16(1) (FIG. 5D). The mask 50 is then developed to expose sections of the seed layer 48 that has been provided over the surface 18(1) (FIG. 5E). In this embodiment, developing the mask 50 results in the formation of the openings 52, which expose sections of the seed layer 48 that are on the conductive vias 44 within the first substrate 12(1). The support members 40 are then formed on the exposed sections of the seed layer 48 (FIG. 5F). In this embodiment, a conductive material is applied within the openings 52 through electroplating, which thereby forms the support members 40 as metallic pillars. The solder bumps 54 are then applied to the support members 40 within the openings 52 of the mask 50, such that the solder bumps 54 form a top portion of the support members 40 (FIG. 5G). The mask 50 (shown in FIG. 5G) is then removed from the seed layer 48 (FIG. 5H). The portions of the seed layer 48 (shown in FIG. 5H) that are not on the support members 40 within the first substrate 12(1) are then removed from the surface 18(1) of the first substrate 12(1) (FIG. 5I). Note that the seed layer 48 that is over the support members 40 is no longer illustrated, for the sake of clarity, because the seed layer 48 now forms part of the support members 40.

Figure 5J:
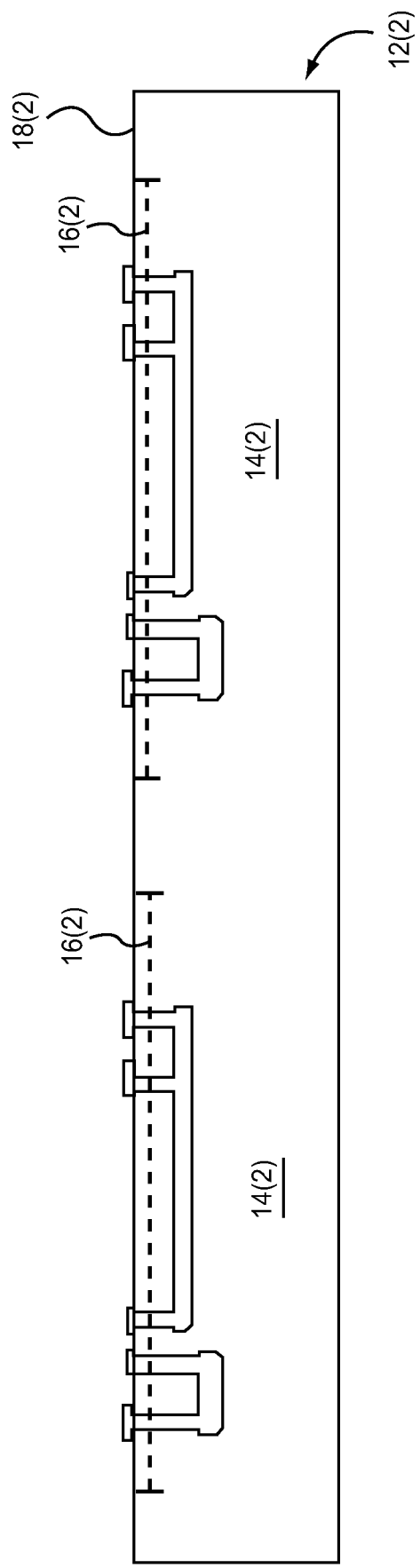
Figure 5K:
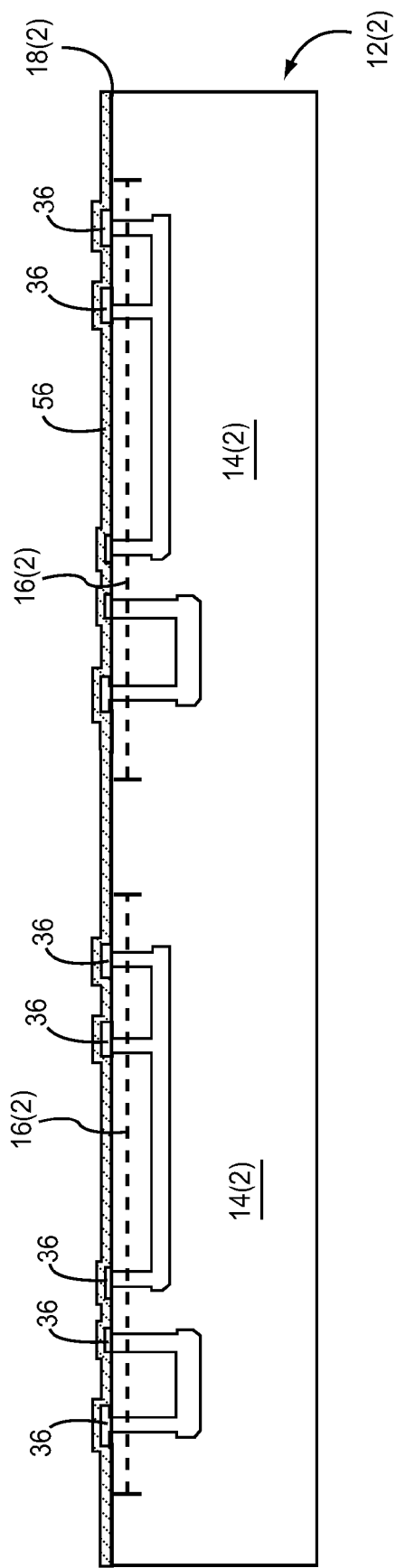
Figure 5L:
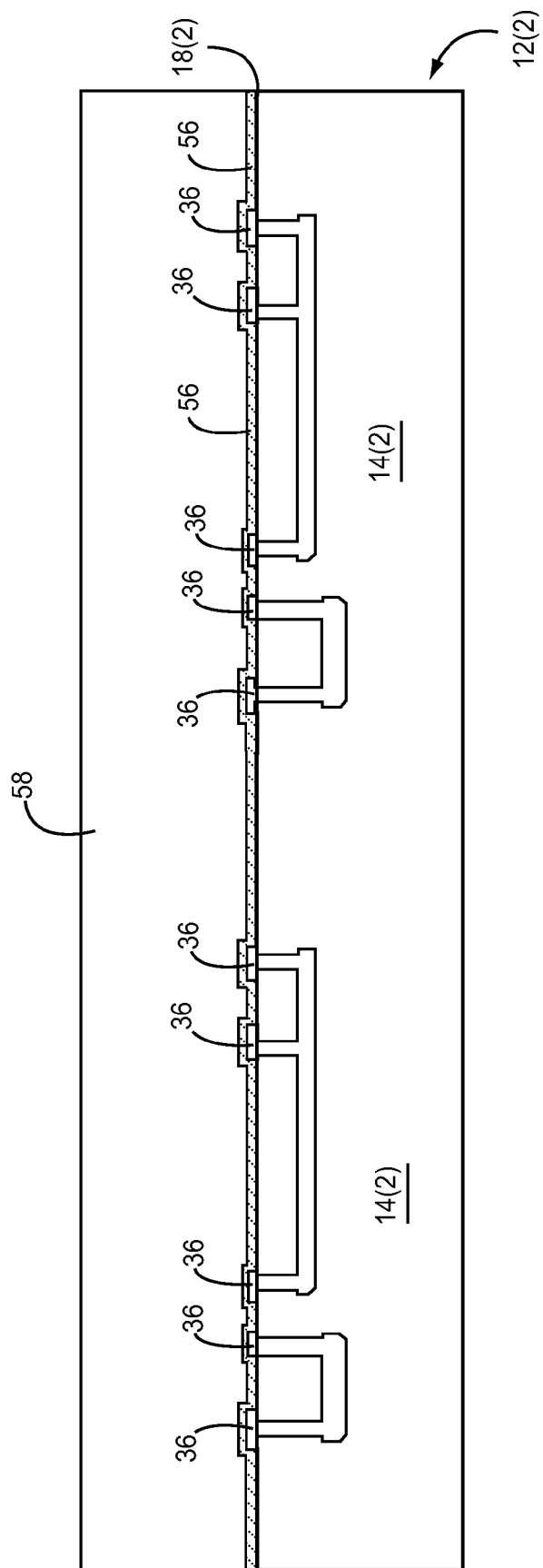
Figure 5M:
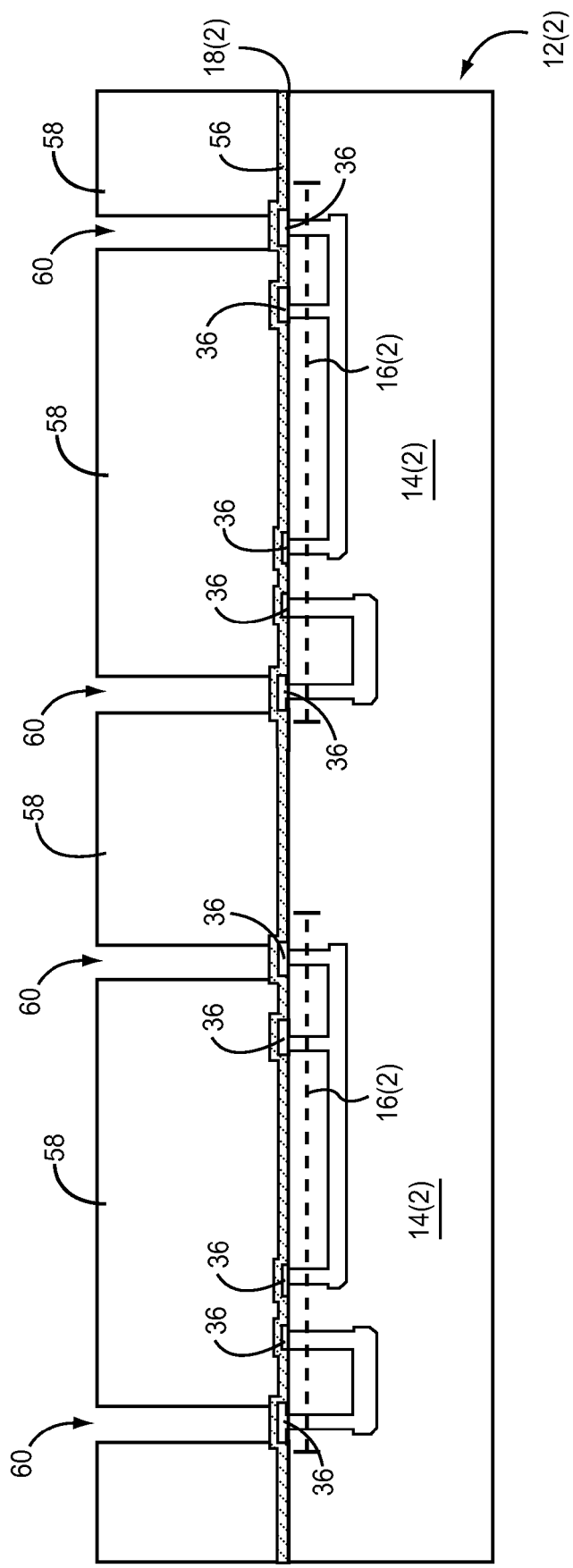
Figure 5N:
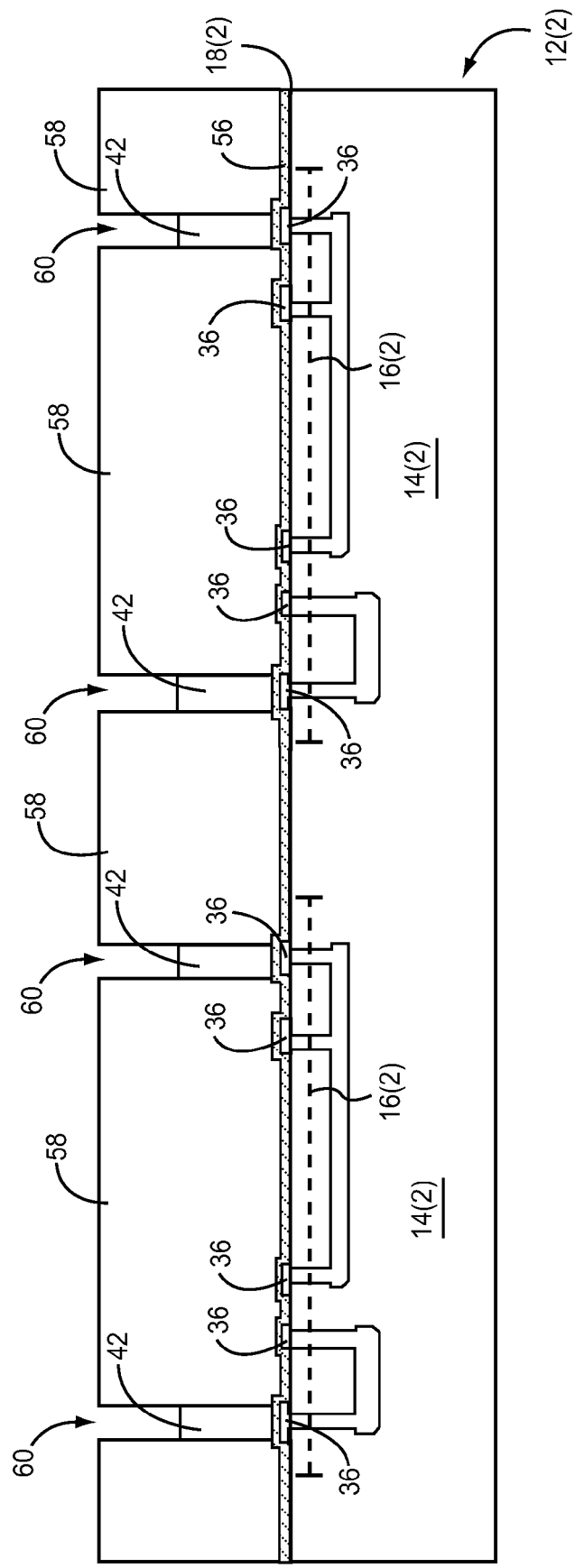
Figure 50:
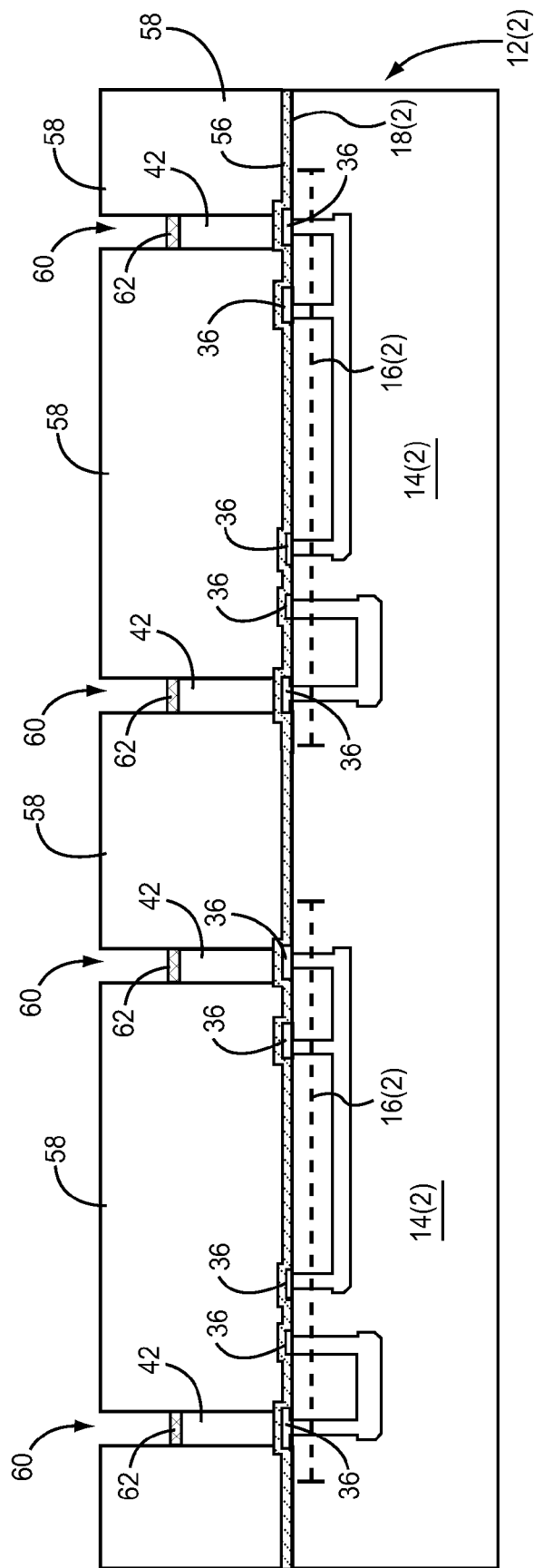
Figure 5P:
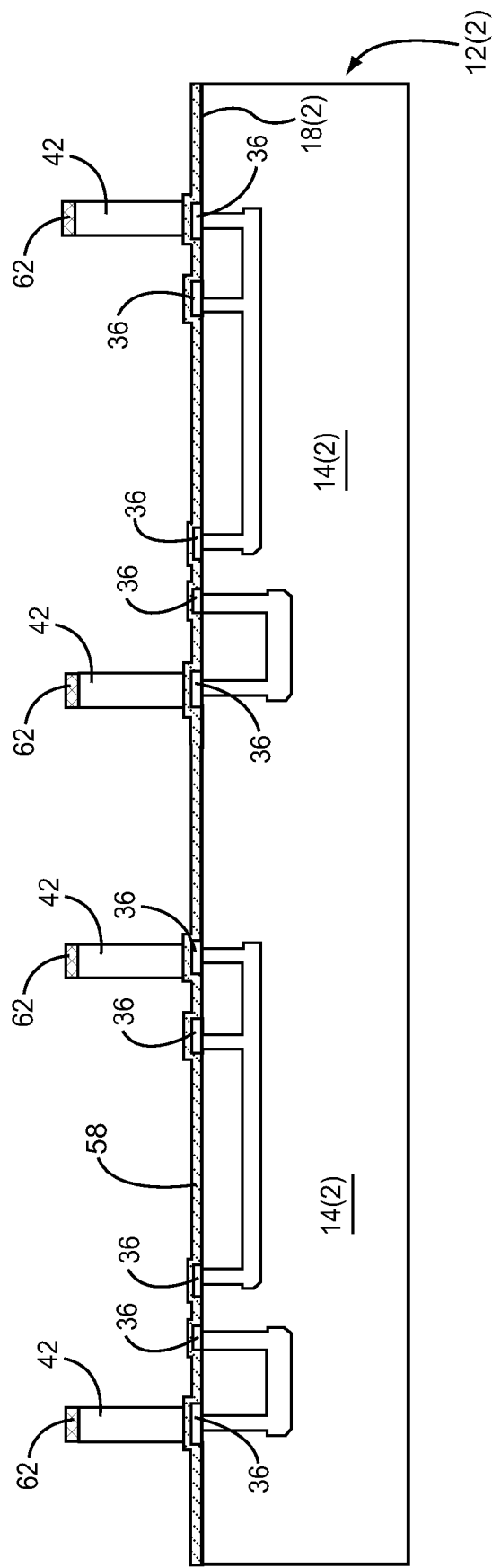
Figure 5Q:
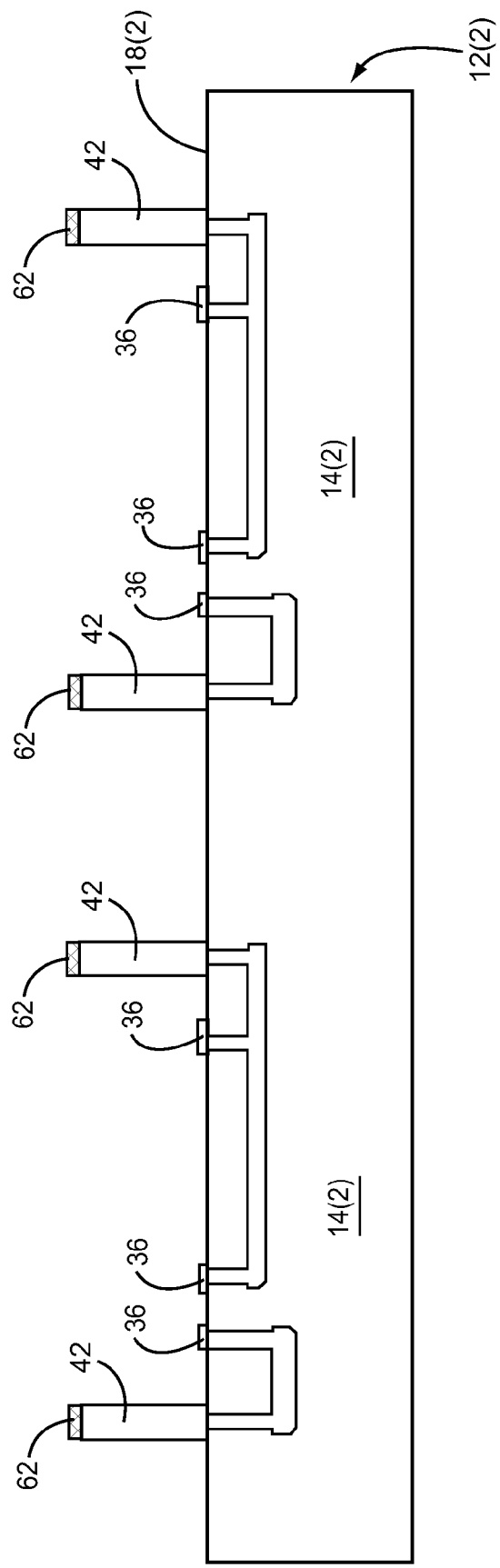

FIG. 5J illustrates a cross-section of the second substrate 12(2) shown in FIG. 5A. As shown in FIG. 5J, each of the component portions 14(2) has a second component area 16(2) at the surface 18(2) of the second substrate 12(2). The seed layer 56 is provided over the surface 18(2) of the second substrate 12(2) (FIG. 5K). In this manner, the seed layer 56 covers the second component areas 16(2) of each of the component portions 14(2). Accordingly, the surface conductive elements 36 are covered by the seed layer 56. Next, the mask 58 is provided over the surface 18(2) of the second substrate 12(2) and on the seed layer 56 (FIG. 5L). The mask 58 is developed to expose sections of the seed layer 56. In this embodiment, developing the mask 58 forms the openings 60 over a set of the surface conductive elements 36 of each of the second component areas 16(2) (FIG. 5M). The support members 42 are then formed on each of the second component areas 16(2) of the second substrate 12(2) (FIG. 5N). In particular, a conductive material is applied within the openings 60 of the mask 58 through electroplating to thereby form the support members 42 over the set of surface conductive elements 36 of each of the second component areas 16(2). The solder bumps 62 are then applied to the support members 42 such that the solder bumps 62 form the top portion of the support members 42 of each of the second component areas 16(2) (FIG. 5O). The mask 58 (shown in FIG. 5O) is then removed from over the second substrate 12(2) (FIG. 5P). The portions of the seed layer 58 (shown in FIG. 5P) that are not a part of the support members 42 are then removed from the surface 18(2) of the second substrate 12(2) (FIG. 5Q).

Figure 5R:
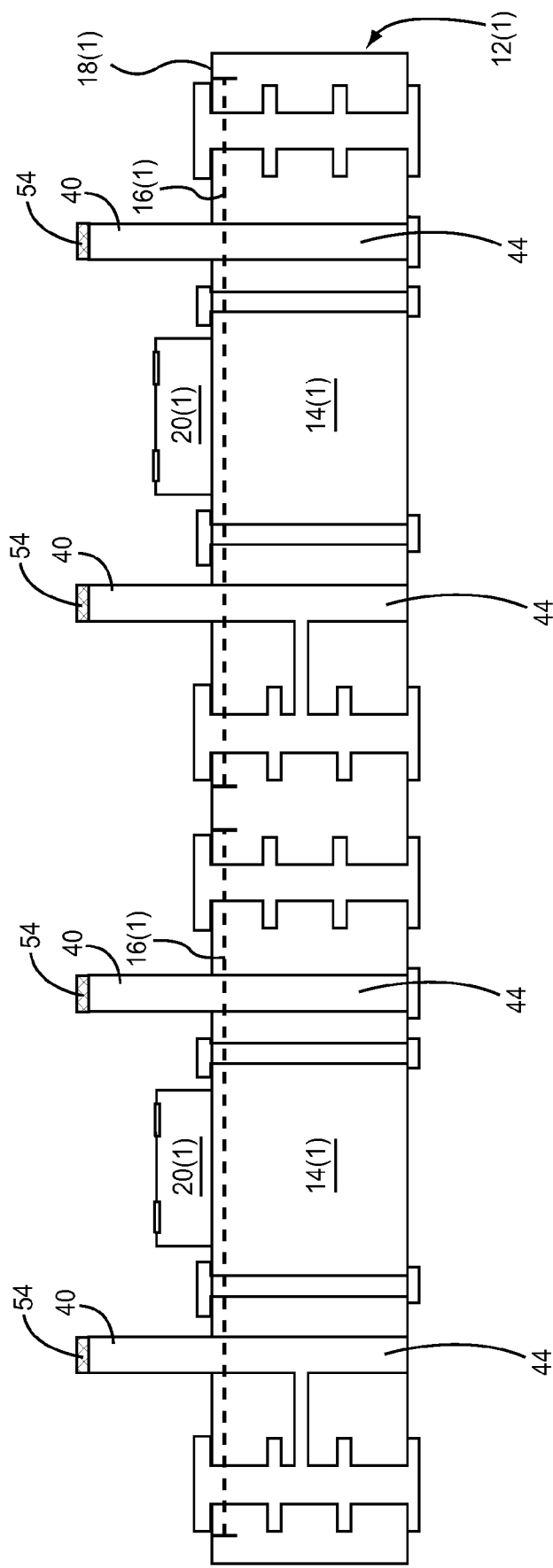
Figure 5S:
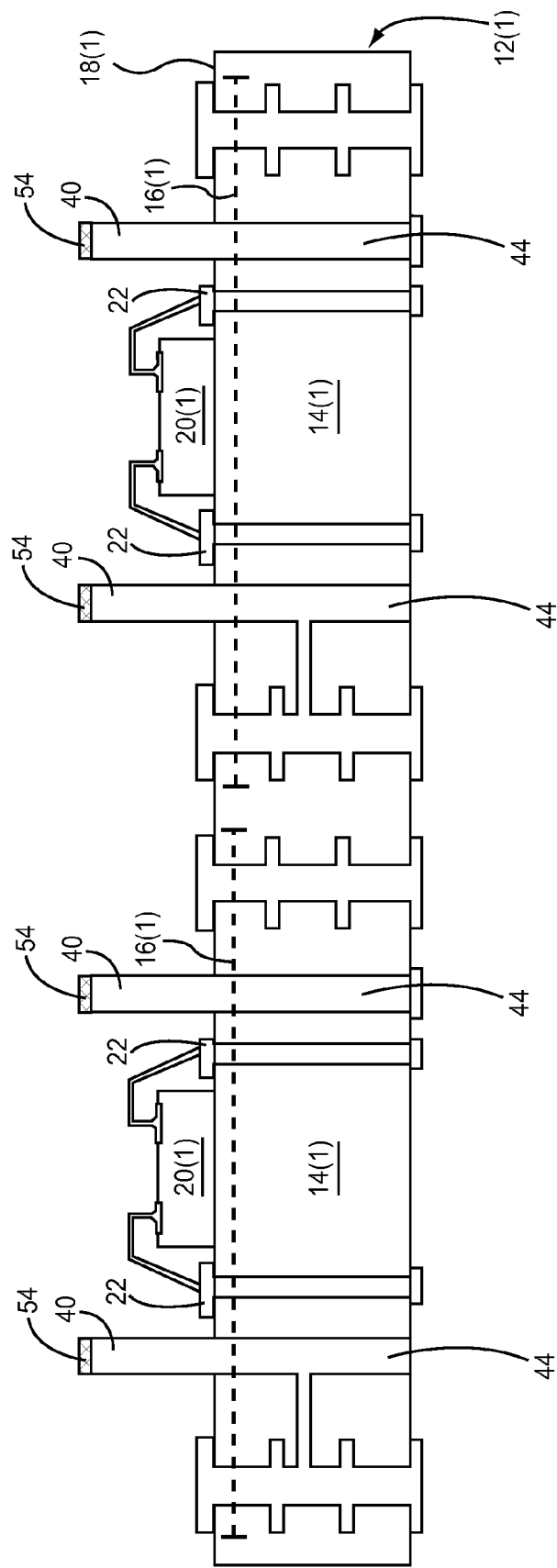

Next, the electronic components 20(1) are attached to each of the first component areas 16(1) on the surface 18(1) of the first substrate 12(1) (FIG. 5R). The electronic components 20(1) on each of the first component areas 16(1) are then wire bonded to the surface conductive pads 22 (FIG. 5S).

Next, the electronic components 20(2) are attached to the second component areas 16(2) of the second substrate 12(2)

Figure 5T:
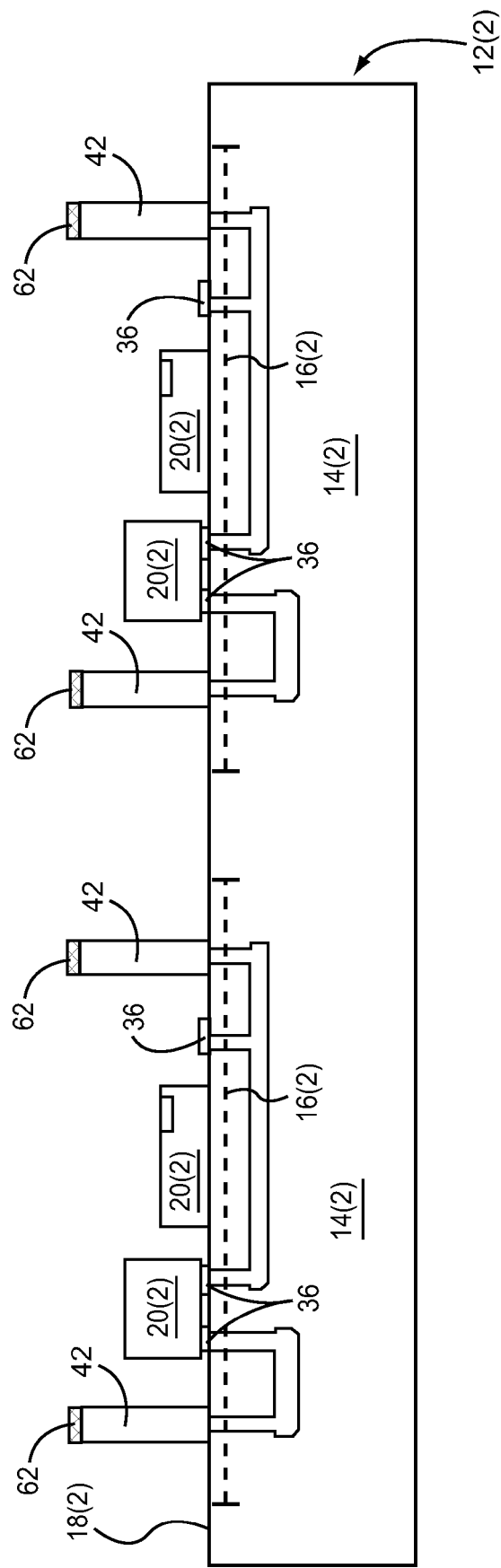
Figure 5U:
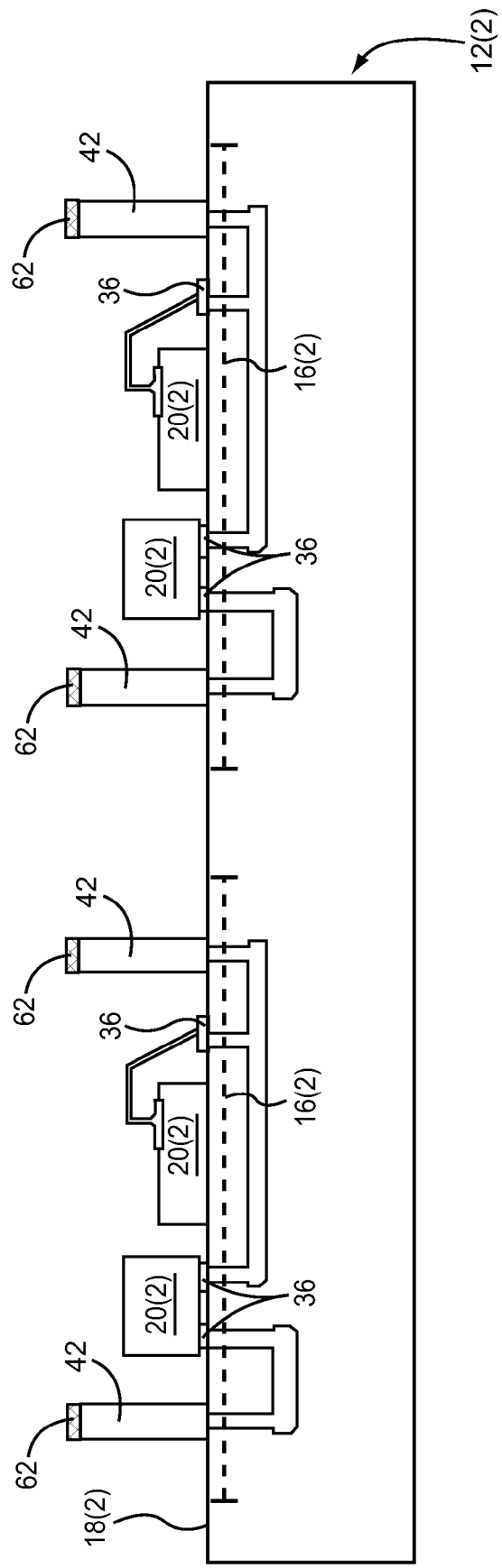
Figure 5V:
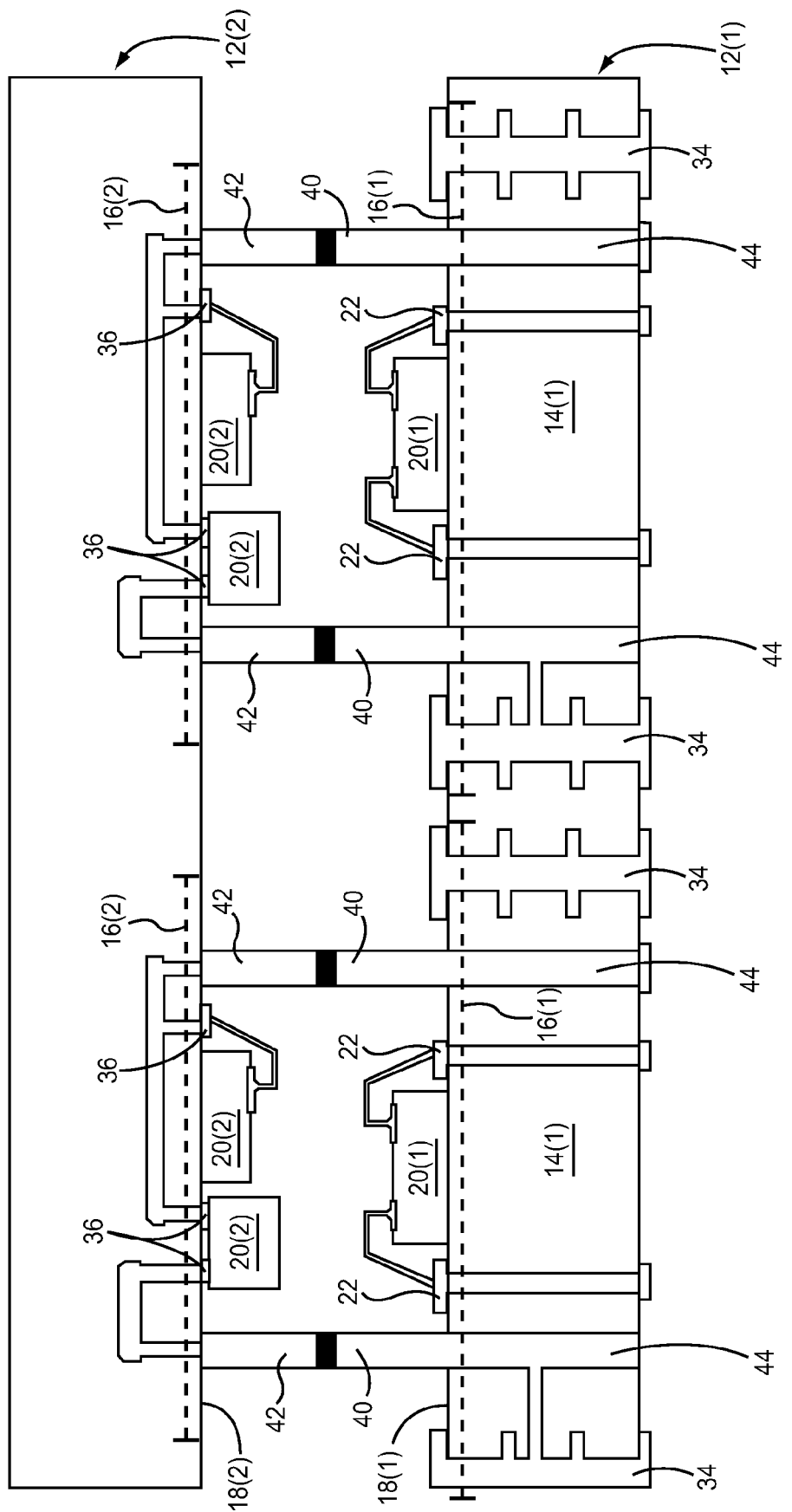

(FIG. 5T). One of the electronic components 20(2) on each of the component areas 16(2) is a surface-mount component and is connected once attached. The other electronic component 20(2) on each of the component areas 16(2) is wire bonded (FIG. 5U). The second substrate 12(2) is mounted over the first substrate 12(1) such that each of the second component areas 16(2) faces one of the first component areas 16(1). In this particular embodiment, the support members 42 of each of the second component areas 16(2) are set on the support members 40 extending from each of the first component areas 16(1) (FIG. 5V). The support members 40, 42 are soldered to one another so as to mount the second substrate 12(2) over the first substrate 12(1) as described above.

Figure 5W:
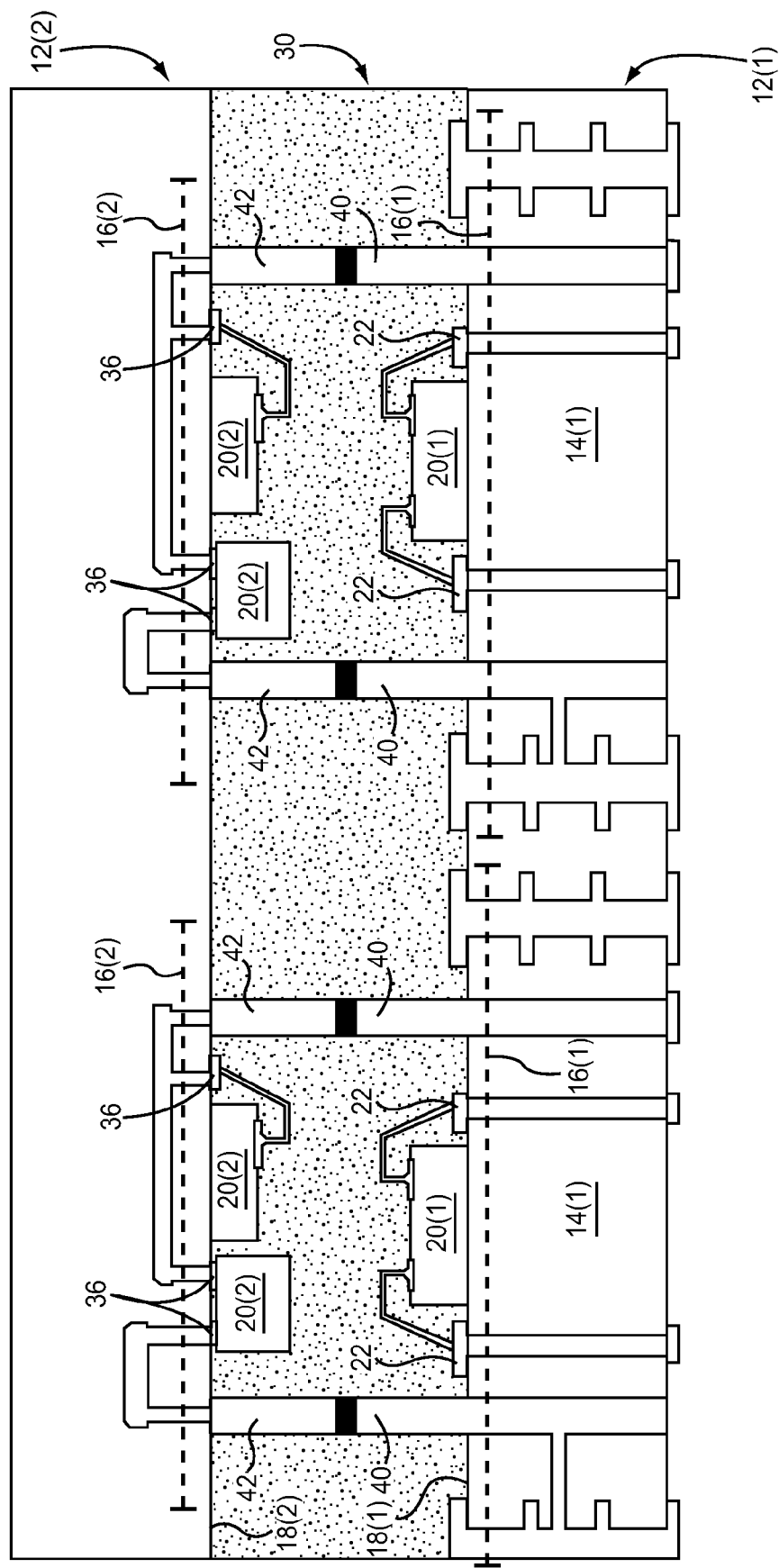
Figure 5X:
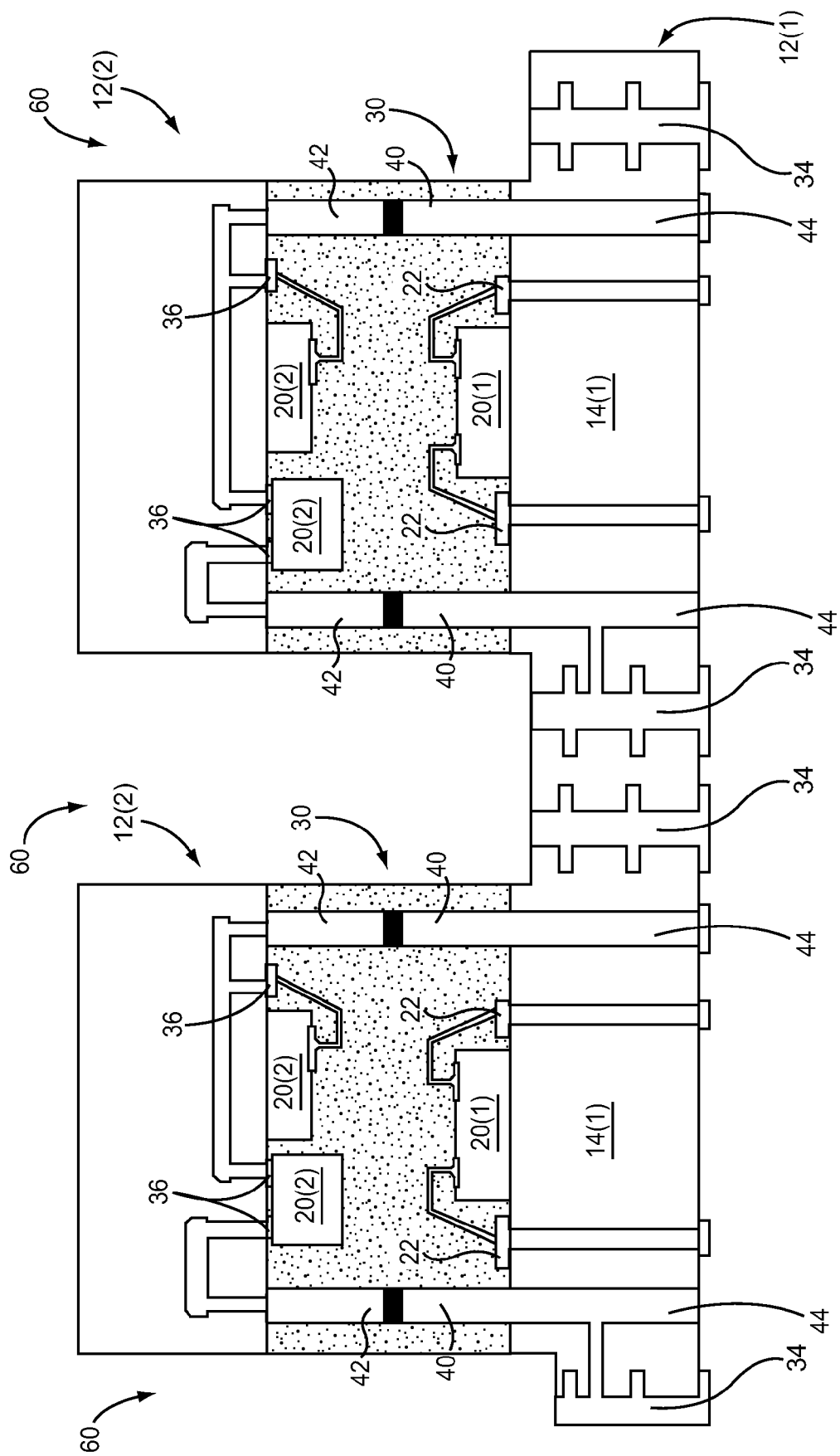
Figure 5Y:
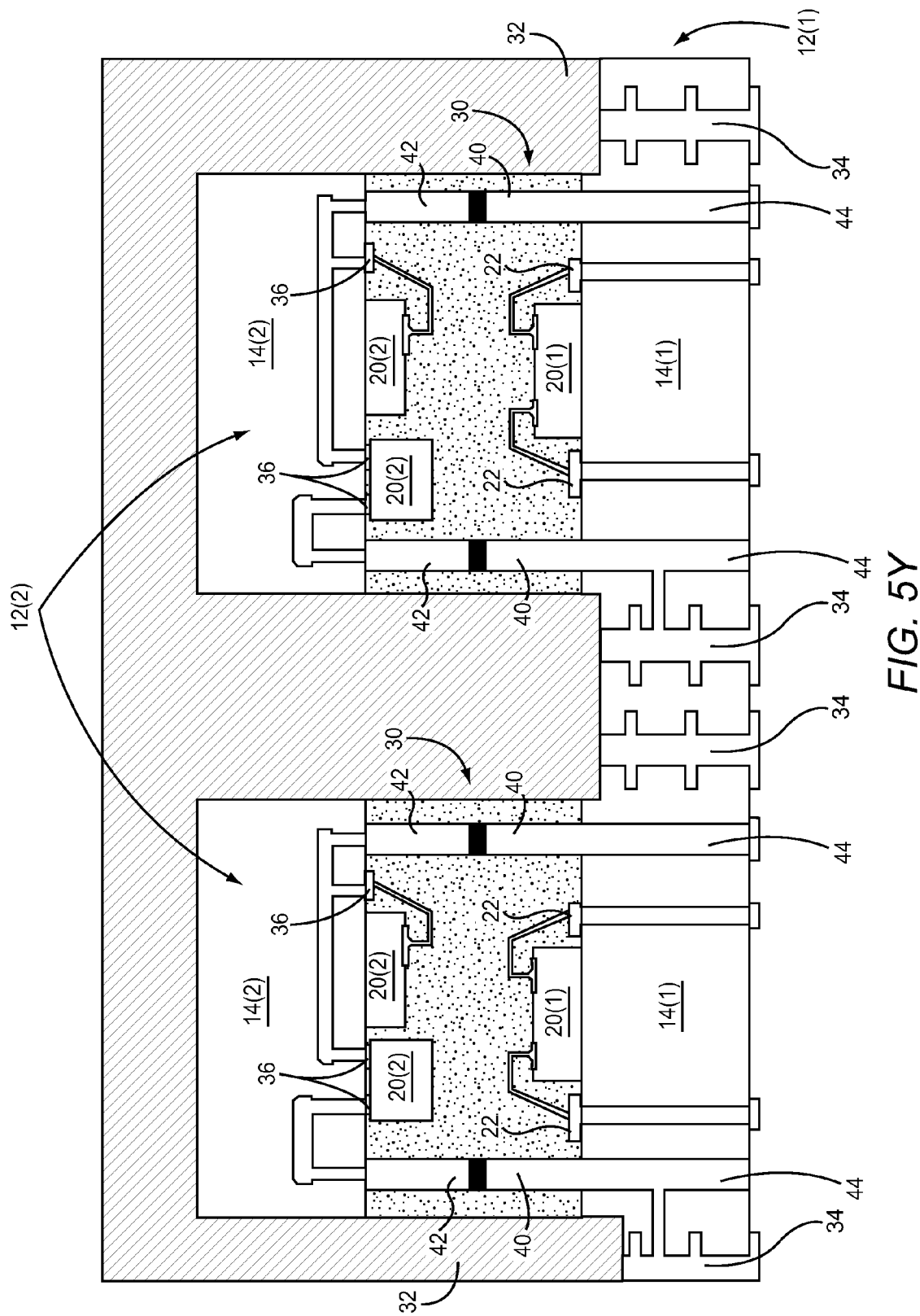
Figure 5Z:
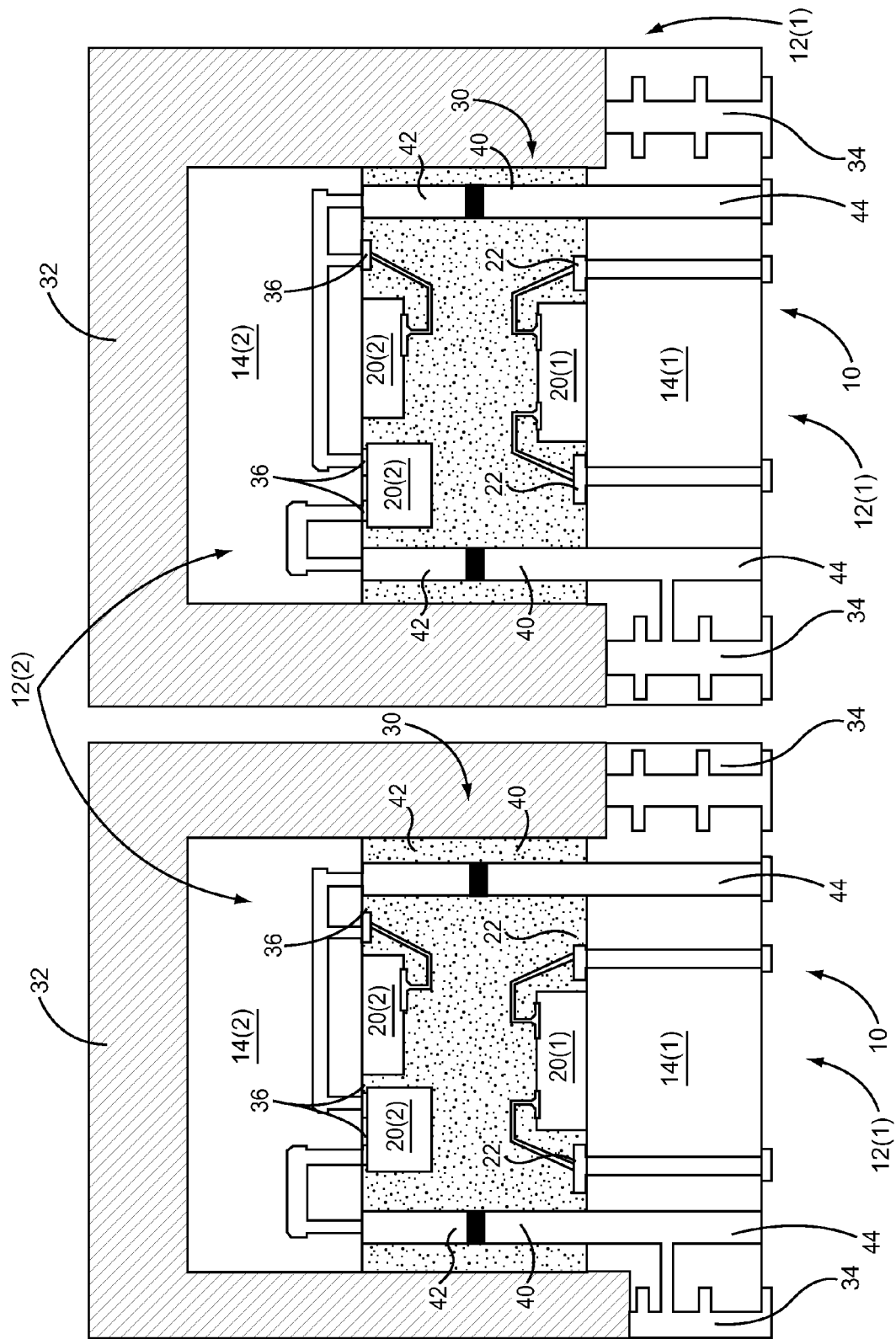

The overmold 30 is then injected between the first substrate 12(1) and the second substrate 12(2) so as to cover the first component areas 16(1) and the second component areas 16(2) (FIG. 5W). In this manner, the electronic components 20(1), 20(2) on each of the component areas 16(1) and 16(2) are encapsulated by the overmold 30. After the overmold 30 is provided, the openings 60 are then formed through at least the second substrate 12(2) and the overmold 30 to expose at least a section of the metallic structures 34 from each of the component portions 14(1) (FIG. 5X). In this embodiment, the openings 60 also partially extend into the first substrate 12(1) along the periphery of the component portion 14(1). Electromagnetic shields 32 are then formed over the second substrate 12(2) and within the openings 60 (FIG. 5Y). Individualized electronic modules 10 are then separated by cutting through the shield material and the first substrate 12(1) (FIG. 5Z).

Those skilled in the art will recognize improvements and modifications to the preferred embodiments of the present disclosure. All such improvements and modifications are considered within the scope of the concepts disclosed herein and the claims that follow.

What is claimed is:

1. An electronic module comprising:
a first substrate having a first component area, wherein one or more electronic components are mounted on the first component area;
a second substrate having a second component area, wherein one or more electronic components are mounted on the second component area and the second substrate is mounted over the first substrate such that the second component area faces the first component area;
an overmold that fills a gap between the first component area and the second component area so as to cover the one or more electronic components on the first component area and the one or more electronic components on the second component area; and
a support structure that extends through the overmold and comprises:
a first support member that extends from the first component area towards the second component area; and
a second support member that extends from the second component area towards the first component area, wherein the first support member is attached to the second support member to provide structural support that mounts the second substrate over the first substrate.

2. The electronic module of claim 1 wherein:
the first support member comprises a first conductive pillar;
the second support member comprises a second conductive pillar; and
the first conductive pillar is soldered to the second conductive pillar.

3. An electronic module comprising:
a first substrate having a first component area, wherein one or more electronic components are mounted on the first component area;
a second substrate having a second component area, wherein one or more electronic components are mounted on the second component area and the second substrate is mounted over the first substrate such that the second component area faces the first component area;
an overmold that fills a gap between the first component area and the second component area so as to cover the one or more electronic components on the first component area and the one or more electronic components on the second component area;
a surface feature on the second component area; and
a support structure that extends from the first component area, through the overmold, and onto the surface feature, wherein the support structure is attached to the surface feature so as to provide structural support that mounts the second substrate over the first substrate.

4. The electronic module of claim 3 wherein:
the surface feature comprises a conductive feature;
the support structure comprises a conductive pillar; and
the conductive pillar is soldered to the conductive feature.

5. The electronic module of claim 1 wherein the overmold is formed from an insulating material.

6. The electronic module of claim 1 further comprising an electromagnetic shield formed over the second substrate and the first substrate so as to enclose the first component area and the second component area.

7. The electronic module of claim 6 wherein the first substrate further comprises a metallic structure that is attached to the electromagnetic shield and extends through the first substrate to connect the electromagnetic shield to ground.

8. A method of manufacturing an electronic module comprising:
providing a first substrate having a first component area;
attaching one or more electronic components to the first component area;
providing a second substrate having a second component area;
attaching one or more electronic components to the second component area;
mounting the second substrate over the first substrate such that the second component area faces the first component area; and
covering the first component area and the second component area with an overmold such that the overmold covers the one or more electronic components on the first component area and the one or more electronic components on the second component area.

9. The method of claim 8 further comprising:
forming a first support member that extends from the first component area towards the second component area prior to mounting the second substrate over the first substrate; and
forming a second support member that extends from the second component area towards the first component area prior to mounting the second substrate over the first substrate.

10. The method of claim 9 wherein mounting the second substrate over the first substrate comprises attaching the first support member to the second support member.

11. The method of claim 8 further comprising:
forming a support member that extends from the first component area prior to mounting the second substrate over the first substrate;
wherein mounting the first substrate over the second substrate comprises attaching the support member to a surface feature on the second component area.

12. The method of claim 11 wherein:
the surface feature comprises a conductive feature; and
the support member comprises a conductive pillar.

13. The method of claim 12 wherein attaching the support member to the surface feature comprises soldering the conductive feature to the conductive pillar.

14. The method of claim 8 wherein the overmold is formed from an insulating material.

15. The method of claim 8 wherein:
mounting the second substrate over the first substrate defines a gap between the first component area and the second component area; and
covering the first component area and the second component area with an overmold comprises injecting the overmold to fill the gap.

16. The method of claim 8 further comprising forming an electromagnetic shield over the second substrate and the first substrate so as to enclose the first component area and the second component area.

17. The method of claim 16 wherein providing the first substrate further comprises providing a metallic structure that extends through the first substrate to provide a connection to ground.

18. The method of claim 17 wherein forming the electromagnetic shield comprises attaching the electromagnetic shield to the metallic structure.

19. The method of claim 17 further comprising forming an opening through at least the second substrate and the overmold to expose a section of the metallic structure prior to forming the electromagnetic shield.

20. The method of claim 19 wherein forming the electromagnetic shield comprises applying an electromagnetic shield material within the opening to attach the electromagnetic shield to the section of the metallic structure.

21. The method of claim 20 wherein forming the electromagnetic shield further comprises applying the electromagnetic shield material over the second substrate.

22. An electronic module comprising:
a first substrate having a first component area, wherein one or more electronic components are mounted on the first component area;
a second substrate having a second component area, wherein one or more electronic components are mounted on the second component area and the second substrate is mounted over the first substrate such that the second component area faces the first component area;
a support structure that structurally supports the mounting of the second substrate over the first substrate; and
an overmold that covers the first component area and the second component area so as to cover the one or more electronic components on the first component area and the one or more electronic components on the second component area; and
an electromagnetic shield formed over the second substrate and the first substrate so as to enclose the first component area and the second component area.

23. The electronic module of claim 3 further comprising an electromagnetic shield formed over the second substrate and the first substrate so as to enclose the first component area and the second component area.

24. The electronic module of claim 23 wherein the first substrate further comprises a metallic structure that is attached to the electromagnetic shield and extends through the first substrate to connect the electromagnetic shield to ground.

25. The electronic module of claim 22 wherein the overmold fills a gap between the first component area and the second component area so as to cover the one or more electronic components on the first component area and the one or more electronic components on the second component area, and the support structure extends through the overmold and between the first component area and the second component area.

* * * * *